US012751129B2

(12) United States Patent
Sim et al.

(10) Patent No.: US 12,751,129 B2
(45) Date of Patent: Sep. 29, 2026

(54) DISPLAY DEVICE

(71) Applicant: Samsung Display Co., LTD., Yongin-si (KR)

(72) Inventors: Young Chul Sim, Yongin-si (KR); Woo Lim Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 421 days.

(21) Appl. No.: 18/403,327

(22) Filed: Jan. 3, 2024

(65) Prior Publication Data

US 2024/0266384 A1 Aug. 8, 2024

(51) Int. Cl.
*H10H 29/14* (2025.01)

(52) U.S. Cl.
CPC .................................. *H10H 29/142* (2025.01)

(58) Field of Classification Search
CPC .. H10H 29/142; H10H 20/814; H10H 20/831; H10H 20/857; H10D 86/441; H10W 20/42
See application file for complete search history.

(56) References Cited

U.S. PATENT DOCUMENTS 11,296,060 B2 4/2022 Oh et al.
2015/0362776 A1* 12/2015 Jikumaru .......... G02F 1/133553 349/12
2020/0005703 A1* 1/2020 Kim .......................... G09G 3/32
2020/0212017 A1* 7/2020 Oh ........................ H10H 29/142
2020/0403131 A1* 12/2020 Kim ...................... H10H 20/819
2021/0118946 A1* 4/2021 Simon .................. H10H 20/857
2021/0399073 A1* 12/2021 Li ........................ G09G 3/3233
2022/0278253 A1* 9/2022 Yang .................. H10H 20/8312
2023/0209952 A1* 6/2023 Lee .................... H10K 59/1216 257/40
2025/0311490 A1* 10/2025 Kim ....................... H10H 20/84

FOREIGN PATENT DOCUMENTS

JP H08-88408 4/1996
KR 10-2017-0018388 2/2017
KR 10-2019-0001050 1/2019
KR 10-2020-0001657 1/2020
KR 10-2020-0098669 8/2020
KR 10-2020-0129244 11/2020
KR 10-2022-0068560 5/2022
KR 20220068560 A * 5/2022 ........... H10K 59/123
KR 10-2022-0104113 7/2022

* cited by examiner

*Primary Examiner* — S M Sohel Imtiaz
(74) *Attorney, Agent, or Firm* — CANTOR COLBURN LLP

(57) ABSTRACT

A display device includes a light emitting element layer including a first light emitting element on a first pixel electrode of the first substrate, a first dummy element layer spaced apart from the first light emitting element, the first dummy element layer and the first light emitting element including a same material, a second light emitting element on the first dummy element layer and on a second pixel electrode of the first substrate, a first metal pattern on the first pixel electrode and electrically connected to the first pixel electrode and the first light emitting element, a second metal pattern on the second pixel electrode and electrically connected to the second pixel electrode and the second light emitting element, and a common electrode on the first light emitting element and the second light emitting element. The second metal pattern is in a through hole penetrating the first dummy element layer.

20 Claims, 40 Drawing Sheets

DISPLAY DEVICE

CROSS-REFERENCE TO RELATED APPLICATION(S)

This application claims priority to and benefits of Korean Patent Application No. 10-2023-0026918 under 35 U.S.C. § 119, filed on Feb. 28, 2023 in the Korean Intellectual Property Office, the entire contents of which are herein incorporated by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. A display device may be a flat panel display device such as a liquid crystal display device, a field emission display device, or a light emitting display device (e.g., an organic light emitting display device). Among flat panel display devices, in a light emitting display device, since each of the pixels of a display panel includes a light emitting element capable of emitting light by itself, an image can be displayed without a backlight unit providing light to the display panel.

SUMMARY

Aspects of the disclosure provide a display device including multiple semiconductor light emitting elements emitting light of different colors.

Aspects of the disclosure also provide a display device in which a transfer process of light emitting elements emitting light of different colors is simplified.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first substrate including a plurality of pixel electrodes respectively electrically connected to a plurality of pixel circuits and spaced apart from each other, and a light emitting element layer including a plurality of light emitting elements disposed on the first substrate and respectively electrically connected to the plurality of pixel electrodes. The light emitting element layer may include a first light emitting element disposed on a first pixel electrode of the first substrate, and a first dummy element layer spaced apart from the first light emitting element, the first dummy element layer and the first light emitting element including a same material. The light emitting element layer may include a second light emitting element disposed on the first dummy element layer and disposed on a second pixel electrode of the first substrate, a first metal pattern disposed on the first pixel electrode and electrically connected to the first pixel electrode and the first light emitting element, a second metal pattern disposed on the second pixel electrode and electrically connected to the second pixel electrode and the second light emitting element, and a common electrode disposed on the first light emitting element and the second light emitting element. The second metal pattern may be disposed in a through hole penetrating the first dummy element layer.

The first light emitting element may include a first semiconductor layer, a second semiconductor layer disposed on the first semiconductor layer, and a first light emitting layer disposed between the first semiconductor layer and the second semiconductor layer, the second light emitting element may include a third semiconductor layer, a fourth semiconductor layer disposed on the third semiconductor layer, and a second light emitting layer disposed between the third semiconductor layer and the fourth semiconductor layer, and the first dummy element layer may include a first dummy semiconductor layer, the first dummy semiconductor layer and the first semiconductor layer including a same material, a second dummy semiconductor layer disposed on the first dummy semiconductor layer, the second dummy semiconductor layer and the first light emitting layer including a same material, and a third dummy semiconductor layer disposed on the second dummy semiconductor layer, the third dummy semiconductor layer and the second semiconductor layer including a same material.

A thickness of the first metal pattern may be smaller than a thickness of the second metal pattern, and a height from a top surface of the first substrate to a top surface of the first light emitting element may be smaller than a height from a top surface of the first substrate to a top surface of the second light emitting element.

The display device may further include a first reflective layer disposed between the first light emitting element and the first dummy element layer and the first substrate, and a second reflective layer disposed between the first dummy element layer and the second light emitting element. The first metal pattern may be disposed in a first through hole penetrating the first reflective layer from a bottom surface of the light emitting element layer, and the second metal pattern may be disposed in a second through hole penetrating the first reflective layer, the first dummy element layer, and the second reflective layer from the bottom surface of the light emitting element layer.

The display device may further include a first insulating layer disposed on inner side edges of the first through hole and inner side edges of the second through hole, wherein the first dummy element layer may be spaced apart from the second metal pattern with the first insulating layer disposed between the first dummy element layer and the second metal pattern.

The light emitting element layer may further include a base layer disposed between the first reflective layer and the first substrate, each of the first through hole and the second through hole may penetrate the base layer, and the first insulating layer may also be disposed between the base layer and the first substrate.

The display device may further include a first electrode layer disposed on the first reflective layer, and a second electrode layer disposed on the second reflective layer. The first through hole may expose a part of a bottom surface of the first electrode layer, the second through hole may expose a part of a bottom surface of the second electrode layer, the first metal pattern may electrically contact the bottom surface of the first electrode layer, and the second metal pattern may electrically contact the bottom surface of the second electrode layer.

The first light emitting element may electrically contact a top surface of the first electrode layer, and the second light emitting element may electrically contact a top surface of the second electrode layer.

In the first electrode layer, a thickness of a portion disposed on the first through hole may be smaller than a thickness of a portion that does not overlap the first through hole.

The display device may further include a first auxiliary layer disposed on the first dummy element layer, wherein the second reflective layer may be disposed on the first auxiliary layer, and the second through hole penetrates the first auxiliary layer.

The display device may further include a second dummy element layer spaced apart from the second light emitting element, the second dummy element layer and the second light emitting element including a same material, a third reflective layer disposed on the second dummy element layer, a third light emitting element disposed on the third reflective layer and disposed on a third pixel electrode of the first substrate, and a third metal pattern disposed on the third pixel electrode and electrically connected to each of the third pixel electrode and the third light emitting element. The third metal pattern may be disposed in a third through hole penetrating the first reflective layer, the first dummy element layer, the second reflective layer, the second dummy element layer, and the third reflective layer from the bottom surface of the light emitting element layer.

The display device may further include a third electrode layer disposed on the third reflective layer. The third through hole may expose a part of a bottom surface of the third electrode layer, and the third metal pattern may electrically contact the bottom surface of the third electrode layer.

The display device may further include a second insulating layer surrounding the first light emitting element, the first dummy element layer, the second light emitting element, the first reflective layer, and the second reflective layer, and a fourth reflective layer disposed on the second insulating layer.

The display device may further include a fourth metal pattern disposed in a trench portion surrounding the first light emitting element and the second light emitting element. The fourth metal pattern may be disposed on the fourth reflective layer.

The trench portion may penetrate the first reflective layer, the first dummy element layer, and the second reflective layer, and in the fourth metal pattern, a thickness of a portion surrounding the first light emitting element may be smaller than a thickness of a portion surrounding the second light emitting element.

According to an embodiment of the disclosure, a display device may include a first substrate including a plurality of pixel electrodes respectively electrically connected to a plurality of pixel circuits and spaced apart from each other, and a light emitting element layer including a plurality of light emitting elements disposed on the first substrate and respectively electrically connected to the plurality of pixel electrodes. The light emitting element layer may further include a first element layer including a base layer, a first reflective layer disposed on the base layer, and a first light emitting element and a first dummy element layer that are disposed on the first reflective layer. The light emitting element layer may include a second element layer partially disposed on the first element layer and including a second reflective layer, and a second light emitting element and a second dummy element layer that are disposed on the second reflective layer. The light emitting element layer may include a first metal pattern disposed in a first through hole overlapping the first light emitting element and penetrating the base layer and the first reflective layer from a bottom surface of the light emitting element layer, a second metal pattern disposed in a second through hole overlapping the second light emitting element and penetrating the base layer, the first element layer, and the second reflective layer from the bottom surface of the light emitting element layer, a third metal pattern disposed in a trench portion penetrating the base layer from top surfaces of the first light emitting element of the first element layer and the second light emitting element of the second element layer, and a common electrode disposed on the first light emitting element and the second light emitting element.

The second element layer may not be disposed on the first light emitting element, and the common electrode may electrically contact each of the top surface of the first light emitting element and the top surface of the second light emitting element.

The first light emitting element and the first dummy element layer may include substantially a same material. The display device may further include a first auxiliary layer disposed between the first dummy element layer and the second reflective layer.

The display device may further include a first insulating layer disposed on inner side edges of the first through hole and inner side edges of the second through hole, a second insulating layer disposed on an inner side edge of the trench portion, and a third reflective layer disposed on the second insulating layer.

In the light emitting element layer, a height from a bottom surface of the base layer to a top surface of the first light emitting element may be smaller than a height from the bottom surface of the base layer to a top surface of the second light emitting element.

A display device according to an embodiment may include a light emitting element layer in which light emitting elements including different materials and semiconductor layers respectively including the same material as the light emitting elements are stacked on each other. The light emitting element layer may include the light emitting elements emitting light of different colors, but the light emitting elements may be disposed on different layers and separated from each other.

The display device according to an embodiment may include a plurality of light emitting elements emitting light of different colors in one structure, and may have an advantage in that a transfer process of a light emitting element layer including the light emitting elements is simplified.

However, effects according to the embodiments of the disclosure are not limited to those listed above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
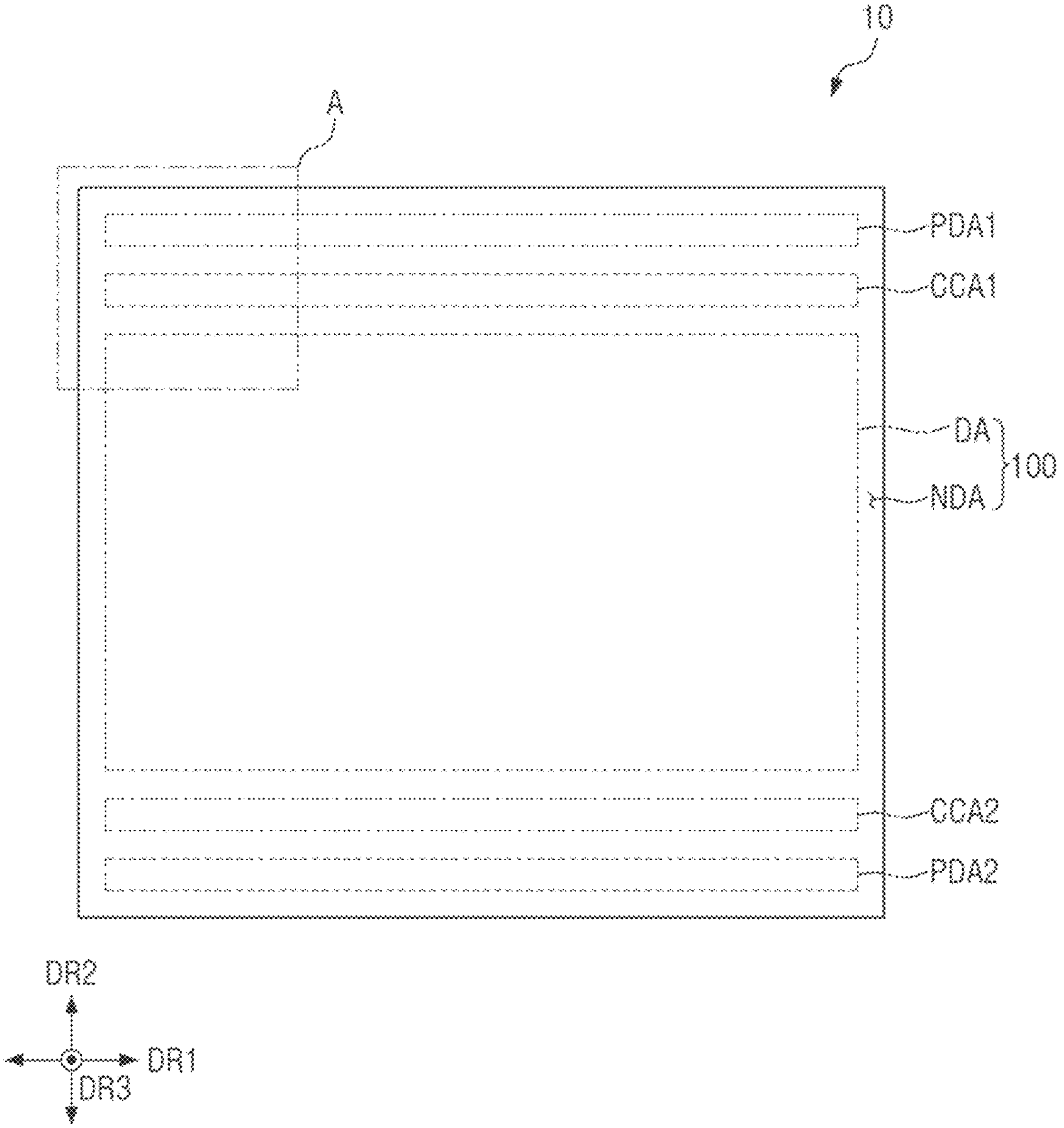
FIG. 1 is a schematic plan view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

When a layer is referred to as being "on" another layer or substrate, it can be directly on the other layer or substrate, or intervening layers may also be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
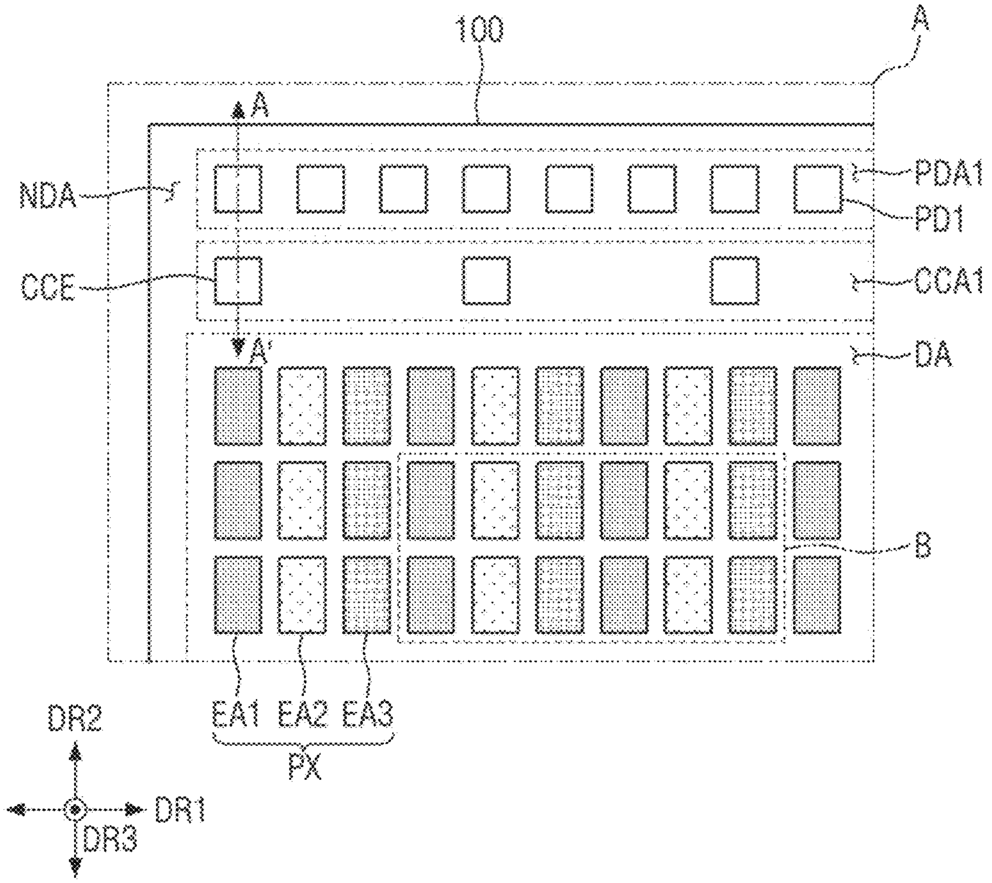
FIG. 2 is a schematic plan view illustrating part A of FIG. 1.
Figure 3:
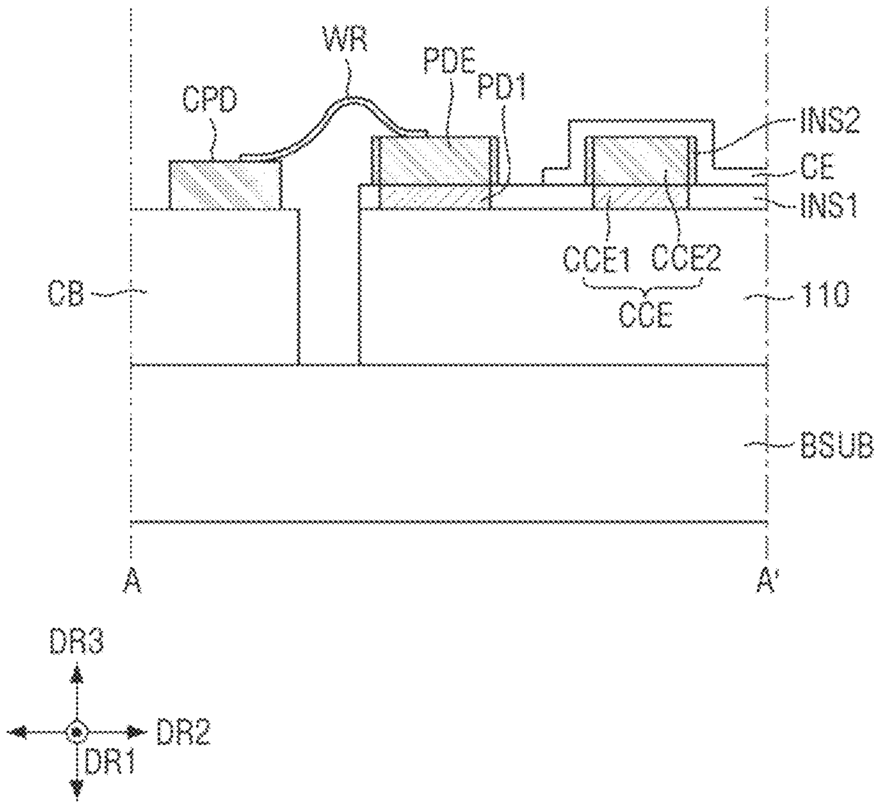
FIG. 3 is a schematic cross-sectional view taken along line A-A' of FIG. 2.

FIG. 1 is a schematic plan view showing a display device according to an embodiment. FIG. 2 is a schematic plan view illustrating part A of FIG. 1. FIG. 3 is a schematic cross-sectional view taken along line A-A' of FIG. 2.

Referring to FIGS. 1 to 3, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel 100 which provides a display screen. Examples of the display panel 100 may include an inorganic light emitting diode display panel, an organic light emitting display panel, a quantum dot light emitting display panel, a plasma display panel and a field emission display panel. In the following description, a display panel in which inorganic light emitting elements are disposed on a semiconductor circuit board is illustrated as an example of the display panel 100. However, the disclosure is not limited thereto, and may be applied to other display panels.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DA of the display device 10 may also be similar to the overall shape of the display device 10. FIG. 1 illustrates the display device 10 having a rectangular shape elongated in a first direction DR1.

In this specification, a first direction DR1 may indicate a horizontal direction of the display device 10, the second direction DR2 may indicate a vertical direction of the display device 10, and a third direction DR3 may indicate a thickness direction of the display device 10. In this specification, "upper," "top," and "top surface" may indicate one side of the third direction DR3, and "lower," "bottom," and "bottom surface" may indicate the other side of the third direction DR3. "Left," "right," "upper," and "lower" may indicate directions when the drawing is viewed from above. For example, "upper" and "lower" may indicate the second direction DR2, and "left" and "right" may indicate the first direction DR1.

The display panel 100 may include a display area DA and a non-display area NDA. The display area DA may be an area where a screen can be displayed, and the non-display area NDA is an area where a screen may not be displayed. The display area DA may also be referred to as an active region, and the non-display area NDA may also be referred to as a non-active region. The display area DA may be disposed substantially at the center of the display panel 100.

The display panel 100 may include multiple pixels PX disposed in the display area DA. The pixels PX may be arranged in the first and second directions DR1 and DR2. Each of the pixels PX may include multiple emission areas EA1, EA2, and EA3 in which different light emitting elements ED1, ED2, and ED3 (see FIG. 5) are disposed. In the display panel 100, a pixel PX including three different emission areas EA1, EA2, and EA3 may be a minimum emitting unit. However, the disclosure is not limited thereto. The display panel 100 may also have a minimum emitting unit in which three or more emission areas constitute a pixel PX.

Each of the pixels PX may include a first emission area EA1, a second emission area EA2, and a third emission area EA3. Multiple first emission areas EA1, second emission areas EA2, and third emission areas EA3 may be arranged in the display area DA in which the pixels PX are arranged.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may constitute a bezel of the display panel 100 or the display device 10. Wirings or circuit drivers included in the display device 10 may be disposed in the non-display area NDA, or external devices may be mounted thereon.

The non-display area NDA may include a first common connection area CCA1, a second common connection area CCA2, a first pad area PDA1, and a second pad area PDA2.

The first common connection area CCA1 may be disposed between the first pad area PDA1 and the display area DA. The second common connection area CCA2 may be disposed between the second pad area PDA2 and the display area DA. Each of the first common connection area CCA1 and the second common connection area CCA2 may include multiple common connection electrodes CCE connected to a common electrode CE (see FIG. 6).

Accordingly, a common voltage may be supplied to the common electrode CE (see FIG. 6) through the common connection electrodes CCE. The common connection electrodes CCE of the first common connection area CCA1 may be electrically connected to one of first pads PD1 of the first pad area PDA1.

The first pad area PDA1 may be disposed on the upper side of the display panel 100. The first pad area PDA1 may include first pads PD1 connected to an external circuit board CB. The second pad area PDA2 may be disposed on the lower side of the display panel 100. The second pad area PDA2 may include the second pads to be connected to the external circuit board CB. The second pad area PDA2 may be omitted.

The display panel 100 may include a base substrate BSUB, and a circuit substrate 110 and a circuit board CB disposed on the base substrate BSUB. The display panel 100 may include the common connection electrode CCE, the common electrode CE, the first pad PD1, and a pad connection electrode PDE disposed on the circuit substrate 110.

The base substrate BSUB may be a base substrate or a base member. The base substrate BSUB may be a flexible substrate which can be bent, folded and/or rolled. For example, the base substrate BSUB may include a polymer resin such as polyimide (PI), but embodiments are not limited thereto. In another embodiment, the base substrate BSUB may include a glass material or a metal material.

The circuit substrate 110 and the circuit board CB may be disposed on the base substrate BSUB. The circuit substrate 110 and the circuit board CB may be attached to the top surface of the base substrate BSUB by using an adhesive member such as a pressure sensitive adhesive.

The circuit substrate 110 may include a pixel circuit unit PXC (see FIG. 6) electrically connected to light emitting elements ED1, ED2, and ED3 (see FIG. 5) disposed on the display panel 100 and multiple first pads PD1 electrically connected to wires of the pixel circuit units PXC. The circuit substrate 110 may include the display area DA positioned in the center, the non-display area NDA disposed around the display area DA, and the pad areas PDA1 and PDA2 disposed on both sides of the display area DA in the second direction DR2 in the non-display area NDA. The display area DA of the circuit substrate 110 may be an area on which the light emitting elements ED1, ED2, and ED3 are disposed, and the pixel circuit unit PXC may be disposed thereon. The pad areas PDA1 and PDA2 may include the first pad area PDA1 disposed on an upper side of the display area DA, which is a side in the second direction DR2 and the second pad area PDA2 disposed on a lower side of the display area DA, which is another side in the second direction DR2. The first pads PD1 electrically connected to the pixel circuit unit PXC may be disposed in the pad areas PDA1 and PDA2 of the circuit substrate 110, respectively.

The common connection electrode CCE may be disposed in the common connection areas CCA1 and CCA2 on the circuit substrate 110. The common connection electrode CCE may include a first common connection electrode CCEL1 and a second common connection electrode CCE2 disposed on the first common connection electrode CCEL1. The common connection electrodes CCE may be disposed to be spaced apart from each other in the first direction DR1 in the common connection areas CCA1 and CCA2.

The first pad PD1 may be disposed in the pad areas PDA1 and PDA2 on the circuit substrate 110. The first pad PD1 may be connected to the common connection electrode CCE through a wire (not shown) of the circuit board 110. The pad connection electrode PDE may be electrically connected to a pad CPD of the circuit board CB through a wire WR. The pad connection electrode PDE may be disposed on the first pad PD1. The first pads PD1 and the pad connection electrodes PDE may be disposed to be spaced apart from each other in the first direction DR1 in the pad areas PDA1 and PDA2.

The first common connection electrode CCE1 and the first pad PD1 may be disposed on the same layer and may include the same material. The first pad PD1 and the first common connection electrode CCE1 may include the same material as pixel electrodes AE1, AE2, and AE3 described later. The second common connection electrode CCE2 and the pad connection electrode PDE may be disposed on the same layer and may include the same material. In an embodiment, the first common connection electrode CCEL1 and the first pad PD1 may include aluminum (Al). Each of the second common connection electrode CCE2 and the pad connection electrode PDE may include at least one of gold (Au), copper (Cu), aluminum (Al), and tin (Sn).

A first circuit insulating layer INS1 may be disposed on the circuit substrate 110. The first circuit insulating layer INS1 may be disposed to surround the first pads PD1, the first common connection electrodes CCE1, and the pixel electrodes AE1, AE2, and AE3 (see FIG. 5) to be described later. A top surface of the first circuit insulating layer INS1, a top surface of each of the pixel electrodes AE1, AE2, and AE3 (see FIG. 5), a top surface of each of the first pads PD1, and a top surface of each of the first common connection electrodes CCEL1 may continue flat. The first circuit insulating layer INS1 may be formed of an inorganic layer such as a silicon oxide layer ($SiO_2$), an aluminum oxide layer ($Al_2O_3$), and/or a hafnium oxide layer (HfOx).

A second circuit insulating layer INS2 may be disposed on the first circuit insulating layer INS1. The second circuit insulating layer INS2 may be disposed on a side surface of each of the second common connection electrode CCE2 and the pad connection electrode PDE. The second circuit insulating layer INS2 may be disposed to protect the second common connection electrode CCE2 and the pad connection electrode PDE. The second circuit insulating layer INS2 may be formed of an inorganic layer such as a silicon oxide layer ($SiO_2$), an aluminum oxide layer ($Al_2O_3$), and/or a hafnium oxide layer (HfOx).

The pad connection electrode PDE may be connected to the pad CPD of the circuit board CB through a conductive connection member such as the wire WR. For example, the first pad PD1, the pad connection electrode PDE, the wire WR, and the pad CPD of the circuit board CB may be electrically connected to each other.

The circuit board CB may be a flexible printed circuit board (FPCB), a printed circuit board (PCB), a flexible printed circuit (FPC), and/or a flexible film such as a chip on film (COF).

Figure 4:
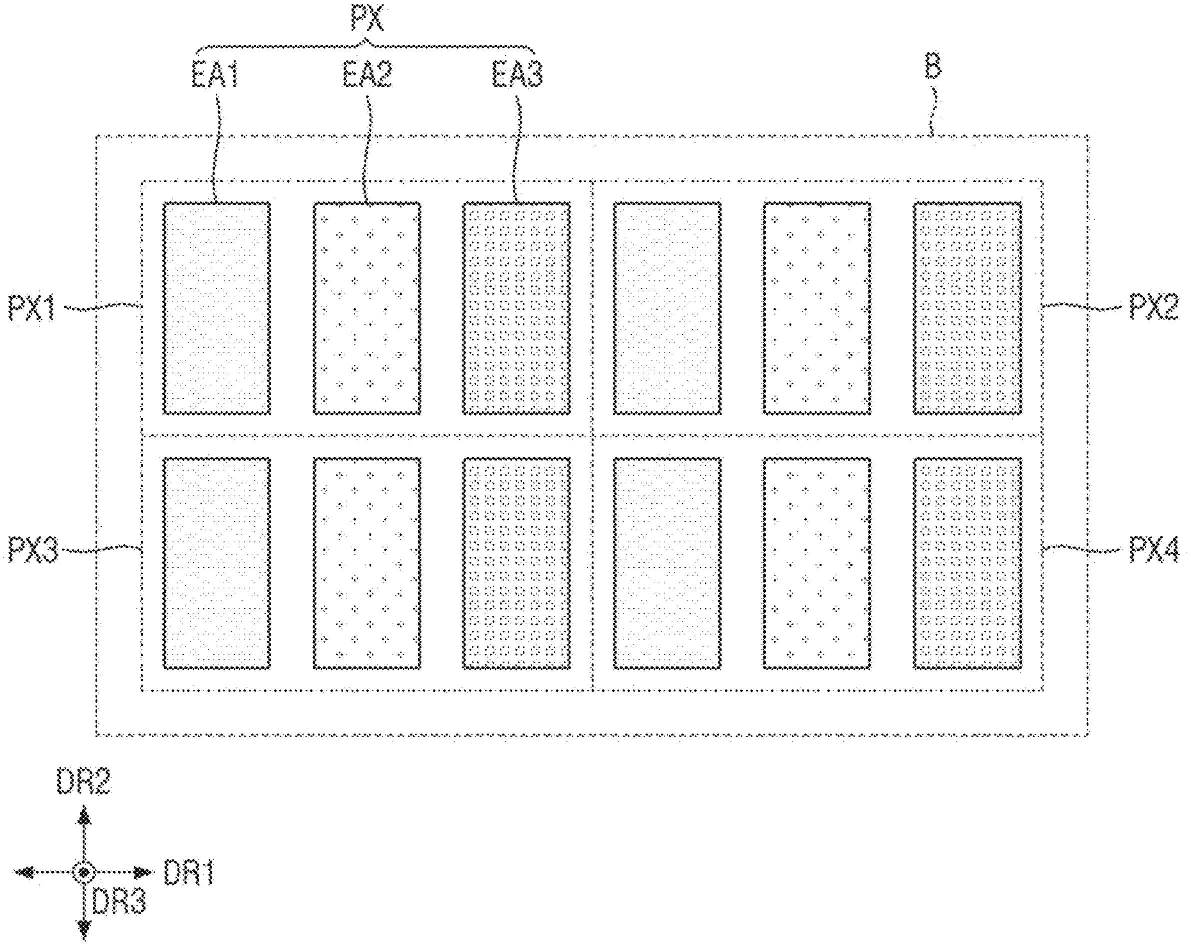
FIG. 4 is a schematic plan view illustrating part B of FIG. 2.
Figure 5:
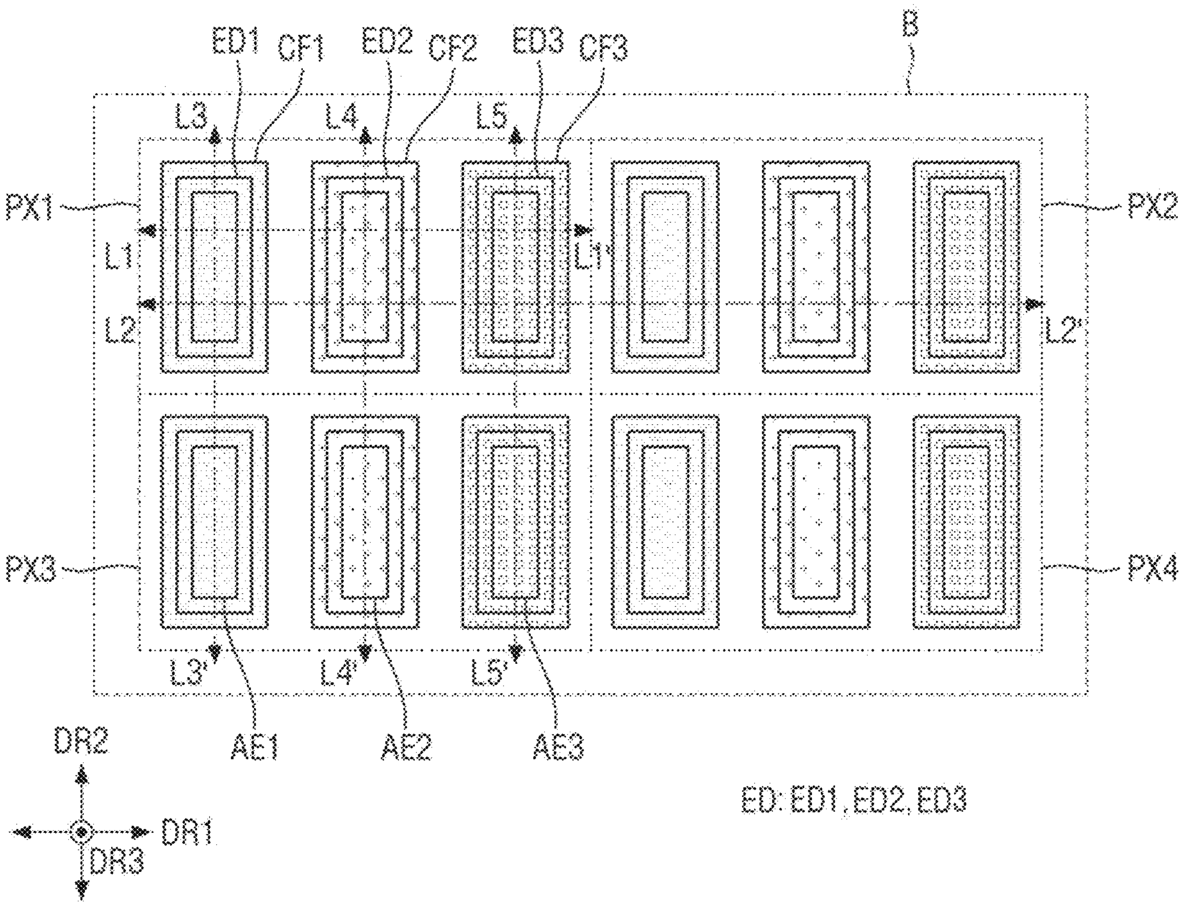
FIG. 5 is a schematic plan view illustrating dispositions of light emitting elements and pixel electrodes disposed in multiple pixels of FIG. 4.

FIG. 4 is a schematic plan view illustrating part B of FIG. 2. FIG. 5 is a schematic plan view illustrating dispositions of light emitting elements and pixel electrodes disposed in multiple pixels of FIG. 4. FIGS. 4 and 5 illustrate arrangements of different pixels PX1, PX2, PX3, and PX4, and arrangements of light emitting elements ED1, ED2, and ED3 and the emission areas EA1, EA2, and EA3.

Referring to FIGS. 4 and 5, the display panel 100 of the display device 10 may include multiple pixels PX1, PX2, PX3, and PX4. Each of the pixels PX1, PX2, PX3, and PX4 may include the emission areas EA1, EA2, and EA3 and multiple light emitting elements ED1, ED2, and ED3.

The pixels PX1, PX2, PX3, and PX4 may be arranged in the first direction DR1 and the second direction DR2. The first pixel PX1 and the second pixel PX2 may be arranged in the first direction DR1, and the first pixel PX1 and the third pixel PX3 may be arranged in the second direction DR2. The third pixel PX3 and the fourth pixel PX4 may be arranged in the first direction DR1, and the second pixel PX2 and the fourth pixel PX4 may be arranged in the second direction DR2. FIGS. 4 and 5 illustrate the arrangement of four pixels PX1, PX2, PX3, and PX4. A larger number of pixels may be arranged in the display area DA of the display panel 100 as illustrated in FIGS. 4 and 5. However, the disclosure is not limited thereto.

Each of the pixels PX1, PX2, PX3, and PX4 may include the emission areas EA1, EA2, and EA3 in which the different light emitting elements ED1, ED2, and ED3 are disposed. For example, a pixel PX may include the first emission area EA1 in which the first light emitting element ED1 is disposed, the second emission area EA2 in which the second light emitting element ED2 is disposed, and the third emission area EA3 in which the third light emitting element ED3 is disposed. The first light emitting element ED1 may emit light of a first color, the second light emitting element ED2 may emit light of a second color, and the third light emitting element ED3 may emit light of a third color. The first emission area EA1 may emit light of a first color, the second emission area EA2 may emit light of a second color, and the third emission area EA3 may emit light of a third color. For example, the light of the first color may be light of a red wavelength band, the light of the second color may be light of a green wavelength band, and the light of the third color may be light of a blue wavelength band. In an embodiment, the red light of the first color may have a central wavelength band in a range of 600 nm to 750 nm, the green light of the second color may have a central wavelength band in a range of 480 nm to 560 nm, and the blue light of the third color may have a central wavelength band in a range of 370 nm to 460 nm. However, the disclosure is not limited thereto.

In an embodiment, a pixel PX may include three light emitting elements ED1, ED2, and ED3, but the disclosure is not limited thereto. For example, a pixel PX may include three or more light emitting elements. Each of the light emitting elements ED may have a quadrilateral shape in plan view. However, the disclosure is not limited thereto. For example, the light emitting element ED may have a polygonal shape other than a quadrilateral shape, a circular shape, an elliptical shape, or an atypical shape.

In each pixel PX, the first light emitting element ED1, the second light emitting element ED2, and the third light emitting element ED3 may be spaced apart from each other in the first direction DR1. Similarly, the first emission area EA1, the second emission area EA2, and the third emission area EA3 in each pixel PX may be arranged in the first direction DR1. In the display area DA of the display panel 100, the first light emitting elements ED1, second light emitting elements ED2, and third light emitting elements ED3 may be alternately arranged in the first direction DR1. In the display area DA of the display panel 100, the first emission areas EA1, second emission areas EA2, and third emission areas EA3 may be alternately arranged in the first direction DR1.

In the pixels PX arranged in the second direction DR2, the first light emitting element ED1, the second light emitting element ED2, and the third light emitting element ED3 may be repeatedly arranged in the second direction DR2. Each of the first light emitting elements ED1, each of the second light emitting elements ED2, and each of the third light emitting elements ED3 may be arranged and spaced apart from each other along the second direction DR2 in the display area DA. Similarly, in the pixels PX arranged in the second direction DR2, the first emission area EA1, the second emission area EA2, and the third emission area EA3 may be repeatedly arranged in the second direction DR2.

The light emitting elements ED1, ED2, and ED3 of each pixel PX may be electrically connected to the pixel electrodes AE1, AE2, and AE3 of the circuit substrate 110 through a connection electrode CNE (see FIG. 6) to be described later, respectively. Each of the light emitting elements ED may be electrically connected to the common electrode CE of the display panel 100. Each of the light emitting elements ED1, ED2, and ED3 may constitute a light emitting element layer EML disposed on the circuit substrate 110 in the display panel 100 of the display device 10.

The display panel 100 may include the pixel electrodes AE1, AE2, and AE3 disposed on each of the pixels PX of the display area DA. The pixel electrodes AE1, AE2, and AE3 may include the first pixel electrode AE1 overlapping the first light emitting element ED1, the second pixel electrode AE2 overlapping the second light emitting element ED2, and the third pixel electrode AE3 overlapping the third light emitting element ED3. Each of the first to third pixel electrodes AE1, AE2, and AE3 may be electrically connected to the pixel circuit unit PXC of the circuit substrate 110. Each of the light emitting elements ED1, ED2, and ED3 may be electrically connected to the pixel circuit unit PXC through the pixel electrodes AE1, AE2, and AE3.

Figure 6:
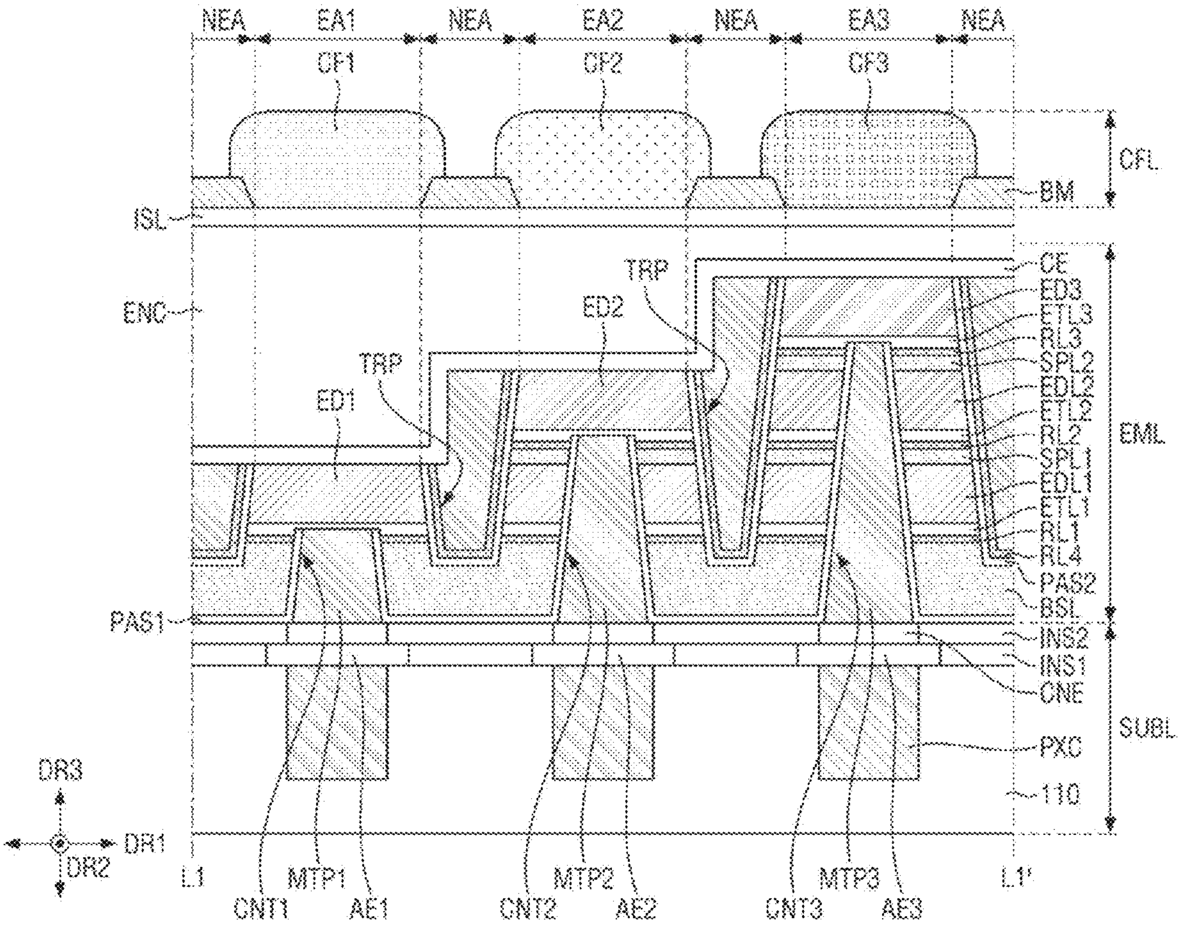
FIG. 6 is a schematic cross-sectional view taken along line L1-L1' of FIG. 4.

FIG. 6 is a schematic cross-sectional view taken along line L1-L1' of FIG. 4. FIG. 6 illustrates a cross section crossing the first light emitting element ED1, the second light emitting element ED2, and the third light emitting element ED3 of the first pixel PX1 of FIG. 5 in the first direction DR1.

Referring to FIG. 6, the display panel 100 of the display device 10 may include a first substrate SUBL, the light emitting element layer EML, and a color filter layer CFL. The first substrate SUBL may include the circuit substrate 110, the pixel circuit unit PXC, the pixel electrodes AE1, AE2, and AE3, the connection electrode CNE, and the circuit insulating layers INS1 and INS2.

The circuit board 110 may be a semiconductor circuit board. The circuit board 110 that may be a silicon wafer substrate formed by a semiconductor process may include multiple pixel circuit units (pixel circuits) PXC. Each of the pixel circuit units PXC may be formed by the process of forming a semiconductor circuit on a silicon wafer. Each of the pixel circuit units PXC may include at least one transistor and at least one capacitor formed by the semiconductor process. For example, the pixel circuit units PXC may include a complementary metal-oxide semiconductor (CMOS) circuit formed using a semiconductor process. Each of the pixel circuit units PXC may include at least one transistor formed by the semiconductor process. Further, each of the pixel circuit units PXC may further include at least one capacitor formed by the semiconductor process.

The pixel circuit units PXC may be disposed in the display area DA and the non-display area NDA. Among the pixel circuit units PXC, each of the pixel circuit units PXC disposed in the display area DA may be electrically connected to the pixel electrodes AE1, AE2, and AE3. The pixel circuit units PXC disposed in the display area DA may be disposed to correspond to the pixel electrodes AE1, AE2, and AE3, and may overlap the light emitting elements ED1, ED2, and ED3 disposed in the display area DA in the third direction DR3 that is the thickness direction.

Although not shown in the drawings, among the pixel circuit units PXC, each of the pixel circuit units PXC disposed in the non-display area NDA may be electrically connected to the common connection electrode CCE. The pixel circuit units PXC disposed in the non-display area NDA may be disposed to correspond to the common connection electrodes CCE, and may each overlap the common connection electrode CCE disposed in the non-display area NDA in the third direction DR3.

The pixel electrodes AE1, AE2, and AE3 may be disposed in the display area DA, and each of them may be disposed on the pixel circuit unit PXC corresponding thereto. Each of the pixel electrodes AE1, AE2, and AE3 may be an exposed electrode that is formed integrally with the pixel circuit unit PXC and exposed from the pixel circuit unit PXC.

Multiple connection electrodes CNE may be disposed on the pixel electrodes AE1, AE2, and AE3, respectively. The connection electrodes CNE may electrically connect the light emitting elements ED1, ED2, and ED3 to the pixel electrodes AE1, AE2, and AE3 together with some of metal patterns MTP1, MTP2, and MTP3 to be described later. Each of the connection electrodes CNE may include a highly conductive material. For example, each of the connection electrodes CNE may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The light emitting element layer EML may be disposed on the first substrate SUBL. The light emitting element layer EML may include the light emitting elements ED1, ED2, and ED3, multiple electrode layers ETL1, ETL2, and ETL3, multiple dummy element layers EDL1 and EDL2, and multiple reflective layers RL1, RL2, RL3, and RL4. The light emitting element layer EML may further include a base layer BSL, multiple auxiliary layers SPL1 and SPL2, insulating layers PAS1 and PAS2, and multiple metal patterns MTP1, MTP2, MTP3 and MTP4.

Figure 7:
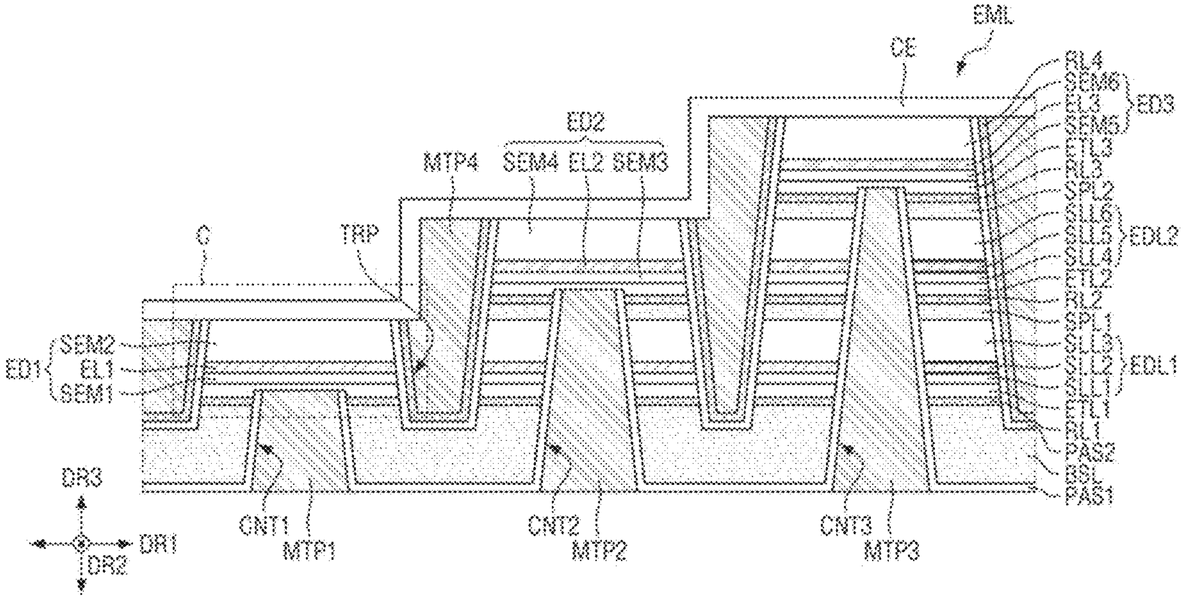
FIG. 7 is a schematic cross-sectional view showing the structure of the light emitting element layer of FIG. 6.

FIG. 7 is a schematic cross-sectional view showing the structure of the light emitting element layer of FIG. 6.

Referring to FIGS. 6 and 7, the light emitting element layer EML may have a structure in which the above-described layers are stacked are stacked on each other. The light emitting element layer EML may be disposed entirely over the display area DA of the display panel 100 and may include the light emitting elements ED1, ED2, and ED3 disposed to correspond to the emission areas EA1, EA2, and EA3 or the pixel electrodes AE1, AE2, and AE3 of each pixel PX. In the light emitting element layer EML, layers or patterns other than the light emitting elements ED1, ED2, and ED3 may be disposed to correspond to the emission areas EA1, EA2, and EA3 or the pixel electrodes AE1, AE2, and AE3 of each pixel PX, or may be disposed over one or more emission areas EA1, EA2, and EA3 or pixel electrodes AE1, AE2, and AE3.

Each of the light emitting elements ED1, ED2, and ED3 of the light emitting element layer EML may be an inorganic light emitting diode element. The light emitting elements ED may include multiple semiconductor layers SEM1, SEM2, SEM3, SEM4, SEM5, and SEM6 and light emitting layers EL1, EL2, and EL3. The light emitting elements ED1, ED2, and ED3 may be electrically connected to the pixel circuit unit PXC of the circuit substrate 110 to emit light from the light emitting layers EL1, EL2, and EL3.

The base layer BSL may be a base layer of the light emitting element layer EML. The base layer BSL may be disposed on the second circuit insulating layer INS2 of the first substrate SUBL with the first insulating layer PAS1 to be described later interposed therebetween. The base layer BSL may be disposed entirely on the display area DA of the display panel 100 except for portions in which through holes CNT1, CNT2, and CNT3 to be described later are disposed. The base layer BSL may be a layer supporting the light emitting elements ED1, ED2, and ED3, some of the reflective layers RL1, RL2, and RL3, and the dummy element layers EDL1 and EDL2 disposed thereon. In another embodiment, the base layer BSL may serve as a lower substrate on which an etching process is performed in the manufacturing process of the light emitting element layer EML. In an embodiment, the base layer BSL may include an insulating material such as silicon oxide ($SiO_x$), silicon nitride ($SiN_x$), and/or silicon oxynitride ($SiO_xN_y$), but embodiments are not limited thereto. In some embodiments, the base layer BSL may be omitted.

A first reflective layer RL1 may be disposed on the base layer BSL. The first reflective layer RL1 may be entirely disposed on the base layer BSL except for an area in which a trench portion TRP, which will be described later, is disposed. The first reflective layer RL1 may be disposed to correspond to the emission areas EA1, EA2, and EA3 of each pixel PX except for portions in which the through holes CNT1, CNT2, and CNT3 are disposed. The first reflective layer RL1 may have a shape of patterns which are disposed to correspond to the emission areas EA1, EA2, and EA3 of each pixel PX in the front surface of the display area DA and of which the center is penetrated by one or more of the through holes CNT1, CNT2, and CNT3. The first reflective layer RL1 may have a shape in which patterns disposed to respectively correspond to the emission areas EA1, EA2, and EA3 are disposed to be spaced apart from each other on the front surface of the display area DA in plan view. The first reflective layer RL1 may reflect light emitted from the light emitting elements ED1, ED2, and ED3 disposed thereon in an upward direction. The first reflective layer RL1 may be disposed to overlap the first light emitting element ED1, the second light emitting element ED2, and the third light emitting element ED3. In an embodiment, the first reflective layer RL1 may include a metal material having high reflectance or may have a structure of a distributed Bragg reflector (DBR) layer in which multiple insulating layers are stacked on each other. However, the disclosure is not limited thereto. The first reflective layer RL1 may not be limited to the above-described material as long as it has a material or structure capable of reflecting light emitted from the light emitting elements ED1, ED2, and ED3 disposed thereon.

The first electrode layer ETL1 may be disposed on the first reflective layer RL1. Similarly to the first reflective layer RL1, the first electrode layer ETL1 may be disposed to correspond to the emission areas EA1, EA2, and EA3 of each pixel PX except for portions in which the through holes CNT1, CNT2, and CNT3 are disposed. A portion of the first electrode layer ETL1 disposed in the first emission area EA1 may overlap the first through hole CNT1 to be described later, and a part of the bottom surface of the first electrode layer ETL1 may be depressed by the first through hole CNT1. However, a portion of the first electrode layer ETL1 disposed in the second emission area EA2 and the third emission area EA3 may be penetrated by one or more of the second through hole CNT2 and the third through hole CNT3, which will be described later, respectively. In the first electrode layer ETL1, patterns disposed respectively corresponding to the emission areas EA1, EA2, and EA3 may be disposed to be spaced apart from each other on the front surface of the display area DA in plan view, but some of the patterns may have a shape of which the center is penetrated by one or more of the through holes CNT1, CNT2, and CNT3. The first electrode layer ETL1 may be in contact with the bottom surface of the first light emitting element ED1 in the first emission area EA1, and may be in contact with the bottom surface of the first dummy element layer EDL1 in the second emission area EA2 and the third emission area EA3. The first electrode layer ETL1 may electrically connect the first light emitting element ED1 to the first metal pattern MTP1 in the first emission area EA1.

Figure 8:
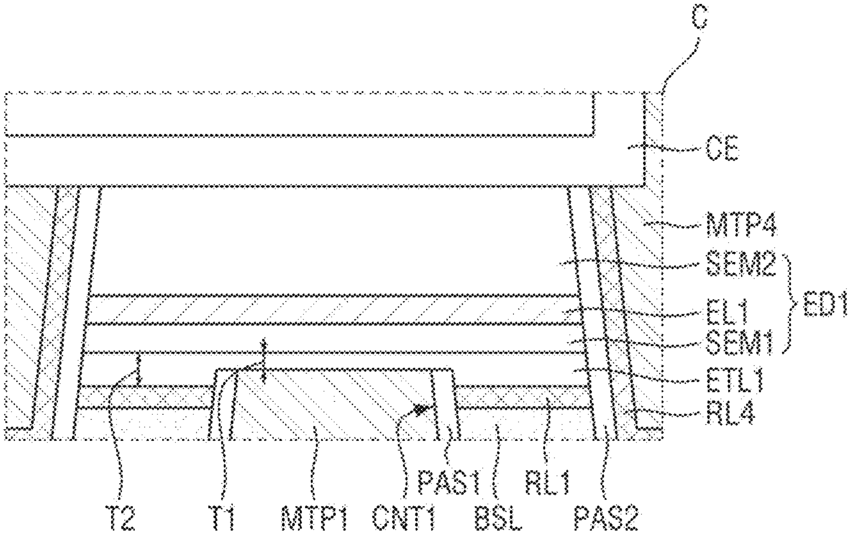
FIG. 8 is a schematic view illustrating part C of FIG. 7 in detail.

FIG. 8 is a schematic view illustrating part C of FIG. 7 in detail. FIG. 8 illustrates a structure of the first electrode layer ETL1 and the first light emitting element ED1 disposed in the first emission area EA1 in more detail.

Referring to FIG. 8 in addition to FIGS. 6 and 7, a part of the bottom surface of the first electrode layer ETL1 may be depressed by the first through hole CNT1 to be described later. A portion of the first electrode layer ETL1 may overlap the first through hole CNT1, have the depressed bottom surface thereof, and may be in contact with the first metal pattern MTP1. Another portion of the first electrode layer ETL1 may be disposed on the first reflective layer RL1. According to an embodiment, a thickness T1 of the portion of the first electrode layer ETL1 overlapping the first through hole CNT1 and being in contact with the first metal pattern MTP1 may be less than a thickness T2 of a portion disposed on the first reflective layer RL1. In the manufacturing process of the display device 10, in case that the first through hole CNT1 is formed, a part of the bottom surface of the first electrode layer ETL1 may be etched together while other layers are penetrated. Accordingly, the first electrode layer ETL1 may partially include a portion having a different thickness. Although not illustrated in the drawings, the electrode layers ETL1, ETL2, and ETL3 disposed on the bottom surfaces of the other light emitting elements ED1, ED2, and ED3 may also overlap the through holes CNT1, CNT2, and CNT3, and the portions thereof in contact with the metal patterns MTP1, MTP2, and MTP3 may have a relatively thin thickness.

However, the disclosure is not limited thereto. In case that the through holes CNT1, CNT2, and CNT3 are formed only up to the bottom surface of the first electrode layer ETL1, the bottom surface of the first electrode layer ETL1 may be formed flat and have a constant thickness.

The first electrode layer ETL1 may serve to reduce electrical resistance between the first light emitting element ED1 including the semiconductor layer and the first metal pattern MTP1. In an embodiment, the first electrode layer ETL1 may be an ohmic connection electrode or a Schottky connection electrode. The first electrode layer ETL1 may include at least one of gold (Au), copper (Cu), tin (Sn), titanium (Ti), aluminum (Al), and silver (Ag). In another embodiment, the first electrode layer ETL1 may include a transparent conductive material such as indium tin oxide (ITO) or indium zinc oxide (IZO). For example, the first electrode layer ETL1 may contain a 9:1 alloy, a 8:2 alloy or a 7:3 alloy of gold and tin, or may contain an alloy (SAC305) of copper, silver, and tin. In the drawings, it is illustrated that the first electrode layer ETL1 has a single-layer structure, but embodiments are not limited thereto. The first electrode layer ETL1 may have a multilayer structure in which two or more layers including the above-described materials are stacked on each other.

The first light emitting element ED1 may be disposed on the first electrode layer ETL1 in the first emission area EA1. The first light emitting element ED1 may be disposed to overlap the first pixel electrode AE1. The bottom surface of the first light emitting element ED1 may be in contact with the first electrode layer ETL1, and the top surface thereof may be in contact with the common electrode CE to be described later. The first light emitting element ED1 may be electrically connected to the first pixel electrode AE1 through the first electrode layer ETL1 and the first metal pattern MTP1. The first light emitting element ED1 may be electrically connected to each of the first pixel electrode AE1 and the common electrode CE. The first light emitting element ED1 may emit light by receiving electrical signals applied from the first pixel electrode AE1 and the common electrode CE. The first light emitting element ED1 may emit light of the first color.

The first dummy element layer EDL1 may be disposed on the first electrode layer ETL1 in the second emission area EA2 and the third emission area EA3. The first dummy element layer EDL1 may be disposed on substantially the same layer as the first light emitting element ED1 but may be disposed in the second emission area EA2 and the third emission area EA3 except for the first emission area EA1 in each pixel PX. In the first dummy element layer EDL1, patterns disposed to correspond to the second emission area EA2 and the third emission area EA3, respectively may be disposed to be spaced apart from each other in the display area DA in plan view, and may have a shape of which the center is penetrated by one or more of the through holes CNT1, CNT2, and CNT3. The bottom surface of the first dummy element layer EDL1 may be in contact with the first electrode layer ETL1. The first electrode layer ETL1 may be penetrated by one or more of the through holes CNT1, CNT2, and CNT3 in the second emission area EA2 and the third emission area EA3, and the first dummy element layer EDL1 disposed thereon may also be penetrated by one or more of the through holes CNT1, CNT2, and CNT3. The first light emitting element ED1 and the first dummy element layer EDL1 may be disposed on the same layer, but may have different disposed positions in plan view and have different penetrations by one or more of the through holes CNT1, CNT2, and CNT3. The first dummy element layer EDL1 may not be electrically connected to the metal patterns MTP1, MTP2, and MTP3 and the common electrode CE. The first dummy element layer EDL1 may be insulated by the first auxiliary layer SPL1 and the first insulating layer PAS1, which will be described later.

According to an embodiment, the first dummy element layer EDL1 may include the same material as the first light emitting element ED1. The first dummy element layer EDL1 may have substantially the same structure as the first light emitting element ED1 except that the first dummy element layer EDL1 is disposed in the second emission area EA2 and the third emission area EA3 and is penetrated by one or more of the through holes CNT1, CNT2, and CNT3. Each of the first light emitting element ED1 and the first dummy element layer EDL1 may include multiple layers, and each of the layers may include the same material as each other. The first light emitting element ED1 and the first dummy element layer EDL1 may be distinguished differently depending on whether they are penetrated by one or more of the through holes CNT1, CNT2, and CNT3 and whether they are separated by the trench portion TRP according to the disposed position in the manufacturing process of the light emitting element layer EML.

In the first emission area EA1, the first light emitting element ED1 may be disposed, and the common electrode CE may be disposed thereon. On the other hand, other layers may be further disposed on the first dummy element layer EDL1 in the second emission area EA2 and the third emission area EA3. The light emitting element layer EML may have different heights from the top surface of the first substrate SUBL to the common electrode CE in the different emission areas EA1, EA2, and EA3 of each pixel PX. A more detailed description thereof will be given later.

The first auxiliary layer SPL1 may be disposed on the first dummy element layer EDL1. The first auxiliary layer SPL1 may not be disposed in the first emission area EA1 but may be disposed in the second emission area EA2 and the third emission area EA3. The first auxiliary layer SPL1 may not be disposed on the first light emitting element ED1. The first auxiliary layer SPL1 may be disposed on the first dummy element layer EDL1 in the second emission area EA2 and the third emission area EA3 and be penetrated by one or more of the through holes CNT1, CNT2, and CNT3. In the first auxiliary layer SPL1, patterns disposed to correspond to the second emission area EA2 and the third emission area EA3, respectively may be disposed to be spaced apart from each other in the display area DA in plan view, and may have a shape of which the center is penetrated by one or more of the through holes CNT1, CNT2, and CNT3. The first auxiliary layer SPL1 may insulate the first dummy element layer EDL1 from layers disposed thereon. In an embodiment, the first auxiliary layer SPL1 may include the same material as the base layer BSL. For example, the first auxiliary layer SPL1 may include an insulating material such as $SiO_x$, $SiN_x$, and/or $SiO_xN_y$, but embodiments are not limited thereto.

A second reflective layer RL2 may be disposed on the first auxiliary layer SPL1. The second reflective layer RL2 may not be disposed in the first emission area EA1, but may be disposed in the second emission area EA2 and the third emission area EA3. The second reflective layer RL2 may include the same material as the first reflective layer RL1 and may reflect light emitted from the light emitting elements ED1, ED2, and ED3 in an upward direction. The second reflective layer RL2 may be disposed to overlap the second light emitting element ED2 and the third light emitting element ED3, but not to overlap the first light emitting element ED1. In the second reflective layer RL2, patterns disposed to correspond to the second emission area EA2 and the third emission area EA3, respectively may be disposed to be spaced apart from each other in the display area DA in plan view, and may have a shape of which the center is penetrated by one or more of the through holes CNT1, CNT2, and CNT3.

The second electrode layer ETL2 may be disposed on the second reflective layer RL2. Similarly to the second reflective layer RL2, the second electrode layer ETL2 may be disposed in the second emission area EA2 and the third emission area EA3 of each pixel PX. A portion of the second electrode layer ETL2 disposed in the second emission area EA2 may overlap the second through hole CNT2 to be described later, and a part of the bottom surface of the second electrode layer ETL2 may be depressed by the second through hole CNT2. However, a portion of the second electrode layer ETL2 disposed in the third emission area EA3 may be penetrated by the third through hole CNT3 to be described later. In the second electrode layer ETL2, patterns disposed to correspond to the second emission area EA2 and the third emission area EA3, respectively may be disposed to be spaced apart from each other in the display area DA in plan view, and the pattern disposed in the third emission area EA3 may have a shape of which the center is penetrated by one or more of the through holes CNT1, CNT2, and CNT3. The second electrode layer ETL2 may be in contact with the bottom surface of the second light emitting element ED2 in the second emission area EA2 and may be in contact with the bottom surface of the second dummy element layer EDL2 in the third emission area EA3. The second electrode layer ETL2 may electrically connect the second light emitting element ED2 to the second metal pattern MTP2 in the second emission area EA2. In an embodiment, the second electrode layer ETL2 may be an ohmic connection electrode or a Schottky connection electrode.

The second light emitting element ED2 may be disposed on the second electrode layer ETL2 in the second emission area EA2. The second light emitting element ED2 may be disposed to overlap the second pixel electrode AE2. The bottom surface of the second light emitting element ED2 may be in contact with the second electrode layer ETL2, and the top surface thereof may be in contact with the common electrode CE. The second light emitting element ED2 may be electrically connected to the second pixel electrode AE2 through the second electrode layer ETL2 and the second metal pattern MTP2. The second light emitting element ED2 may be electrically connected to each of the second pixel electrode AE2 and the common electrode CE, and may receive an electrical signal applied from the second pixel electrode AE2 and the common electrode CE to emit light. The second light emitting element ED2 may emit light of the second color.

The second dummy element layer EDL2 may be disposed on the second electrode layer ETL2 in the third emission area EA3. The second dummy element layer EDL2 may be disposed on substantially the same layer as the second light emitting element ED2, but may be disposed only in the third emission area EA3 of each pixel PX. The bottom surface of the second dummy element layer EDL2 may be in contact with the second electrode layer ETL2. The second electrode layer ETL2 may be penetrated by one or more of the through holes CNT1, CNT2, and CNT3 in the third emission area EA3, and the second dummy element layer EDL2 disposed thereon may also be penetrated by one or more of the through holes CNT1, CNT2, and CNT3. In the second dummy element layer EDL2, patterns disposed to correspond to the third emission areas EA3, respectively may be disposed to be spaced apart from each other in the display area DA in plan view, and may have a shape of which the center is penetrated by one or more of the through holes CNT1, CNT2, and CNT3.

The second light emitting element ED2 and the second dummy element layer EDL2 may be disposed on the same layer, but may have different disposed positions in plan view and have different penetrations by one or more of the through holes CNT1, CNT2, and CNT3. The second dummy element layer EDL2 may not be electrically connected to the metal patterns MTP1, MTP2, and MTP3 and the common electrode CE. The second dummy element layer EDL2 may be insulated by the second auxiliary layer SPL2 and the first insulating layer PAS1, which will be described later.

According to an embodiment, the second dummy element layer EDL2 may include the same material as the second light emitting element ED2. The second dummy element layer EDL2 may have substantially the same structure as the second light emitting element ED2 except that the second dummy element layer EDL2 is disposed in the third emission area EA3 and is penetrated by one or more of the through holes CNT1, CNT2, and CNT3. Each of the second light emitting element ED2 and the second dummy element layer EDL2 may include multiple layers, and each of the layers may include the same material as each other. The second light emitting element ED2 and the second dummy element layer EDL2 may be distinguished differently depending on whether they are penetrated by one or more of the through holes CNT1, CNT2, and CNT3 and whether they are separated by the trench portion TRP according to the disposed position in the manufacturing process of the light emitting element layer EML.

In the second emission area EA2, the second light emitting element ED2 may be disposed, and the common electrode CE may be disposed thereon. On the other hand, other layers may be further disposed on the second dummy element layer EDL2 in the third emission area EA3. In the light emitting element layer EML, the height from the top surface of the first substrate SUBL to the common electrode CE in the second emission area EA2 of each pixel PX may be greater than that of the first emission area EA1 but may be smaller than that of the third emission area EA3.

The second auxiliary layer SPL2 may be disposed on the second dummy element layer EDL2. The second auxiliary layer SPL2 may not be disposed in the first emission area EA1 and the second emission area EA2 but may be disposed in the third emission area EA3. The second auxiliary layer SPL2 may not be disposed on the first light emitting element ED1 and the second light emitting element ED2. The second auxiliary layer SPL2 may be disposed on the second dummy element layer EDL2 in the third emission area EA3 and may be penetrated by one or more of the through holes CNT1, CNT2, and CNT3. In the second auxiliary layer SPL2, patterns disposed to correspond to the third emission areas EA3, respectively may be disposed to be spaced apart from each other in the display area DA in plan view, and may have a shape of which the center is penetrated by one or more of the through holes CNT1, CNT2, and CNT3. The second auxiliary layer SPL2 may insulate the second dummy element layer EDL2 from layers disposed thereon. In an embodiment, the second auxiliary layer SPL2 may include the same material as the base layer BSL and the first auxiliary layer SPL1. For example, the second auxiliary layer SPL2 may include an insulating material such as $SiO_x$, $SiN_x$, and/or $SiO_xN_y$, but embodiments are not limited thereto.

The third reflective layer RL3 may be disposed on the second auxiliary layer SPL2. The third reflective layer RL3 may not be disposed in the first emission area EA1 and the second emission area EA2, but may be disposed in the third emission area EA3. The third reflective layer RL3 may include the same material as the first reflective layer RL1 and the second reflective layer RL2, and may reflect light emitted from the light emitting elements ED1, ED2, and ED3 in an upward direction. The third reflective layer RL3 may be disposed to overlap the third light emitting element ED3, but not to overlap the first light emitting element ED1 and the second light emitting element ED2. In the third reflective layer RL3, patterns disposed to correspond to the third emission areas EA3, respectively may be disposed to be spaced apart from each other in the display area DA in plan view, and may have a shape of which the center is penetrated by one or more of the through holes CNT1, CNT2, and CNT3.

The third electrode layer ETL3 may be disposed on the third reflective layer RL3. Similarly to the third reflective layer RL3, the third electrode layer ETL3 may be disposed in the third emission area EA3 of each pixel PX. The third reflective layer RL3 may have a shape in which patterns disposed to correspond to the third emission area EA3, respectively are disposed to be spaced apart from each other in the display area DA in plan view. The third electrode layer ETL3 may overlap the third through hole CNT3 to be described later, and a part of the bottom surface of the third electrode layer ETL3 may be depressed by the third through hole CNT3. The third electrode layer ETL3 may be in contact with the bottom surface of the third light emitting element ED3 in the third emission area EA3. The third electrode layer ETL3 may electrically connect the third light emitting element ED3 to the third metal pattern MTP3 in the third emission area EA3. In an embodiment, the third electrode layer ETL3 may be an ohmic connection electrode or a Schottky connection electrode.

The third light emitting element ED3 may be disposed on the third electrode layer ETL3 in the third emission area EA3. The third light emitting element ED3 may be disposed to overlap the third pixel electrode AE3. The bottom surface of the third light emitting element ED3 may be in contact with the third electrode layer ETL3 and the top surface thereof may be in contact with the common electrode CE. The third light emitting element ED3 may be electrically connected to the third pixel electrode AE3 through the third electrode layer ETL3 and the third metal pattern MTP3. The third light emitting element ED3 may be electrically connected to each of the third pixel electrode AE3 and the common electrode CE, and may receive an electrical signal applied from the third pixel electrode AE3 and the common electrode CE to emit light. The third light emitting element ED3 may emit light of the third color.

In the third emission area EA3, the third light emitting element ED3 may be disposed, and the common electrode CE may be disposed thereon. In the light emitting element layer EML, the height from the top surface of the first substrate SUBL to the common electrode CE in the third emission area EA3 of each pixel PX may be greater than that of the first emission area EA1 and the second emission area EA2.

The stacked structure of the first auxiliary layer SPL1, the second reflective layer RL2, the second electrode layer ETL2, and the second light emitting element ED2 may be similar to the stacked structure of the base layer BSL, the first reflective layer RL1, the first electrode layer ETL1, and the first light emitting element ED1. The stacked structure of the second auxiliary layer SPL2, the third reflective layer RL3, the third electrode layer ETL3, and the third light emitting element ED3 may be similar to the stacked structure of the first auxiliary layer SPL1, the second reflective layer RL2, the second electrode layer ETL2, and the second light emitting element ED2. In the display device 10 according to an embodiment, the light emitting element layer EML may have a structure in which a structure in which multiple layers are stacked on each other is repeated along the third direction DR3, but the number of stacked layers may be different according to the emission areas EA1, EA2, and EA3 of each pixel PX. For example, while the above-described layers form one repeating unit, one repeating unit may be disposed in the first emission area EA1, and the first light emitting element ED1 may be disposed in the uppermost layer. In the second emission area EA2, two repeating units may be disposed, the second light emitting element ED2 may be disposed in the uppermost layer, and the first dummy element layer EDL1 may be disposed in the intermediate layer. In the third emission area EA3, three repeating units may be disposed, the third light emitting element ED3 may be disposed in the uppermost layer, and the first dummy element layer EDL1 and the second dummy element layer EDL2 may be disposed in the intermediate layer.

In another embodiment, the light emitting element layer EML may have a structure in which multiple element layers having structures similar to each other are partially stacked on each other. For example, the light emitting element layer EML may include a first element layer including the first reflective layer RL1, the first electrode layer ETL1, the first light emitting element ED1, and the first dummy element layer EDL1, a second element layer including the second reflective layer RL2, the second electrode layer ETL2, the second light emitting element ED2, and the second dummy element layer EDL2, and a third element layer including the third reflective layer RL3, the third electrode layer ETL3, and the third light emitting element ED3. The second element layer may be disposed on a portion of the first element layer, and the third element layer may be disposed on a portion of the second element layer. Only the first element layer may be disposed in the first emission area EA1, the first element layer may be disposed to overlap the second element layer in the second emission area EA2, and the third emission area EA3 may have a stacked structure in which the first to third element layers are disposed. To insulate between the stacked element layers, the first auxiliary layer SPL1 may be disposed between the first element layer and the second element layer, and the second auxiliary layer SPL2 may be disposed between the second element layer and the third element layer. As the number of element layers stacked in the different emission areas EA1, EA2, and EA3 is different, the heights or thicknesses of the light emitting element layers EML in the different emission areas EA1, EA2, and EA3 may be different from each other.

According to an embodiment, each of the light emitting elements ED1, ED2, and ED3 may include the semiconductor layers SEM1 to SEM6 and the light emitting layers EL1, EL2, and EL3. Each of the dummy element layers EDL1 and EDL2 may include dummy semiconductor layers SLL1 to SLL6 including the same material as the semiconductor layer of the light emitting elements ED1, ED2, and ED3 or the light emitting layer. The first light emitting element ED1 may include the first semiconductor layer SEM1, the second semiconductor layer SEM2, and the first light emitting layer EL1 disposed therebetween. The second light emitting element ED2 may include the third semiconductor layer SEM3, the fourth semiconductor layer SEM4, and the second light emitting layer EL2 disposed therebetween, and the third light emitting element ED3 may include the fifth semiconductor layer SEM5, the sixth semiconductor layer SEM6, and the third light emitting layer EL3 disposed therebetween.

The first dummy element layer EDL1 may include the first dummy semiconductor layer SLL1, the second dummy semiconductor layer SLL2, and the third dummy semiconductor layer SLL3. The first dummy semiconductor layer SLL1, the second dummy semiconductor layer SLL2, and the third dummy semiconductor layer SLL3 may be disposed on the same layer as the first semiconductor layer SEM1, the first light emitting layer EL1, and the second semiconductor layer SEM2 of the first light emitting element ED1, respectively and may include the same material. The second dummy element layer EDL2 may include the fourth dummy semiconductor layer SLL4, the fifth dummy semiconductor layer SLL5, and the sixth dummy semiconductor layer SLL6. The fourth dummy semiconductor layer SLL4, the fifth dummy semiconductor layer SLL5, and the sixth dummy semiconductor layer SLL6 may be disposed on the same layer as the third semiconductor layer SEM3, the second light emitting layer EL2, and the fourth semiconductor layer SEM4 of the second light emitting element ED2, respectively and may include the same material. The semiconductor layers SEM1 to SEM6, the light emitting layers EL1, EL2, and EL3, and the dummy semiconductor layers SLL1 to SLL6 may be sequentially stacked on each other in the third direction DR3.

The first semiconductor layer SEM1 of the first light emitting element ED1 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer SEM1 may be any one or more of p-type doped AlGaInN, GaN, AlGaN, InGaN, AlN and InN. The first semiconductor layer SEM1 may be doped with a p-type dopant, and the p-type dopant may be Mg, Zn, Ca, Ba, and/or the like. For example, the first semiconductor layer SEM1 may be p-GaN doped with p-type Mg. The first semiconductor layer SEM1 may have a thickness in a range of 30 nm to 200 nm.

Each of the third semiconductor layer SEM3 of the second light emitting element ED2 and the fifth semiconductor layer SEM5 of the third light emitting element ED3 may be a p-type semiconductor similarly to the first semiconductor layer SEM1, and may include a semiconductor material having a chemical formula of $Al_xGa_yIn_{1-x-y}N$ ($0 \leq x \leq 1$, $0 \leq y \leq 1$, $0 \leq x+y \leq 1$). However, the "x" and "y" values of each of the first semiconductor layer SEM1, the third semiconductor layer SEM3, and the fifth semiconductor layer SEM5 may be different from each other.

The second semiconductor layer SEM2 of the first light emitting element ED1 may be disposed on the first light emitting layer EL1. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, 0_y≤1, $0 \leq x+y \leq 1$). For example, the second semiconductor layer SEM2 may be any one or more of n-type doped AlGaInN, GaN, AlGaN, InGaN, AlN and InN. The second semiconductor layer SEM2 may be doped with an n-type dopant, and the n-type dopant may be Si, Ge, Sn, or the like. For example, the second semiconductor layer SEM2 may be n-GaN doped with n-type Si. The thickness of the second semiconductor layer SEM2 may be in a range of 500 nm to 1 μm, but embodiments are not limited thereto.

Each of the fourth semiconductor layer SEM4 of the second light emitting element ED2 and the sixth semiconductor layer SEM6 of the third light emitting element ED3 may be an n-type semiconductor similarly to the second semiconductor layer SEM2, and may include a semiconductor material having a chemical formula of $Al_xGa_yIn_{1-x-y}N$ ($0 \leq x \leq 1$, $0 \leq y \leq 1$, $0 \leq x+y \leq 1$). However, the "x" and "y" values of each of the second semiconductor layer SEM2, the fourth semiconductor layer SEM4, and the sixth semiconductor layer SEM6 may be different from each other.

The first light emitting layer EL1 of the first light emitting element ED1 may be disposed between the first semiconductor layer SEM1 and the second semiconductor layer SEM2. The second light emitting layer EL2 of the second light emitting element ED2 may be disposed between the third semiconductor layer SEM3 and the fourth semiconductor layer SEM4, and the third light emitting layer EL3 of the third light emitting element ED3 may be disposed between the fifth semiconductor layer SEM5 and the sixth semiconductor layer SEM6. The light emitting layers EL1, EL2, and EL3 may emit light by electron-hole recombination according to emission signals applied through the different semiconductor layers SEM1 to SEM6 of the light emitting elements ED1, ED2, and ED3. The light emitting layers EL1, EL2, and EL3 may include a material having a single or multiple quantum well structure. In case that the light emitting layers EL1, EL2, and EL3 contain a material having a multiple quantum well structure, they may have a structure in which multiple well layers and barrier layers are alternately stacked on each other. At this time, the well layer may be formed of InGaN, and the barrier layer may be formed of GaN or AlGaN, but the disclosure is not limited thereto. For example, the light emitting layers EL1, EL2, and EL3 may have a structure in which semiconductor materials having large band gap energy and semiconductor materials having small band gap energy are alternately stacked on each other, and may include other group III to V semiconductor materials according to the wavelength band of the emitted light.

According to an embodiment, the light emitting elements ED1, ED2, and ED3 of the display device 10 may include the different light emitting layers EL1, EL2, and EL3 to emit light of different colors. For example, the first light emitting layer EL1 of the first light emitting element ED1 may emit red light of the first color, the second light emitting layer EL2 of the second light emitting element ED2 may emit green light of the second color; and the third light emitting layer EL3 of the third light emitting element ED3 may emit blue light of the third color. Each of the first light emitting element ED1, the second light emitting element ED2, and the third light emitting element ED3 may have substantially the same structure and material, but may emit light of different colors due to different component ratios of the semiconductor layer.

In an embodiment, the first light emitting layer EL1 may emit light by coupling of electron-hole pairs according to an electrical signal applied through the first semiconductor layer SEM1 and the second semiconductor layer SEM2. The first light emitting layer EL1 may emit first light having a central wavelength band in a range of approximately 600 nm to approximately 750 nm, for example, light in a red wavelength band.

The second light emitting layer EL2 may emit light by coupling of electron-hole pairs according to an electrical signal applied through the third semiconductor layer SEM3 and the fourth semiconductor layer SEM4. The second light emitting layer EL2 may emit third light having a central wavelength band in a range of approximately 480 nm to approximately 560 nm, for example, light in a green wavelength band.

The third light emitting layer EL3 may emit light by coupling of electron-hole pairs according to an electrical signal applied through the fifth semiconductor layer SEM5 and the sixth semiconductor layer SEM6. The third light emitting layer EL3 may emit fourth light having a central wavelength band in a range of approximately 370 nm to approximately 460 nm, for example, light in a blue wavelength band.

Each of the first light emitting layer EL1, the second light emitting layer EL2, and the third light emitting layer EL3 may have a chemical formula of $Al_xGa_yIn_{1-x-y}N$ ($0<x\leq1$, $0\leq y\leq1$, $0\leq x+y\leq1$), but the "x" and "y" values may be different from each other. In an embodiment in which each of the first light emitting layer EL1, the second light emitting layer EL2, and the third light emitting layer EL3 includes InGaN, the color of light emitted by each of them may vary according to the content of indium (In). For example, as the content of indium (In) increases, the wavelength band of the light emitted by the first to third light emitting layers EL1, EL2, and EL3 may move to the red wavelength band, and as the content of indium (In) decreases, the wavelength band of the light emitted by them may move to the blue wavelength band. The content of indium (In) in the first light emitting layer EL1 may be higher than the content of indium (In) in the second light emitting layer EL2, and the content of indium (In) in the second light emitting layer EL2 may be higher than the content of indium (In) in the third light emitting layer EL3. For example, the content of indium (In) in the third light emitting layer EL3 may be 25%, the content of indium (In) in the second light emitting layer EL2 may be 30% or more, and the content of indium (In) in the first light emitting layer EL1 may be 35% or more. However, the disclosure is not limited thereto.

Similarly to the above, in an embodiment in which each of the first to sixth semiconductor layers SEM1 to SEM6 of the first to third light emitting elements ED1, ED2, and ED3 includes a GaN-based semiconductor, each of these may have a difference in the content of indium (In) or aluminum (Al), or the concentration of the doped dopant, or the like. The first to sixth semiconductor layers SEM1 to SEM6 of each of the first to third light emitting elements ED1, ED2, and ED3 may have the content of indium (In) that is higher or less than that of the other light emitting elements ED1, ED2, and ED3.

In the drawing, it is illustrated that each of the light emitting elements ED1, ED2, and ED3 includes two different semiconductor layers SEM1 to SEM6 and the light emitting layers EL1, EL2, and EL3 disposed therebetween. However, the disclosure is not limited thereto. Each of the light emitting elements ED1, ED2, and ED3 and the dummy element layers EDL1 and EDL2 may further include more semiconductor layers, for example, an electron blocking layer, a superlattice layer, and/or the like.

According to an embodiment, the light emitting elements ED1, ED2, and ED3 of the display device 10 may have the same diameter. For example, the first diameter of the first light emitting element ED1, the second diameter of the second light emitting element ED2, and the third diameter of the third light emitting element ED3 may be the same as each other. However, the disclosure is not limited thereto. In some embodiments, the light emitting elements ED1, ED2, and ED3 may have different diameters.

The first dummy semiconductor layer SLL1, the second dummy semiconductor layer SLL2, and the third dummy semiconductor layer SLL3 of the first dummy element layer EDL1 may include the same material as the first semiconductor layer SEM1, the first light emitting layer EL1, and the second semiconductor layer SEM2 of the first light emitting element ED1, respectively. The fourth dummy semiconductor layer SLL4, the fifth dummy semiconductor layer SLL5, and the sixth dummy semiconductor layer SLL6 of the second dummy element layer EDL2 may include the same material as the third semiconductor layer SEM3, the second light emitting layer EL2, and the fourth semiconductor layer SEM4 of the second light emitting element ED2, respectively.

The first to third through holes CNT1, CNT2, and CNT3 may be disposed to overlap the first to third light emitting elements ED1, ED2, and ED3, respectively. The first to third through holes CNT1, CNT2, and CNT3 may extend from the bottom surface of the base layer BSL of the light emitting element layer EML in the third direction DR3 to penetrate the layers. For example, the first through hole CNT1 may be disposed to overlap the first light emitting element ED1, may penetrate the base layer BSL and the first reflective layer RL1, and may be formed such that a part of the bottom surface of the first electrode layer ETL1 is depressed. The second through hole CNT2 may be disposed to overlap the second light emitting element ED2, may penetrate the base layer BSL, the first reflective layer RL1, the first electrode layer ETL1, the first dummy element layer EDL1, the first auxiliary layer SPL1, and the second reflective layer RL2, and may be formed such that a part of the bottom surface of the second electrode layer ETL2 is depressed. The third through hole CNT3 may be disposed to overlap the third light emitting element ED3, may penetrate the base layer BSL, the first reflective layer RL1, the first electrode layer ETL1, the first dummy element layer EDL1, the first auxiliary layer SPL1, the second reflective layer RL2, the second electrode layer ETL2, the second dummy element layer EDL1, the second auxiliary layer SPL2, and the third reflective layer RL3, and may be formed such that a part of the bottom surface of the third electrode layer ETL3 is depressed.

In the light emitting element layer EML, similarly to a case where the heights from the bottom surface thereof to the common electrode CE are different according to the different emission areas EA1, EA2, and EA3, the first to third through holes CNT1, CNT2, and CNT3 may have different depths. The first to third through holes CNT1, CNT2, and CNT3 may have a shape in which the width decreases as it goes from the bottom surface of the light emitting element layer EML in an upward direction. In the light emitting element layer EML, the first to third through holes CNT1, CNT2, and CNT3 may form a space in which the metal patterns MTP1, MTP2, and MTP3 for electrical connection between the light emitting elements ED1, ED2, and ED3 and the pixel electrodes AE1, AE2, and AE3 are disposed.

The trench portion TRP may be disposed not to overlap the first to third light emitting elements ED1, ED2, and ED3. The trench portion TRP may be disposed to surround the periphery of the first to third light emitting elements ED1, ED2, and ED3, and may be disposed to penetrate the layers disposed under the first to third light emitting elements ED1, ED2, and ED3 from the upper layer of the light emitting element layer EML. For example, the trench portion TRP may penetrate the third electrode layer ETL3, the third reflective layer RL3, the second auxiliary layer SPL2, the second dummy element layer EDL2, the second electrode layer ETL2, the second reflective layer RL2, the first auxiliary layer SPL1, the first dummy element layer EDL1, the first electrode layer ETL1, and the first reflective layer RL1, and may be formed such that a part of the top surface of the base layer BSL is depressed. In the light emitting element layer EML, in the same manner as a case where the heights from the bottom surface thereof to the common electrode CE are different according to the different emission areas EA1, EA2, and EA3, the trench portion TRP may have different depths according to positions. The trench portion TRP may have a shape in which the width of the light emitting element layer EML narrows as it goes from the top portion in a downward direction.

In the light emitting element layer EML, the trench portion TRP may serve to distinguish the light emitting elements ED1, ED2, and ED3 from each other. The trench portion TRP may be formed to surround the light emitting elements ED1, ED2, and ED3, and the light emitting elements ED1, ED2, and ED3 may be disposed to correspond to the different emission areas EA1, EA2, and EA3 or the different pixel electrodes AE1, AE2, and AE3. The trench portion TRP may serve to distinguish the light emitting elements ED1, ED2, and ED3 from the dummy element layers EDL1 and EDL2, which are disposed on the same layer and include the same material.

The first insulating layer PAS1 may be disposed on the bottom surface of the base layer BSL and the inner side edges of the through holes CNT1, CNT2, and CNT3. While the first insulating layer PAS1 covers, among the layers of the light emitting element layers EML, the inner side edges of the layers exposed by the through holes CNT1, CNT2, and CNT3 and protects the layers, the first insulating layer PAS1 may mutually insulate the layers from the metal patterns MTP1, MTP2, and MTP3 disposed in the through holes CNT1, CNT2, and CNT3. However, the first insulating layer PAS1 may not cover the bottom surfaces of the first to third electrode layers ETL1, ETL2, and ETL3 exposed by the first to third through holes CNT1, CNT2, and CNT3.

The second insulating layer PAS2 may surround the inner side edges of the trench portion TRP of the light emitting element layer EML and may cover the side surfaces of the light emitting elements ED1, ED2, and ED3 and the dummy element layers EDL1 and EDL2. The second insulating layer PAS2 may be disposed on surfaces exposed by the trench portion TRP. The second insulating layer PAS2 may cover the side surfaces of respective layers exposed by the trench portion TRP and may also be disposed on the depressed top surface of the base layer BSL. The second insulating layer PAS2 may protect the exposed layers and mutually insulate the layers from the fourth metal pattern MTP4. The second insulating layer PAS2 may also be in contact with the side surfaces of the electrode layers ETL1, ETL2, and ETL3 and the first to third reflective layers RL1, RL2, and RL3. In an embodiment, the first insulating layer PAS1 and the second insulating layer PAS2 may include an insulating material such as $SiO_x$, $SiN_x$, or $SiO_xN_y$, but embodiments are not limited thereto.

The fourth reflective layer RL4 may be disposed on the second insulating layer PAS2. The fourth reflective layer RL4 may be disposed to surround the first light emitting element ED1, the second light emitting element ED2, and the third light emitting element ED3. The fourth reflective layer RL4 may include a material having a high reflectance in the same manner as the above-described reflective layers, and thus may prevent that the light emitted from each of the light emitting elements ED1, ED2, and ED3 is emitted to the side surface and the emitted light goes out to the adjacent other emission areas EA1, EA2, and EA3. The fourth reflective layer RL4 may surround each of the side surfaces of the layers penetrated by the trench portion TRP. For example, the fourth reflective layer RL4 may surround the side surfaces of the first reflective layer RL1, the first electrode layer ETL1, the first dummy element layer EDL1, the first auxiliary layer SPL1, the second reflective layer RL2, the second electrode layer ETL2, the second dummy element layer EDL2, the second auxiliary layer SPL2, the third reflective layer RL3, and the third electrode layer ETL3. The fourth reflective layer RL4 may also be disposed on the depressed top surface of the base layer BSL.

The first to third metal patterns MTP1, MTP2, and MTP3 may be disposed in the first to third through holes CNT1, CNT2, and CNT3, respectively. The first metal pattern MTP1 may be disposed in the first through hole CNT1 and may be in contact with each of the first electrode layer ETL1 and the connection electrode CNE disposed on the first pixel electrode AE1. The second metal pattern MTP2 may be disposed in the second through hole CNT2 and may be in contact with each of the second electrode layer ETL2 and the connection electrode CNE disposed on the second pixel electrode AE2. The third metal pattern MTP3 may be disposed in the third through hole CNT3 and may be in contact with each of the third electrode layer ETL3 and the connection electrode CNE disposed on the third pixel electrode AE3. The first to third metal patterns MTP1, MTP2, and MTP3 may be electrically connected to the first to third light emitting elements ED1, ED2, and ED3 and the first to third pixel electrodes AE11, AE2, and AE3, respectively.

Figure 9:
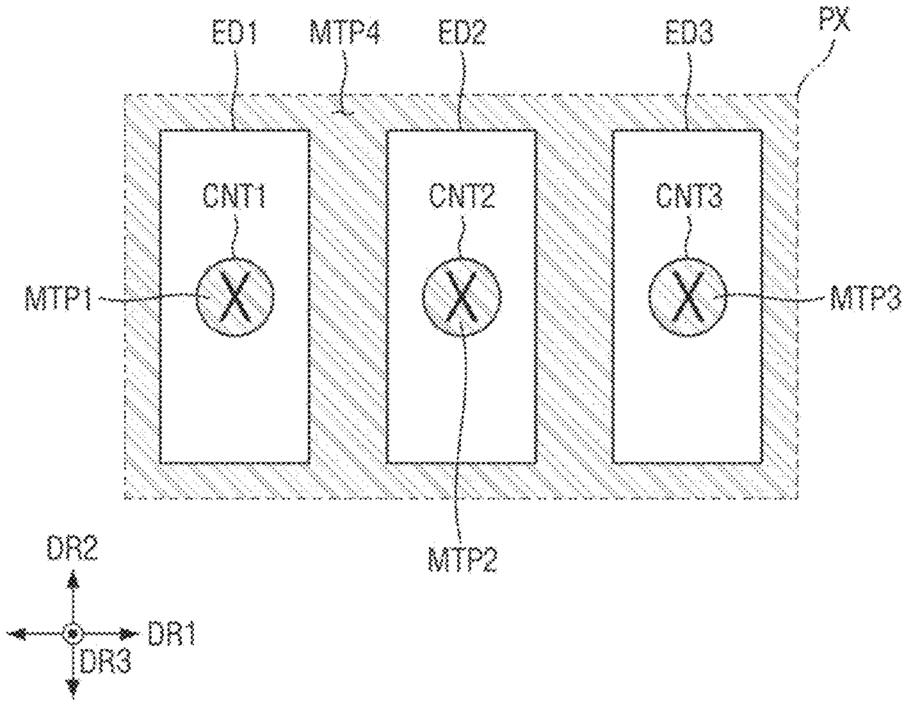
FIG. 9 is a schematic plan view illustrating dispositions of light emitting elements and metal portions disposed in a pixel of a display panel according to an embodiment.

FIG. 9 is a schematic plan view illustrating dispositions of light emitting elements and metal portions disposed in a pixel of a display panel according to an embodiment.

Referring to FIG. 9, the first to third metal patterns MTP1, MTP2, and MTP3 may be disposed to overlap the light emitting elements ED1, ED2, and ED3, respectively. The first to third metal patterns MTP1, MTP2, and MTP3 may be disposed to fill the first to third through holes CNT1, CNT2, and CNT3, respectively, and the shape thereof in plan view may be similar to the planar shape of the first to third through holes CNT1, CNT2, and CNT3. For example, while the first to third light emitting elements ED1, ED2, and ED3 have a quadrilateral shape in plan view, each of the first to third through holes CNT1, CNT2, and CNT3 and the first to third metal patterns MTP1, MTP2, and MTP3 may have a circular shape in plan view. The areas of the first to third through holes CNT1, CNT2, and CNT3 and the first to third metal patterns MTP1, MTP2, and MTP3 may be smaller than those of the light emitting elements ED1, ED2, and ED3 in plan view.

The fourth metal pattern MTP4 may be disposed in the trench portion TRP. Unlike the first to third metal patterns MTP1, MTP2, and MTP3, the fourth metal pattern MTP4 may not be electrically connected to the light emitting elements ED1, ED2, and ED3. As will be described later in the manufacturing process of the display device 10, the fourth metal pattern MTP4 may be disposed to flatten a stepped portion due to the trench portion TRP formed in the light emitting element layer EML, and may be etched together in an etching process to expose the light emitting elements ED1, ED2, and ED3. Accordingly, the heights of the fourth metal pattern MTP4 may be different from each other according to positions. This may be the same as the fact that the trench portion TRP of the light emitting element layer EML has different heights according to positions.

The fourth metal pattern MTP4 and the trench portion TRP may be disposed to surround the light emitting elements ED1, ED2, and ED3, respectively, in plan view. In an embodiment in which the light emitting element layer EML is disposed entirely on the display area DA of the display panel 100, the fourth metal pattern MTP4 may be disposed entirely in the display area DA except for the area in which the light emitting elements ED1, ED2, and ED3 are disposed.

In an embodiment, the first to fourth metal patterns MTP1, MTP2, MTP3, and MTP4 may include a metal material having high electrical conductivity. For example, the first to fourth metal patterns MTP1, MTP2, MTP3, and MTP4 may include at least one of gold (Au), copper (Cu), aluminum (Al), and tin (Sn).

The common electrode CE may be disposed entirely on the display area DA of the display panel 100 and may be an uppermost layer of the light emitting element layer EML. The common electrode CE may be disposed on the first light emitting element ED1, the second light emitting element ED2, and the third light emitting element ED3 disposed in the pixels PX, and may be electrically connected to them. The common electrode CE may be disposed on and directly in contact with the fourth metal pattern MTP4 disposed in the trench portion TRP. As described above, in the light emitting element layer EML, since the height or depth of the trench portion TRP and the fourth metal pattern MTP4 is different according to the position, the height of the common electrode CE disposed thereon may also be different according to the position. In an embodiment, the common electrode CE may include a transparent electrically conductive material. For example, the common electrode CE may include a transparent conductive material such as ITO, IZO, or ITZO.

An encapsulation layer ENC may be disposed on the common electrode CE of the light emitting element layer EML. The encapsulation layer ENC may planarize the top surface of the light emitting element layer EML while protecting the light emitting elements ED1, ED2, and ED3 from outside air. The encapsulation layer ENC may include at least one inorganic layer to prevent oxygen or moisture from permeating into the light emitting element layer EML. The encapsulation layer ENC may include at least one organic layer to protect the light emitting element layer EML from foreign matters such as dust.

The color filter layer CFL may be disposed on the encapsulation layer ENC. The color filter layer CFL may include an inorganic insulating layer ISL, a light blocking layer BM, and multiple color filters CF1, CF2, and CF3.

The inorganic insulating layer ISL may be disposed on the encapsulation layer ENC. The inorganic insulating layer ISL may have insulating and optical functions. The inorganic insulating layer ISL may include at least one inorganic layer. In some embodiments, the first inorganic insulating layer ISL may be omitted. In an embodiment, the inorganic insulating layer ISL may be an inorganic layer containing at least one of a silicon nitride layer, a silicon oxynitride layer, a silicon oxide layer, a titanium oxide layer, and an aluminum oxide layer.

The light blocking layer BM may be disposed on the inorganic insulating layer ISL. The light blocking layer BM may include multiple holes disposed to overlap the emission areas EA1, EA2, and EA3. The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black, but embodiments are not limited thereto. The light blocking layer BM may prevent visible light infiltration and color mixture between the first to third emission areas EA1, EA2, and EA3, which leads to the improvement of color reproducibility of the display device 10. A portion in which the light blocking layer BM is disposed may form a non-emission area NEA between the emission areas EA1, EA2, and EA3.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 and the holes of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed to overlap the first light emitting element ED1, the second color filter CF2 may be disposed to overlap the second light emitting element ED2, and the third color filter CF3 may be disposed to overlap the third light emitting element ED3. Each of the color filters CF1, CF2, and CF3 may be disposed to have a larger area than that of the holes of the light blocking layer BM in plan view, and some of them may be disposed directly on the light blocking layer BM.

The color filters CF1, CF2, and CF3 may be disposed to correspond to the different emission areas EA1, EA2, and EA3, respectively, and may include a colorant such as a dye or pigment that absorbs light in a wavelength band other than light in a specific wavelength band. A colorant included in each of the color filters CF1, CF2, and CF3 may correspond to a color of light emitted from the emission areas EA1, EA2, and EA3 or the light emitting elements ED1, ED2, and ED3. For example, the first color filter CF1 may be a red color filter that is disposed to overlap the first light emitting element ED1 and transmits only the first light of the red color. The second color filter CF2 may be a green color filter that is disposed to overlap the second light emitting element ED2 and transmits only the second light of the green color, and the third color filter CF3 may be a blue color filter that is disposed to overlap the third light emitting element ED3 and transmits only the third light of the blue color.

In the display device 10 according to an embodiment, the light emitting element layer EML may have a structure in which multiple layers are sequentially stacked on each other on the second circuit insulating layer INS2 of the first substrate SUBL. For example, the light emitting element layer EML may have a structure in which the first to third metal patterns MTP1, MTP2, and MTP3, the first insulating layer PAS1, the base layer BSL, the first reflective layer RL1, the first electrode layer ETL1, the first light emitting element ED1 and the first dummy element layer EDL1, the first auxiliary layer SPL1, the second reflective layer RL2, the second electrode layer ETL2, the second light emitting element ED2 and the second dummy element layer EDL2, the second auxiliary layer SPL2, the third reflective layer RL3, the third electrode layer ETL3, and the third light emitting element ED3 are sequentially stacked. The light emitting element layer EML may include the through holes CNT1, CNT2, and CNT3 extending from the bottom surface of the base layer BSL in an upward direction and penetrating the layers, and the trench portion TRP extending from the top portion of the light emitting element layer EML in a downward direction and surrounding the light emitting elements ED1, ED2, and ED3. The through holes CNT1, CNT2, and CNT3 and the trench portion TRP may be filled with metal patterns MTP1, MTP2, MTP3, and MTP4.

Figure 10:
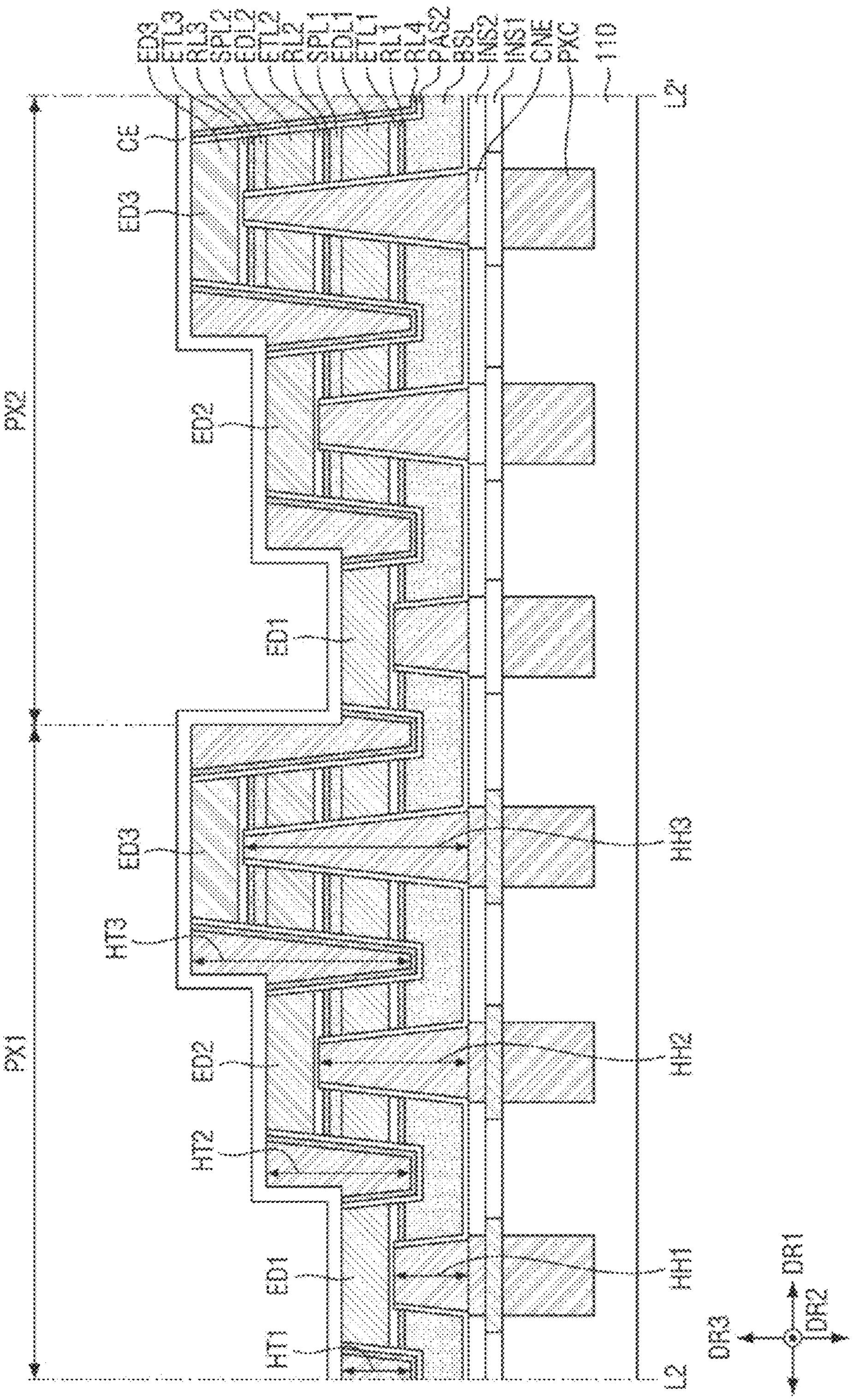
FIG. 10 is a schematic cross-sectional view taken along line L2-L2' of FIG. 4.
Figure 11:
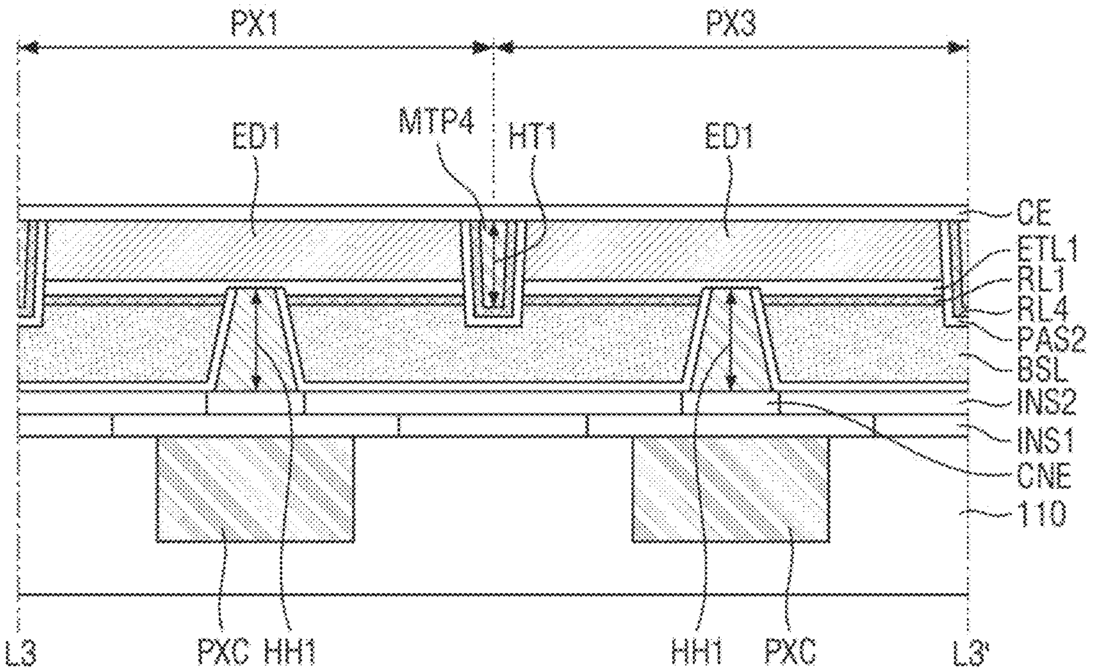
FIG. 11 is a schematic cross-sectional view taken along line L3-L3' of FIG. 4.
Figure 12:
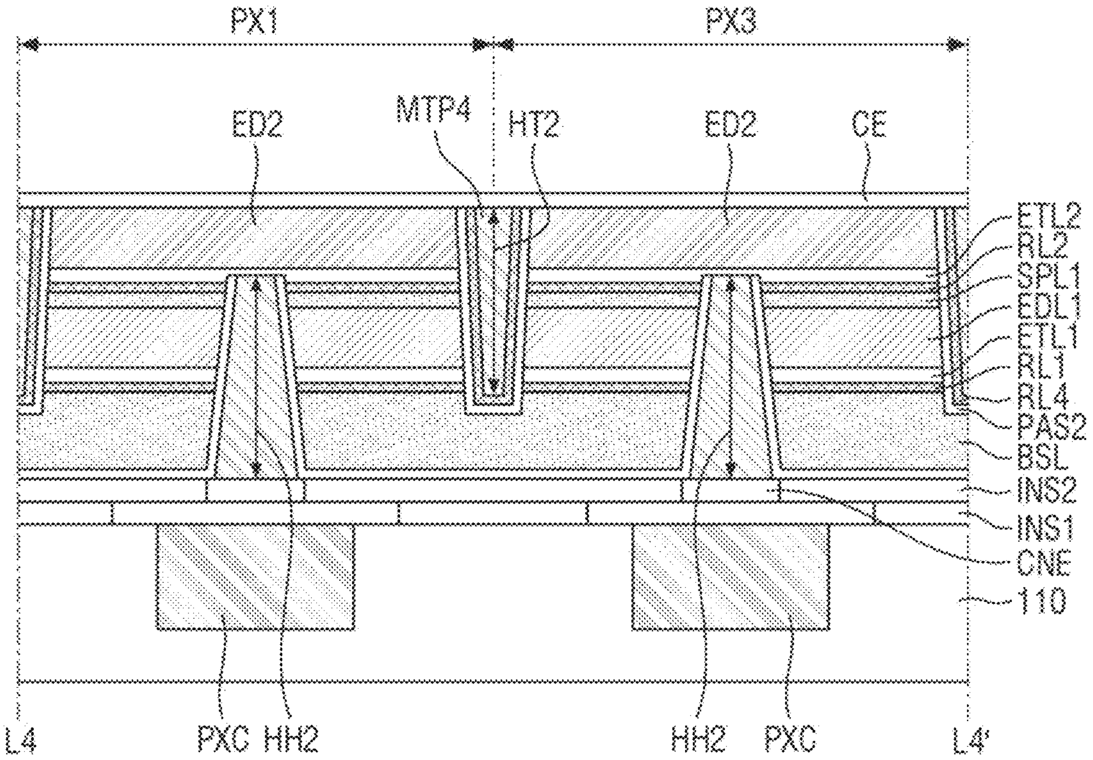
FIG. 12 is a schematic cross-sectional view taken along line L4-L4' of FIG. 4.
Figure 13:
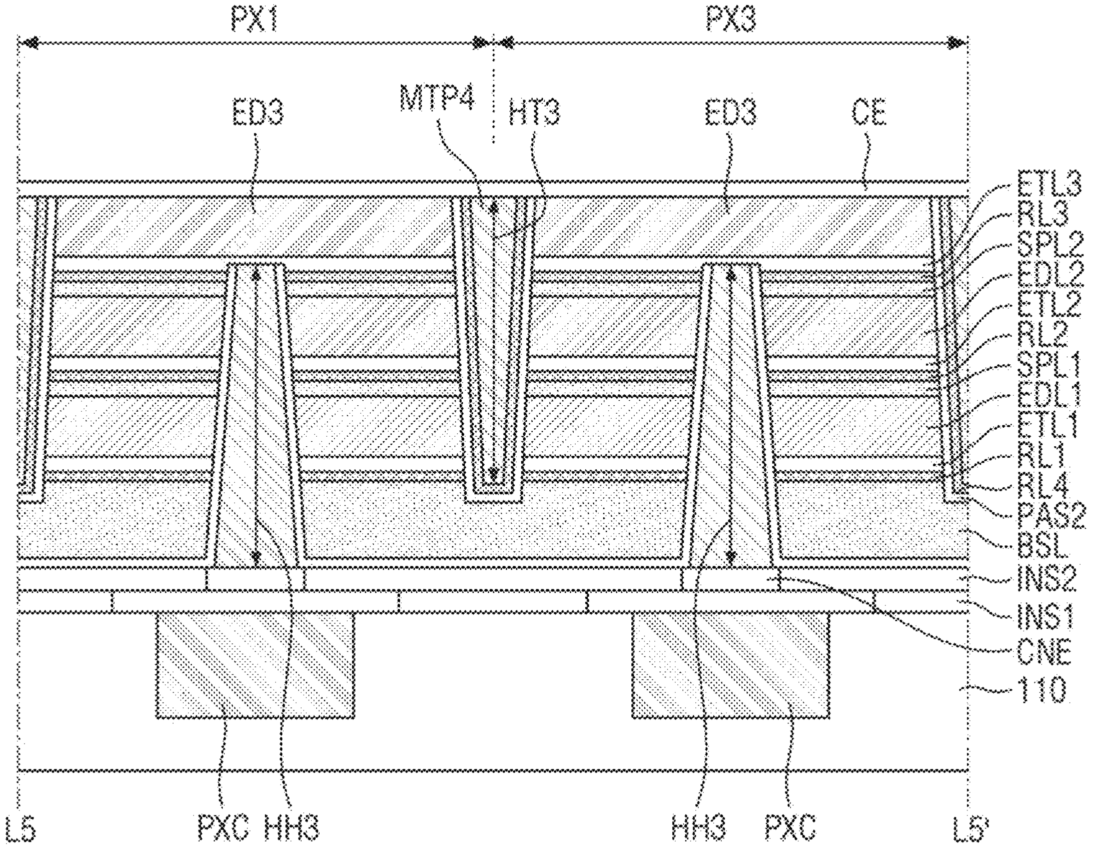
FIG. 13 is a schematic cross-sectional view taken along line L5-L5' of FIG. 4.

FIG. 10 is a schematic cross-sectional view taken along line L2-L2' of FIG. 4. FIG. 11 is a schematic cross-sectional view taken along line L3-L3' of FIG. 4. FIG. 12 is a schematic cross-sectional view taken along line L4-L4' of FIG. 4. FIG. 13 is a schematic cross-sectional view taken along line L5-L5' of FIG. 4.

FIG. 10 illustrates a cross section crossing the light emitting elements ED1, ED2, and ED3 of the first pixel PX1 and the second pixel PX2 adjacent in the first direction DR1 in FIG. 5, in the first direction DR1. Each of FIGS. 11 to 13 illustrates a cross section crossing the light emitting elements ED1, ED2, and ED3 of the first pixel PX1 and the third pixel PX3 adjacent in the second direction DR2 in FIG. 5, in the second direction DR2. FIG. 11 is a cross section crossing the first light emitting elements ED1, FIG. 12 is a cross section crossing the second light emitting element ED2, and FIG. 13 is a cross section crossing the third light emitting element ED3.

Referring to FIGS. 10 to 13, in the display device 10 according to an embodiment, the light emitting element layer EML may be disposed on the front surface of the display area DA of the display panel 100. The light emitting element layer EML may include the light emitting elements ED1, ED2, and ED3 distinguished from each other, and the base layer BSL disposed therebelow may be disposed over the front surface of the display area DA. For example, the base layer BSL, the second insulating layer PAS2, and the fourth reflective layer RL4 may be connected to each other between two adjacent pixels PX.

The third light emitting element ED3 of the first pixel PX1 and the first light emitting element ED1 of the second pixel PX2 may be distinguished by the trench portion TRP and the fourth metal pattern MTP4 disposed therebetween. However, the base layer BSL, the fourth reflective layer RL4, and the second insulating layer PAS2 disposed in the third emission area EA3 of the first pixel PX1 and the first emission area EA1 of the second pixel PX2 may be connected to each other. The first to third light emitting elements ED1, ED2, and ED3 of the first pixel PX1 and the first to third light emitting elements ED1, ED2, and ED3 of the third pixel PX3 may also be distinguished by the trench portion TRP and the fourth metal pattern MTP4 disposed therebetween. However, the base layer BSL, the fourth reflective layer RL4, and the second insulating layer PAS2 disposed in the same emission areas EA1, EA2, and EA3 in each of the first pixel PX1 and the third pixel PX3 may be connected to each other.

The light emitting elements ED1, ED2, and ED3 of the light emitting element layer EML may be constituted with semiconductor layers including different materials to emit light of different colors, and may be formed on different substrates, respectively. The semiconductor layers formed on different substrates, respectively may be sequentially stacked on each other on one substrate and separated into the different light emitting elements ED1, ED2, and ED3, respectively. Accordingly, in the display device 10, the light emitting element layer EML may include a structure in which laminates having similar structures are repeatedly stacked on each other but are divided into the different light emitting elements ED1, ED2, and ED3, so that the stacked structure, thickness, or the like may be different according to the position.

For example, the first light emitting element ED1 may be disposed on the base layer BSL in the first emission area EA1, while the first dummy element layer EDL1 and the second light emitting element ED2 may be disposed on the base layer BSL in the second emission area EA2, and the first dummy element layer EDL1, the second dummy element layer EDL2, and the third light emitting element ED3 may be disposed in the third emission area EA3. As described above, the first dummy element layer EDL1 may include substantially the same material and structure as the first light emitting element ED1, and the second dummy element layer EDL2 may include substantially the same material and structure as the second light emitting element ED2. This may be because the first light emitting element ED1 and the first dummy element layer EDL1 are formed as the same laminate in the manufacturing process of the light emitting element layer EML, and separated into different layers in a subsequent process. The same may be applied to the second light emitting element ED2 and the second dummy element layer EDL2.

In the light emitting element layer EML, the first light emitting element ED1, the second light emitting element ED2, and the third light emitting element ED3 may be disposed in the different emission areas EA1, EA2, and EA3, respectively, and the heights thereof disposed from the bottom surface of the light emitting element layer EML may be different from each other. The dummy element layers EDL1 and EDL2 may not be disposed below the first light emitting element ED1, but the first dummy element layer EDL1 may be disposed below the second light emitting element ED2, and the first dummy element layer EDL1 and the second dummy element layer EDL2 may be disposed below the third light emitting element ED3.

The heights of the through holes CNT1, CNT2, and CNT3 extending from the bottom surface of the light emitting element layer EML in the third direction DR3, and the thicknesses of the first to third metal patterns MTP1, MTP2, and MTP3 disposed therein may also be different. For example, the first through hole CNT1 may penetrate only the base layer BSL and the first reflective layer RL1, but the second through hole CNT2 may penetrate the base layer BSL, the first reflective layer RL1, the first electrode layer ETL1, the first dummy element layer EDL1, the first auxiliary layer SPL1, and the second reflective layer RL2. The third through hole CNT3 may penetrate the second electrode layer ETL2, the second dummy element layer EDL2, the second auxiliary layer SPL2, and the third reflective layer RL3 more than the second through hole CNT2. The first metal pattern MTP1 may be disposed in the first through hole CNT1 and have a first thickness HH1, the second metal pattern MTP2 may be disposed in the second through hole CNT2 and have a second thickness HH2, and the third metal pattern MTP3 may be disposed in the third through hole CNT3 and have a third thickness HH3. The first thickness HH1 of the first metal pattern MTP1 may be smaller than the second thickness HH2 of the second metal pattern MTP2 and the third thickness HH3 of the third metal pattern MTP3. The second thickness HH2 of the second metal pattern MTP2 may be smaller than the third thickness HH3 of the third metal pattern MTP3.

The top surfaces of the first to third light emitting elements ED1, ED2, and ED3 may be exposed to be in contact with the common electrode CE. The first to third light emitting elements ED1, ED2, and ED3 may have the same thickness and may be disposed on the first to third metal patterns MTP1, MTP2, and MTP3, respectively, and the top surfaces thereof may be directly in contact with the common electrode CE. The heights of the light emitting element layers EML in the first to third emission areas EA1, EA2, and EA3 may be different from each other. The height of the first emission area EA1 may be smaller than those of the second emission area EA2 and the third emission area EA3, and the height of the second emission area EA2 may be smaller than that of the third emission area EA3.

As will be described later, in the manufacturing process of the light emitting element layer EML, a layer including the same material as the second light emitting element ED2 and the third light emitting element ED3 may be stacked on the first light emitting element ED1 and may be removed. A layer including the same material as the third light emitting element ED3 may be deposited on the second light emitting element ED2 and may be removed. In the process of removing the layers, some of the first to third reflective layers RL1, RL2, and RL3, the first to third electrode layers ETL1, ETL2, and ETL3, and the first auxiliary layer SPL1 and the second auxiliary layer SPL2 may also be removed together, and the disposition or stacked structure may be different according to the emission areas EA1, EA2, and EA3.

For example, the base layer BSL, the first reflective layer RL1, and the first electrode layer ETL1, which are layers disposed under the first light emitting element ED1 and the first dummy element layer EDL1, may be disposed over the front surface of the display area DA. As described above, the base layer BSL may be disposed except for areas that overlap the through holes CNT1, CNT2, and CNT3 in the display area DA, and the first reflective layer RL1 and the first electrode layer ETL1 may be disposed except for areas that overlap the through holes CNT1, CNT2, and CNT3 and the trench portion TRP in the display area DA.

On the other hand, the first dummy element layer EDL1, the first auxiliary layer SPL1, the second reflective layer RL2, and the second electrode layer ETL2 may be disposed to correspond to the second emission area EA2 and the third emission area EA3 in the display area DA. The second dummy element layer EDL2, the second auxiliary layer SPL2, the third reflective layer RL3, and the third electrode layer ETL3 may be disposed to correspond to the third emission area EA3 in the display area DA. This may be because some of the dummy element layers EDL1 and EDL2, the auxiliary layers SPL1 and SPL2, the reflective layers RL1, RL2, and RL3, and the electrode layers ETL1, ETL2, and ETL3 are removed together in an etching process for exposing the top surfaces of the light emitting elements ED1, ED2 and ED3 after the trench portion TRP of the light emitting element layer EML is formed.

In the light emitting element layer EML, the heights of the top surfaces of the emission areas EA1, EA2, and EA3 or the light emitting elements ED1, ED2, and ED3 may be different from each other. Since the trench portion TRP is formed such that a part of the top surface of the base layer BSL is depressed from the top surface of the light emitting elements ED1, ED2, and ED3, the depths of the trench portions TRP and the thickness of the fourth metal pattern MTP4 disposed therein may also be different. For example, a portion of the trench portion TRP positioned around the first light emitting element ED1 in the first emission area EA1 or a portion of the fourth metal pattern MTP4 surrounding the first light emitting element ED1 may have a first thickness HT1. A portion of the trench portion TRP positioned around the second light emitting element ED2 in the second emission area EA2 or a portion of the fourth metal pattern MTP4 surrounding the second light emitting element ED2 may have a second thickness HT2. A portion of the trench portion TRP positioned around the third light emitting element ED3 in the third emission area EA3 or a portion of the fourth metal pattern MTP4 surrounding the third light emitting element ED3 may have a third thickness HT3. In the light emitting element layer EML, the first thickness HT1 of the fourth metal pattern MTP4 may be smaller than the second thickness HT2 and the third thickness HT3, and the second thickness HT2 may be smaller than the third thickness HT3.

In the display device 10 according to an embodiment, the light emitting elements ED1, ED2, and ED3 emitting light of different colors may be disposed on a common layer. Since the display device 10 includes one light emitting element layer EML including the different light emitting elements ED1, ED2, and ED3 together, the manufacturing process may be simplified compared to the process of individually transferring the different light emitting elements ED1, ED2, and ED3 onto the first substrate SUBL.

Hereinafter, a manufacturing process of the display device 10 will be described with reference to other drawings.

Figure 14:
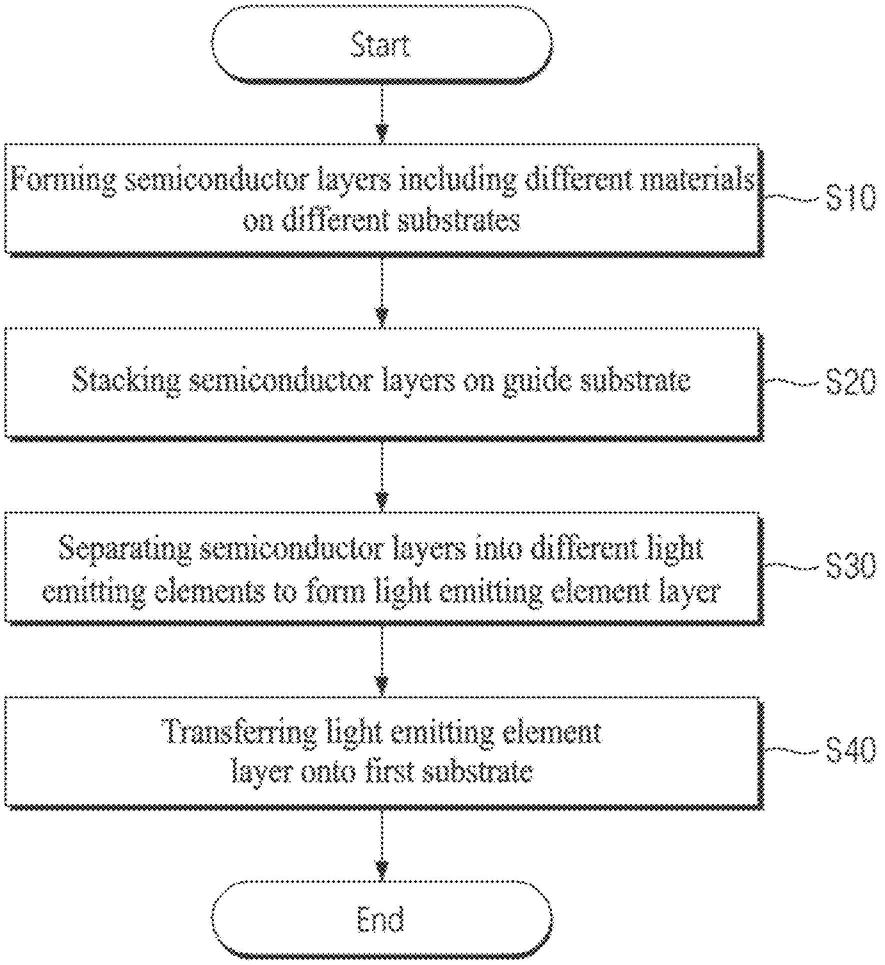
FIG. 14 is a flowchart showing a manufacturing process of a display device according to an embodiment.

FIG. 14 is a flowchart showing a manufacturing process of a display device according to an embodiment.

Referring to FIG. 14, a manufacturing method of the display device 10 according to an embodiment may include forming multiple semiconductor layers including different materials on different substrates (step S10), stacking the semiconductor layers on a guide substrate (step S20), separating the semiconductor layers into different light emitting elements to form a light emitting element layer (step S30), and transferring the light emitting element layer onto a first substrate (step S40).

Hereinafter, a manufacturing process of the display device 10, particularly a manufacturing process of the light emitting element layer EML, will be described in detail with reference to other drawings.

FIGS. 15 to 28 are schematic cross-sectional views sequentially illustrating a manufacturing process of a display device according to an embodiment. FIGS. 15 to 28 sequentially illustrate the manufacturing process of the light emitting element layer EML of the display device 10. Hereinafter, since the description of the structure and function of each layer of the light emitting element layer EML may be the same as described above, the formation order of each layer will be described.

Figure 15:
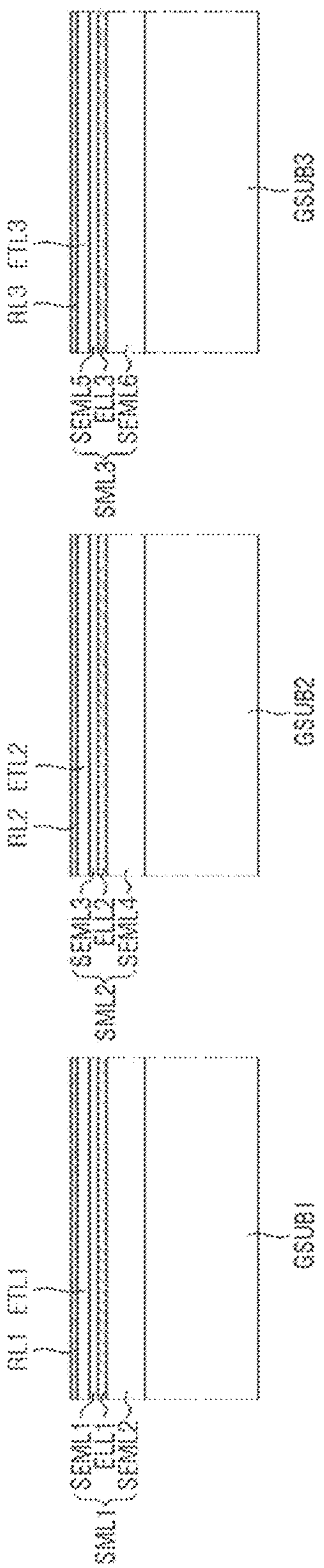
FIGS. 15 to 28 are schematic cross-sectional views sequentially illustrating a manufacturing process of a display device according to an embodiment.

Referring to FIG. 15, multiple different auxiliary substrates GSUB1, GSUB2, and GSUB3 may be prepared, and multiple semiconductor laminates SML1, SML2, and SML3, electrode layers ETL1, ETL2, and ETL3, and reflective layers RL1, RL2, and RL3 may be formed on the auxiliary substrates GSUB1, GSUB2, and GSUB3. The auxiliary substrates GSUB1, GSUB2, and GSUB3 may be sapphire substrates ($Al_2O_3$) or silicon wafers containing silicon. However, the disclosure is not limited thereto, and hereinafter, a case in which the auxiliary substrates GSUB1, GSUB2, and GSUB3 are sapphire substrates will be described as an example.

The semiconductor laminates SML1, SML2, and SML3 formed on the auxiliary substrates GSUB1, GSUB2, and GSUB3 may be formed through an epitaxial growth method. The epitaxial growth method may be electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like. As one example, it may be performed by metal organic chemical vapor deposition (MOCVD), but embodiments are not limited thereto.

A precursor material for forming the semiconductor laminates SML1, SML2, and SML3 may be selected to form a target material in a selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and/or triethyl phosphate $(C_2Hs)_3PO_4$.

The first semiconductor laminate SML1 may be formed on the first auxiliary substrate GSUB1. The first semiconductor laminate SML1 may include a first semiconductor material layer SEML1, a first light emitting material layer ELL1, and a second semiconductor material layer SEML2. The first semiconductor material layer SEML1, the first light emitting material layer ELL1, and the second semiconductor material layer SEML2 may be the same as the first semiconductor layer SEM1, the first light emitting layer EL1, and the second semiconductor layer SEM2 of the first light emitting element ED1, respectively. The second semiconductor material layer SEML2, the first light emitting material layer ELL1, and the first semiconductor material layer SEML1 may be sequentially stacked on each other on the first auxiliary substrate GSUB1. The first electrode layer ETL1 and the first reflective layer RL1 may be sequentially stacked on each other on the first semiconductor laminate SML1.

The second semiconductor laminate SML2 may be formed on the second auxiliary substrate GSUB2. The second semiconductor laminate SML2 may include a third semiconductor material layer SEML3, a second light emitting material layer ELL2, and a fourth semiconductor material layer SEML4. The third semiconductor material layer SEML3, the second light emitting material layer ELL2, and the fourth semiconductor material layer SEML4 may be the same as the third semiconductor layer SEM3, the second light emitting layer EL2, and the fourth semiconductor layer SEM4 of the second light emitting element ED2, respectively. The fourth semiconductor material layer SEML4, the second light emitting material layer ELL2, and the third semiconductor material layer SEML3 may be sequentially stacked on each other on the second auxiliary substrate GSUB2. The second electrode layer ETL2 and the second reflective layer RL2 may be sequentially stacked on each other on the second semiconductor laminate SML2.

The third semiconductor laminate SML3 may be formed on the third auxiliary substrate GSUB3. The third semiconductor laminate SML3 may include a fifth semiconductor material layer SEML5, a third light emitting material layer ELL3, and a sixth semiconductor material layer SEML6. The fifth semiconductor material layer SEML5, the third light emitting material layer ELL3, and the sixth semiconductor material layer SEML6 may be the same as the fifth semiconductor layer SEM5, the third light emitting layer EL3, and the sixth semiconductor layer SEM6 of the third light emitting element ED3, respectively. The sixth semiconductor material layer SEML6, the third light emitting material layer ELL3, and the fifth semiconductor material layer SEML5 may be sequentially stacked on each other on the third auxiliary substrate GSUB3. The third electrode layer ETL3 and the third reflective layer RL3 may be sequentially stacked on each other on the third semiconductor laminate SML3.

Figure 16:
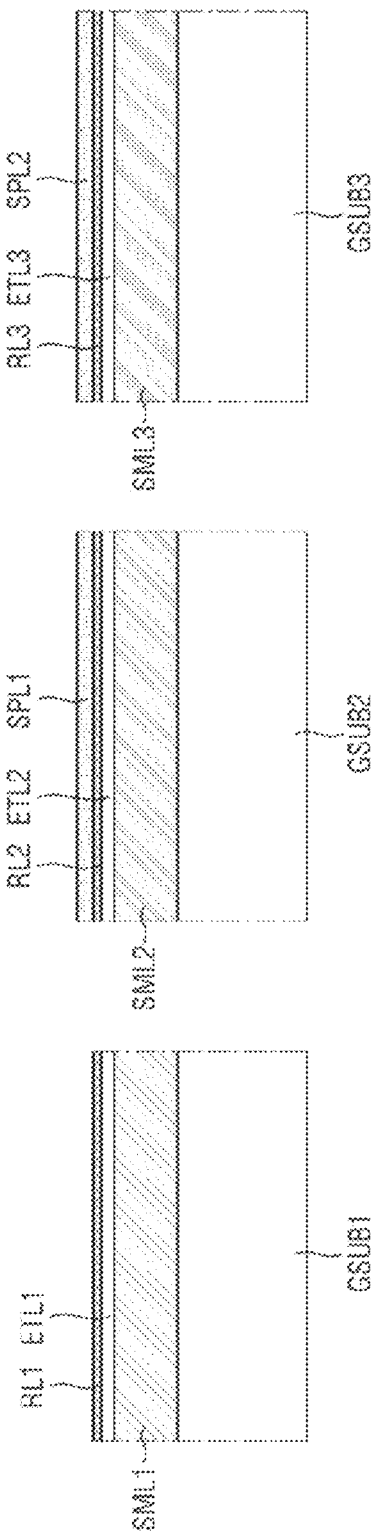

Referring to FIG. 16, the first auxiliary layer SPL1 and the second auxiliary layer SPL2 may be formed on the second reflective layer RL2 and the third reflective layer RL3, respectively. Each of the first auxiliary layer SPL1 and the second auxiliary layer SPL2 may include an insulating material to prevent electrical connection between the semiconductor laminates SML1, SML2, and SML3 in case that the laminates are stacked on each other in a subsequent process.

Figure 17:
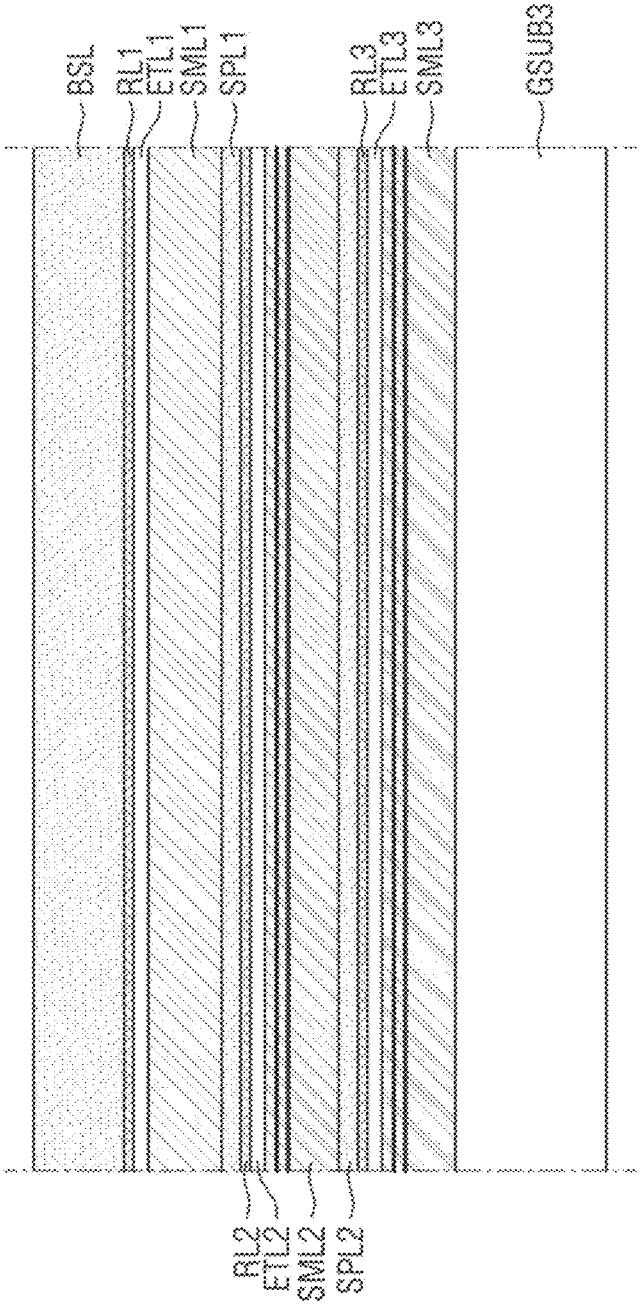

Referring to FIG. 17, after stacking the second semiconductor laminate SML2 on the second auxiliary layer SPL2 and stacking the first semiconductor laminate SML1 on the first auxiliary layer SPL1, the base layer BSL may be formed on the first reflective layer RL1. In the process, the semiconductor laminates SML1, SML2, and SML3 formed on the different auxiliary substrates GSUB1, GSUB2, and GSUB3, respectively may be sequentially stacked on each other on a third auxiliary substrate GSUB3. The reflective layers RL1, RL2, and RL3, the electrode layers ETL1, ETL2, and ETL3, and the auxiliary layers SPL1 and SPL2 may be disposed between the semiconductor laminates SML1, SML2, and SML3. A description thereof may be the same as described above.

In FIG. 17, the lower third auxiliary substrate GSUB3 may serve as a lower substrate for an etching process to be described later. On the other hand, in a subsequent process, the third auxiliary substrate GSUB3 may be removed, and the base layer BSL may serve as a lower substrate in an etching process.

Figure 18:
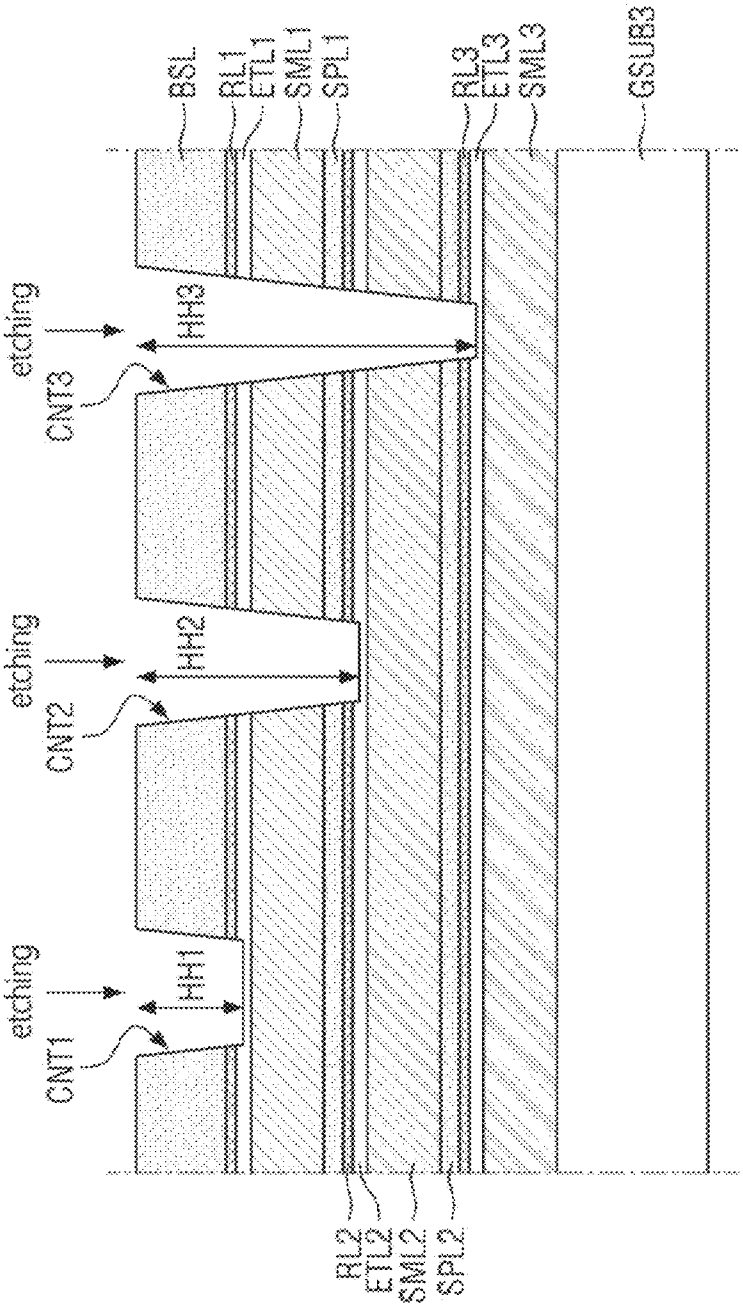

Referring to FIG. 18, multiple through holes CNT1, CNT2, and CNT3 penetrating parts of the semiconductor laminates SML1, SML2, and SML3 from the top surface of the base layer BSL and may be formed. In an embodiment, an etching process for forming the first to third through holes CNT1, CNT2, and CNT3 may be performed as a dry etching process. The different through holes CNT1, CNT2, and CNT3 may be formed to have the different depths HH1, HH2, and HH3. The first through hole CNT1 may be formed up to a part of the top surface of the first electrode layer ETL1 by penetrating the first reflective layer RL1 from the base layer BSL. The second through hole CNT2 may be formed up to a part of the top surface of the second electrode layer ETL2 by penetrating the first reflective layer RL1, the first electrode layer ETL1, the first semiconductor laminate SML1, the first auxiliary layer SPL1, and the second reflective layer RL2 from the base layer BSL. The third through hole CNT3 may be formed up to a part of the top surface of the third electrode layer ETL3 by penetrating the first reflective layer RL1, the first electrode layer ETL1, the first semiconductor laminate SML1, the first auxiliary layer SPL1, the second reflective layer RL2, the second electrode layer ETL2, the second semiconductor laminate SML2, the second auxiliary layer SPL2, and the third reflective layer RL3 from the base layer BSL.

Figure 19:
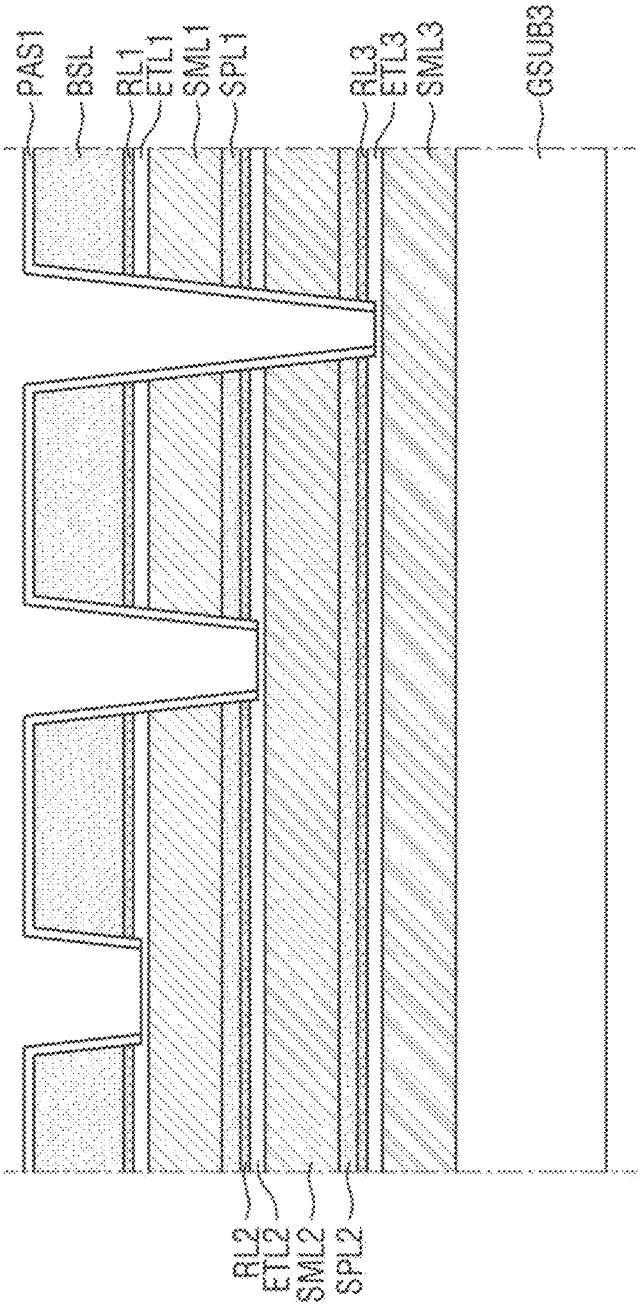
Figure 20:
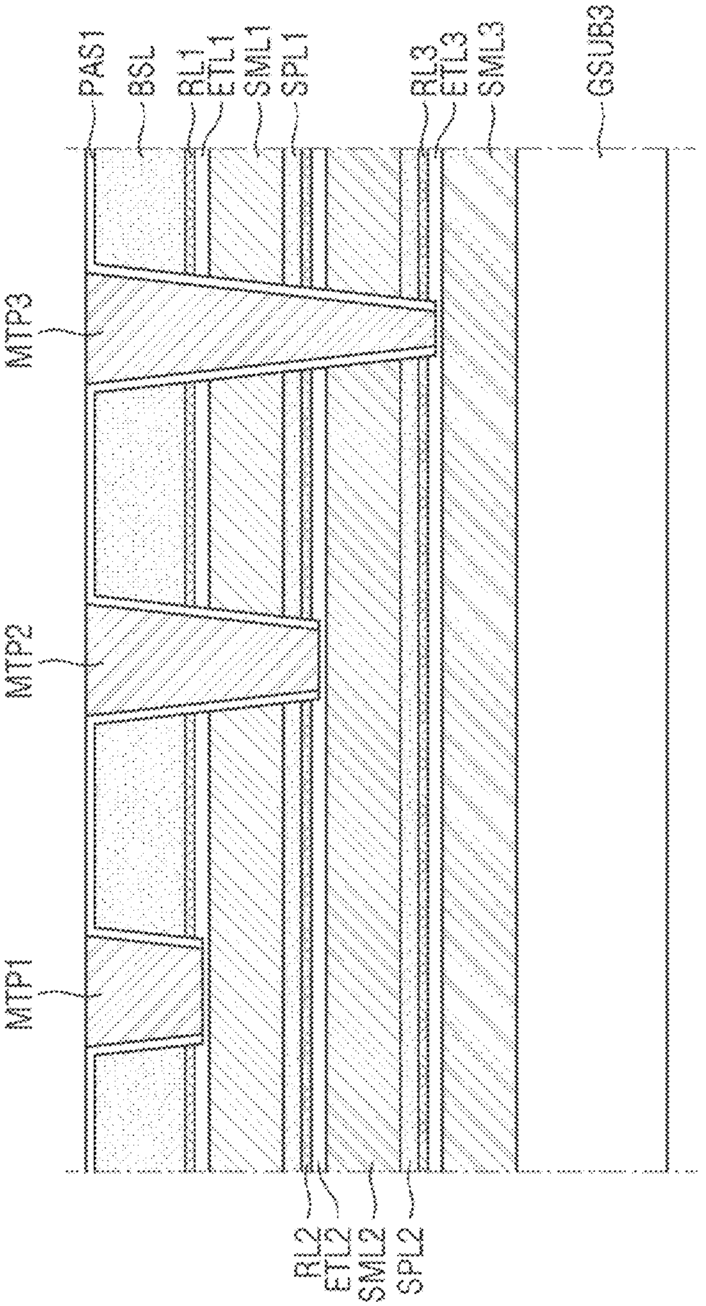

Referring to FIGS. 19 and 20, the first insulating layer PAS1 covering the inner sidewalls of the first to third through holes CNT1, CNT2, and CNT3 and the top surface of the base layer BSL may be formed, and the first to third metal patterns MTP1, MTP2, and MTP3 are formed in the first to third through holes CNT1, CNT2, and CNT3. The first insulating layer PAS1 may be disposed in the first to third through holes CNT1, CNT2, and CNT3, but may be formed such that top surfaces of the first to third electrode layers ETL1, ETL2, and ETL3 are exposed. The first to third metal patterns MTP1, MTP2, and MTP3 may be disposed to fill the first to third through holes CNT1, CNT2, and CNT3, respectively, and the top surface thereof may form the same plane as the top surface of the first insulating layer PAS1.

Figure 21:
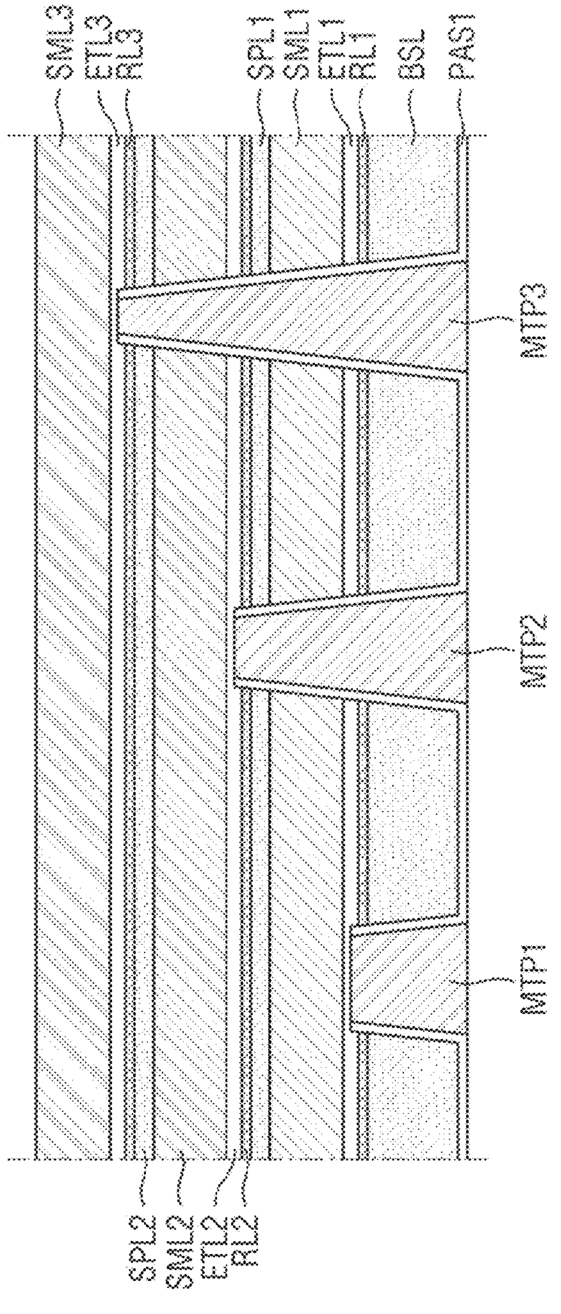
Figure 22:
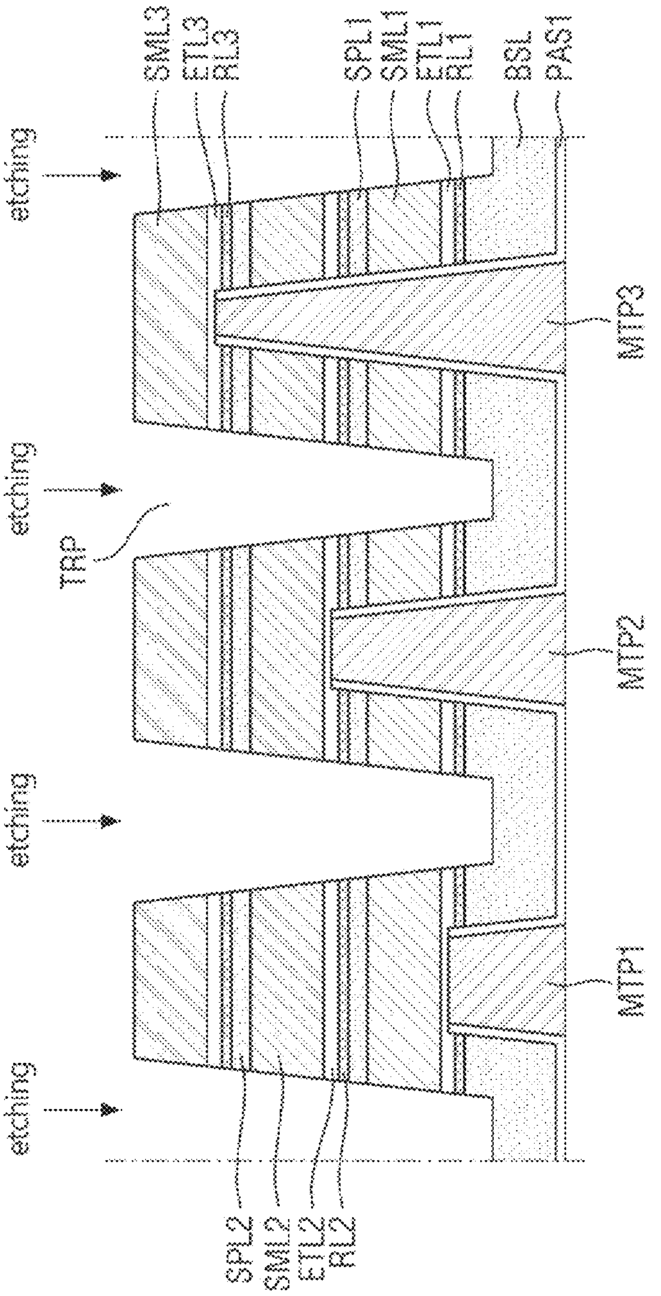

Referring to FIGS. 21 and 22, after separating the semiconductor laminates SML1, SML2, and SML3 from the third auxiliary substrate GSUB3, the laminates may be turned over such that the third semiconductor laminate SML3 is positioned on top, and the trench portion TRP penetrating parts of the semiconductor laminates SML1, SML2, and SML3 may be formed. In an embodiment, an etching process for forming the trench portion TRP may be performed as a dry etching process. A layer serving as a lower substrate in the etching process may be the base layer BSL. The trench portion TRP may be formed not to overlap the first to third through holes CNT1, CNT2, and CNT3 and may be formed to surround the first to third metal patterns MTP1, MTP2, and MTP3. The trench portion TRP may be formed to penetrate firstly the third semiconductor laminate SML3 and the lower layers therebelow and to have a part of the top surface of the base layer BSL depressed. In the process, the first to third semiconductor laminates SML1, SML2, and SML3, the first to third reflective layers RL1, RL2, and RL3, the first to third electrode layers ETL1, ETL2, and ETL3, and the first and second auxiliary layers SPL1 and SPL2 may be separated from each other according to positions. Among the first to third semiconductor laminates SML1, SML2, and SML3, portions thereof in contact with the first to third metal patterns MTP1, MTP2, and MTP3 may form the first to third light emitting elements ED1, ED2, and ED3, respectively.

Figure 23:
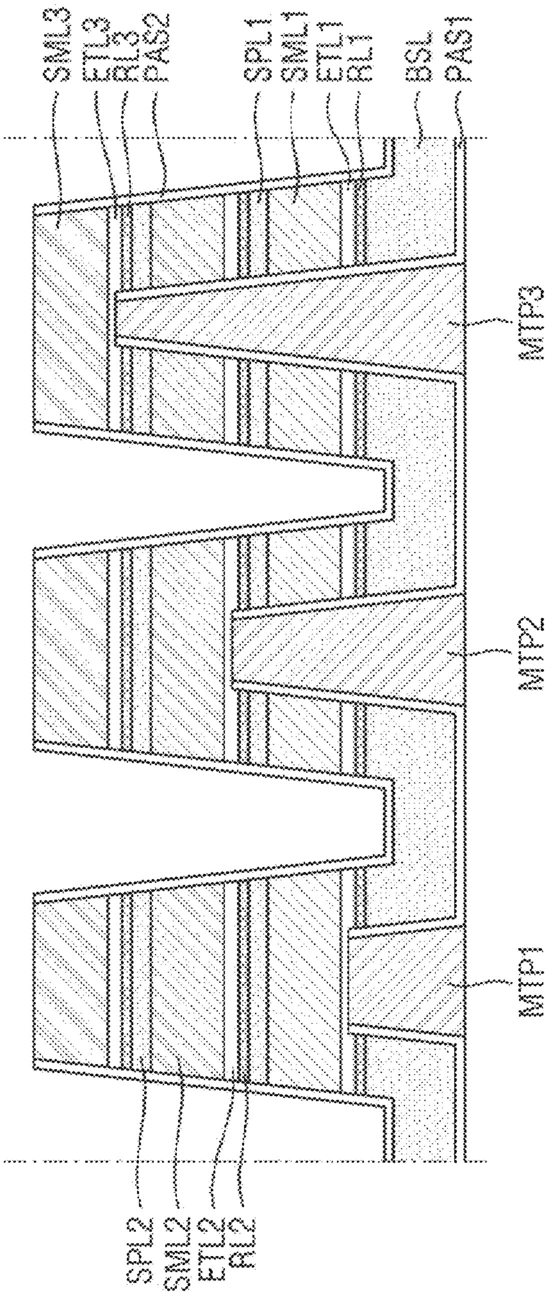
Figure 24:
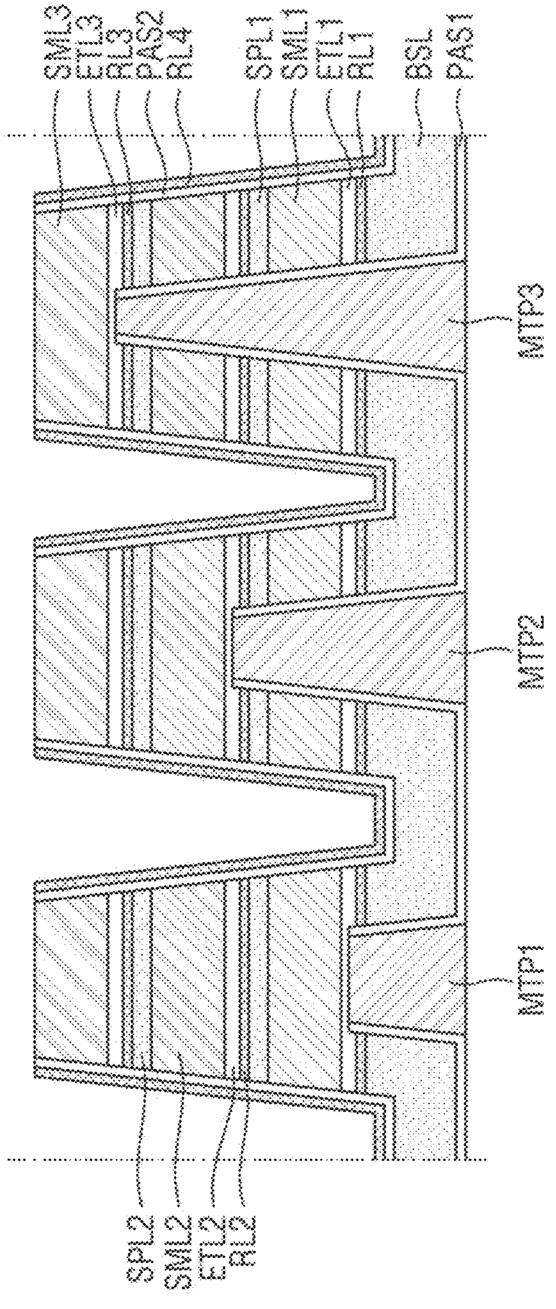
Figure 25:
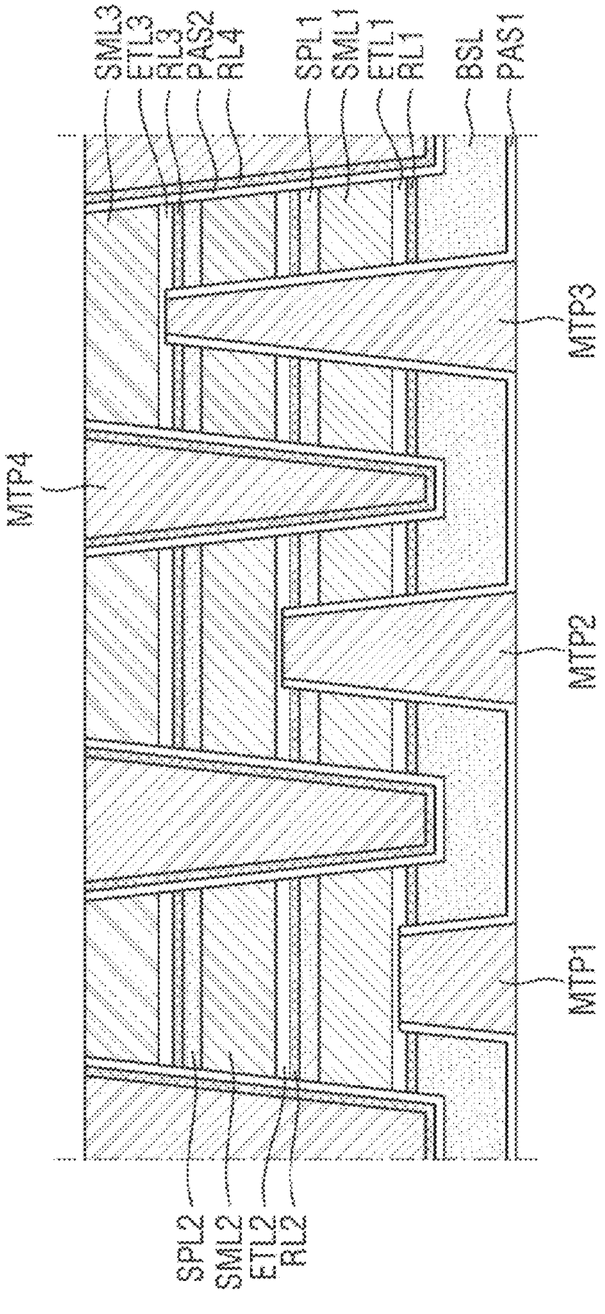

Referring to FIGS. 23 to 25, the second insulating layer PAS2 and the fourth reflective layer RL4 may be formed on the inner side edge of the trench portion TRP, and the fourth metal pattern MTP4 may be formed in the trench portion TRP. The second insulating layer PAS2 may be disposed in the trench portion TRP and may also be disposed on the top surface of the base layer BSL. The fourth reflective layer RL4 may have the same shape as the second insulating layer PAS2 and may be disposed thereon. The fourth metal pattern MTP4 may be disposed to fill the trench portion TRP, and the top surface thereof may form the same plane as the top surface of the third semiconductor laminate SML3.

Figure 26:
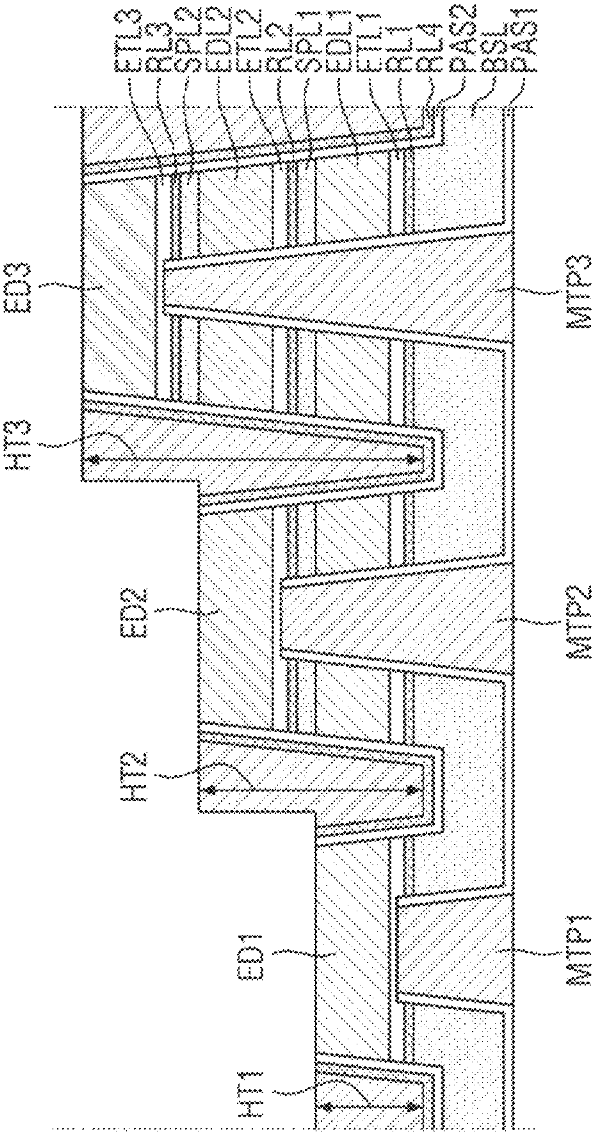

Referring to FIG. 26, the top surfaces of the light emitting elements ED1, ED2, and ED3 may be exposed by removing parts of the fourth metal pattern MTP4 and the semiconductor laminates SML1, SML2, and SML3. Since the third light emitting element ED3 is disposed in the uppermost layer and thus the top surface thereof is exposed, an etching process may not be performed on the area in which the third light emitting element ED3 is disposed. Since the second light emitting element ED2 has the second auxiliary layer SPL2, the third reflective layer RL3, the third electrode layer ETL3, and the third semiconductor laminate SML3 disposed thereon, the top surface thereof may be exposed by removing them. Since the first light emitting element ED1 has the first auxiliary layer SPL1, the second reflective layer RL2, the second electrode layer ETL2, the second semiconductor laminate SML2, the second auxiliary layer SPL2, the third reflective layer RL3, the third electrode layer ETL3, and the third semiconductor laminate SML3 disposed thereon, the top surface thereof may be exposed by removing them. In the process, the fourth metal pattern MTP4 surrounding the light emitting elements ED1, ED2, and ED3 may be partially removed. The second insulating layer PAS2 and the fourth reflective layer RL4 may be removed together. Since the number of layers to be removed is different according to the area in which the light emitting elements ED1, ED2, and ED3 are disposed, the thickness or the height from the bottom surface to the top surface of the light emitting element layer EML may be different after the removal process.

Figure 27:
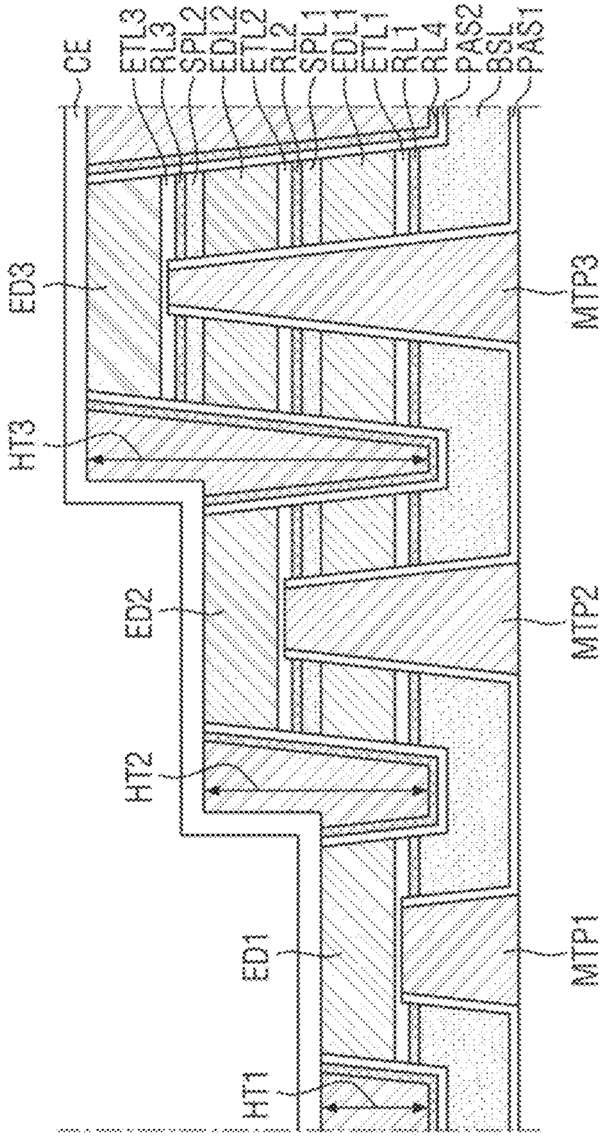
Figure 28:
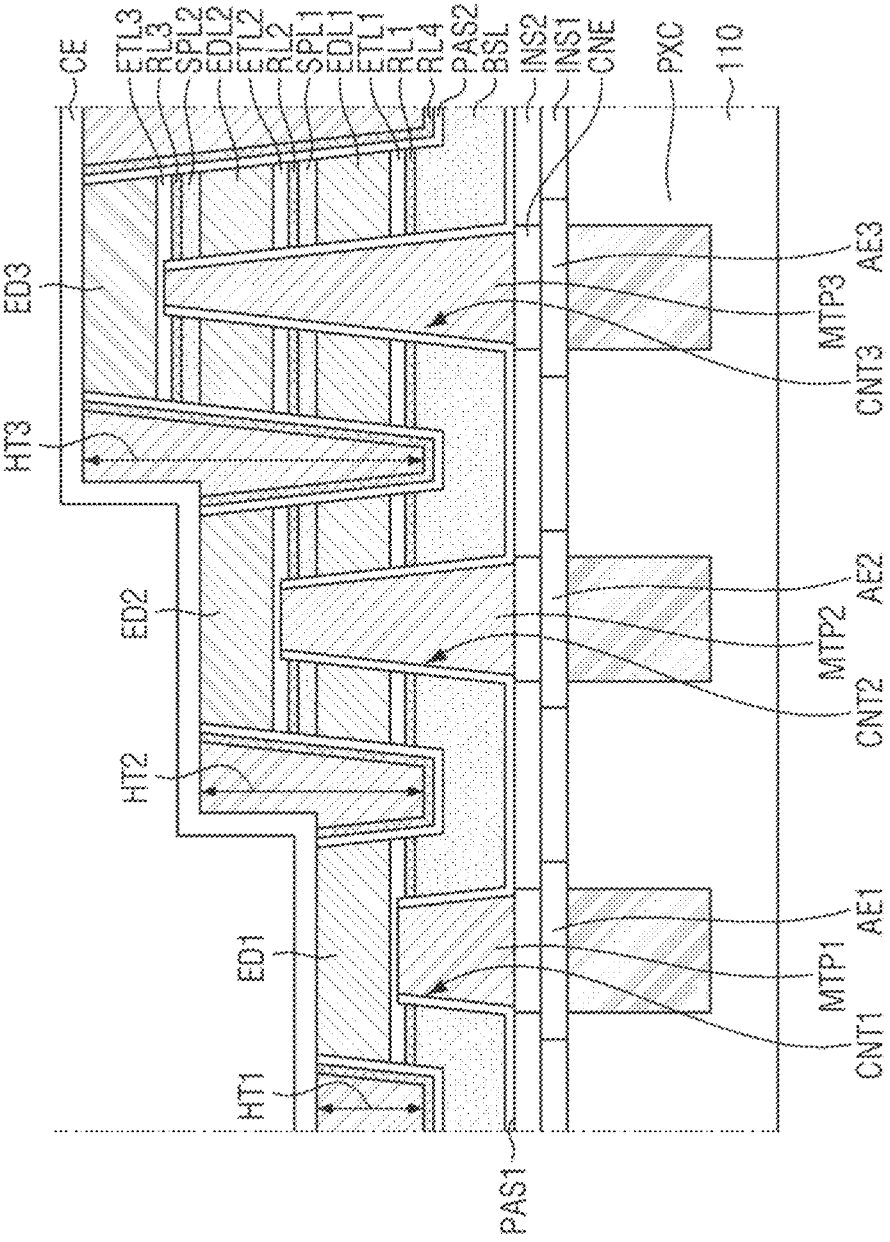

Referring to FIGS. 27 and 28, the common electrode CE may be formed on the light emitting elements ED1, ED2, and ED3 to form the light emitting element layer EML, and the light emitting element layer EML may be transferred to the first substrate SUBL including the circuit substrate 110. The first substrate SUBL may include the circuit substrate 110 on which the pixel electrodes AE1, AE2, and AE3 are formed, and the first to third metal patterns MTP1, MTP2, and MTP3 of the light emitting element layer EML may be disposed to correspond to the first to third pixel electrodes AE1, AE2, and AE3, respectively. The first to third light emitting elements ED1, ED2, and ED3 may be electrically connected to the first to third pixel electrodes AE1, AE2, and AE3 through the first to third metal patterns MTP1, MTP2, and MTP3, respectively.

Subsequently, although not illustrated, the display device 10 may be manufactured by forming the encapsulation layer ENC and the color filter layer CFL on the light emitting element layer EML.

Hereinafter, various embodiments of the display device 10 will be described with reference to other drawings.

Figure 29:
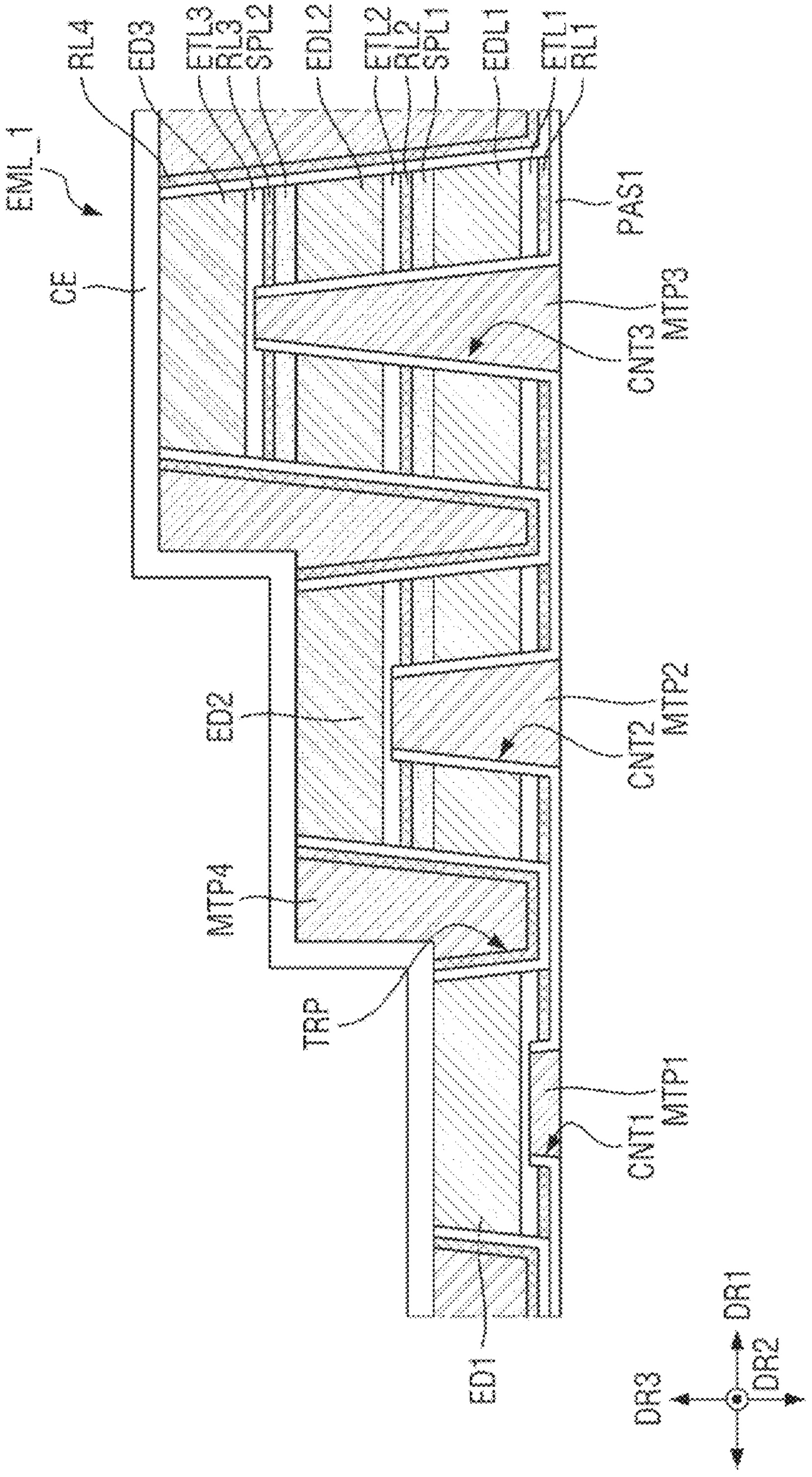
FIG. 29 is a schematic cross-sectional view illustrating a light emitting element layer of a display device according to another embodiment.
Figure 30:
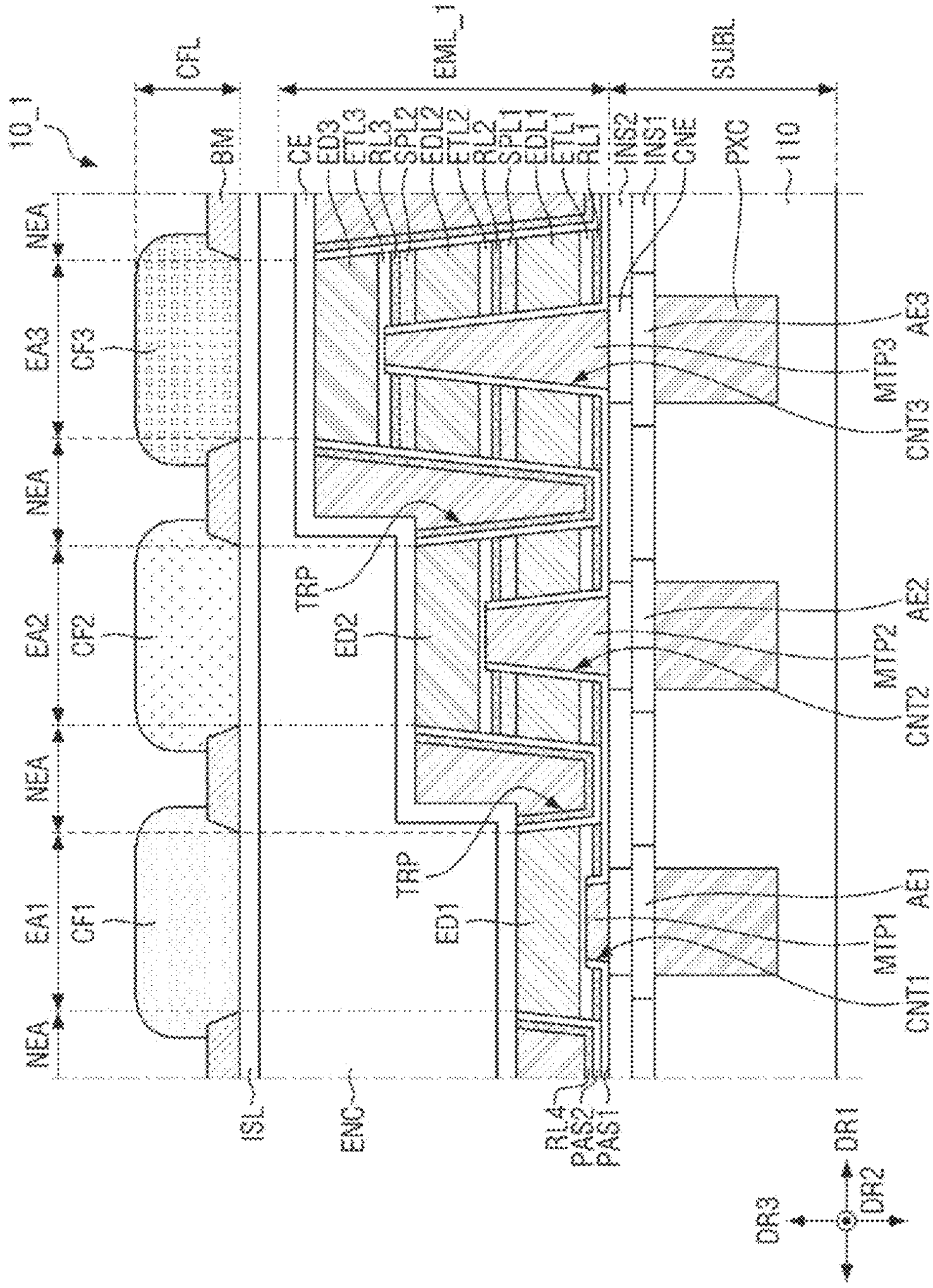
FIG. 30 is a schematic cross-sectional view of a part of the display device including the light emitting element layer of FIG. 29.

FIG. 29 is a schematic cross-sectional view illustrating a light emitting element layer of a display device according to another embodiment. FIG. 30 is a schematic cross-sectional view of a part of the display device including the light emitting element layer of FIG. 29.

Referring to FIGS. 29 and 30, in a display device 10_1 according to an embodiment, the base layer BSL of a light emitting element layer EML_1 may be omitted. In the light emitting element layer EML_1, the first reflective layer RL1 may be directly in contact with the first insulating layer PAS1, and a portion of the second insulating layer PAS2 disposed on the inner side edge of the trench portion TRP may be directly in contact with the first insulating layer PAS1.

The base layer BSL may serve as a lower substrate in an etching process of forming the trench portion TRP. In the etching process, the base layer BSL may be disposed such that up to the first reflective layer RL1 may be completely penetrated, and a part of the top surface of the base layer BSL may be depressed. However, in case that the first reflective layer RL1 may be completely penetrated even without the lower substrate in the etching process, the base layer BSL serving as the lower substrate may be omitted.

Figure 31:
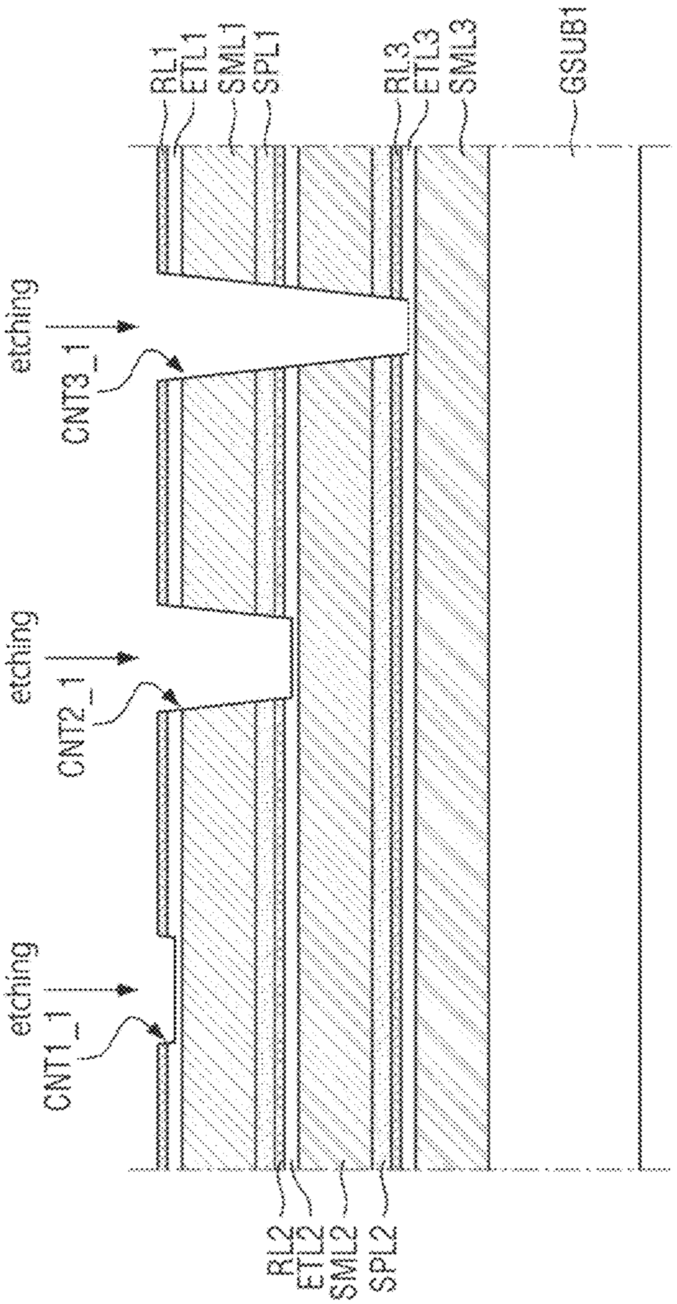
FIG. 31 is a schematic cross-sectional view illustrating a step in a manufacturing process of the display device of FIG. 30.

FIG. 31 is a schematic cross-sectional view illustrating a step in a manufacturing process of the display device of FIG. 30.

Referring to FIG. 31, in the manufacturing process of the display device 10, the process of forming the base layer BSL before the etching process of forming the through holes CNT1_1, CNT2_1, and CNT3_1 may be omitted. The first to third through holes CNT1_1, CNT2_1, and CNT3_1 may be formed to extend from the top surface of the first reflective layer RL1 to some lower layers. The first insulating layer PAS1 disposed thereafter may be disposed on the inner sidewalls of the first to third through holes CNT1_1, CNT2_1, and CNT3_1 and may cover the top surface of the first reflective layer RL1.

In the display device 10_1 according to an embodiment, as the base layer BSL is omitted, the thickness of the light emitting element layer EML_1 may be reduced, and the overall thickness of the display panel 100 and the display device 10_1 may also be reduced.

Figure 32:
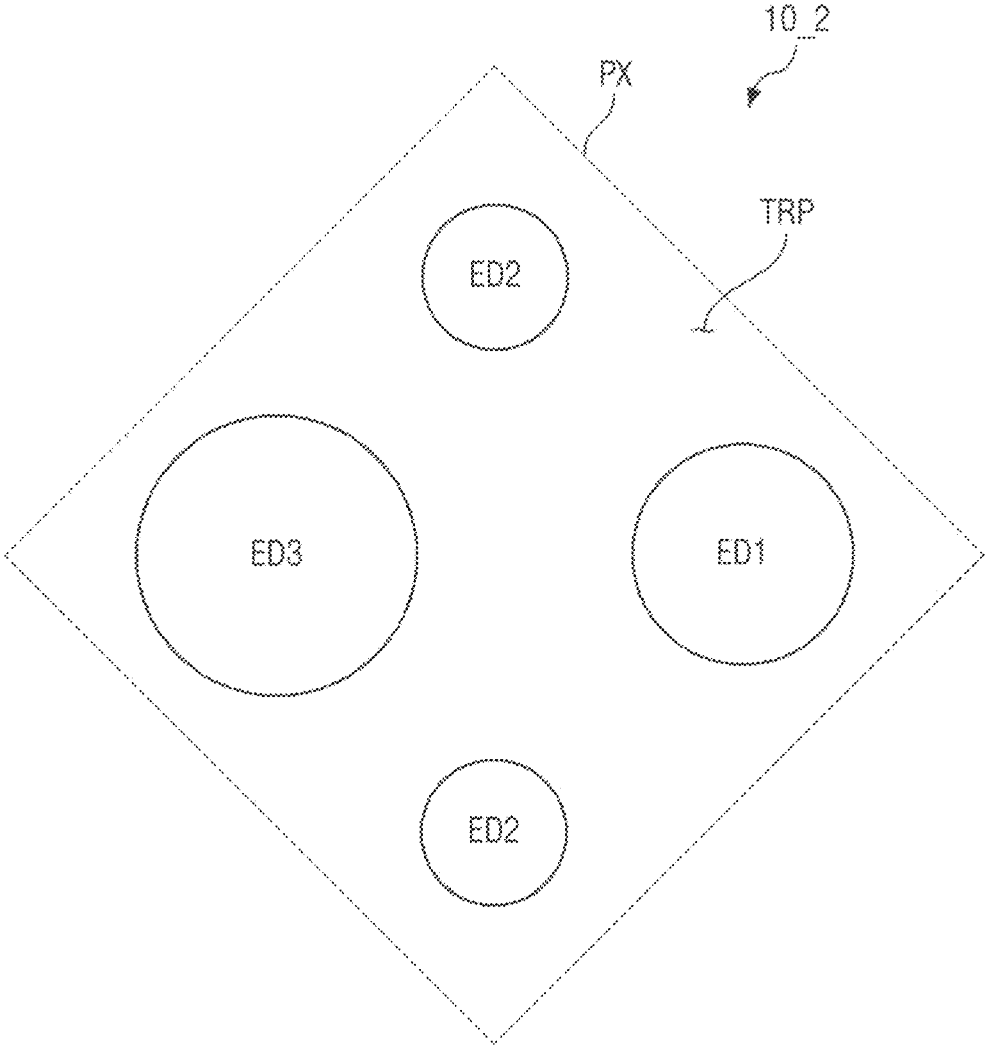
FIGS. 32 to 34 are schematic plan views illustrating an arrangement of light emitting elements disposed in a pixel of a display device according to another embodiment.
Figure 33:
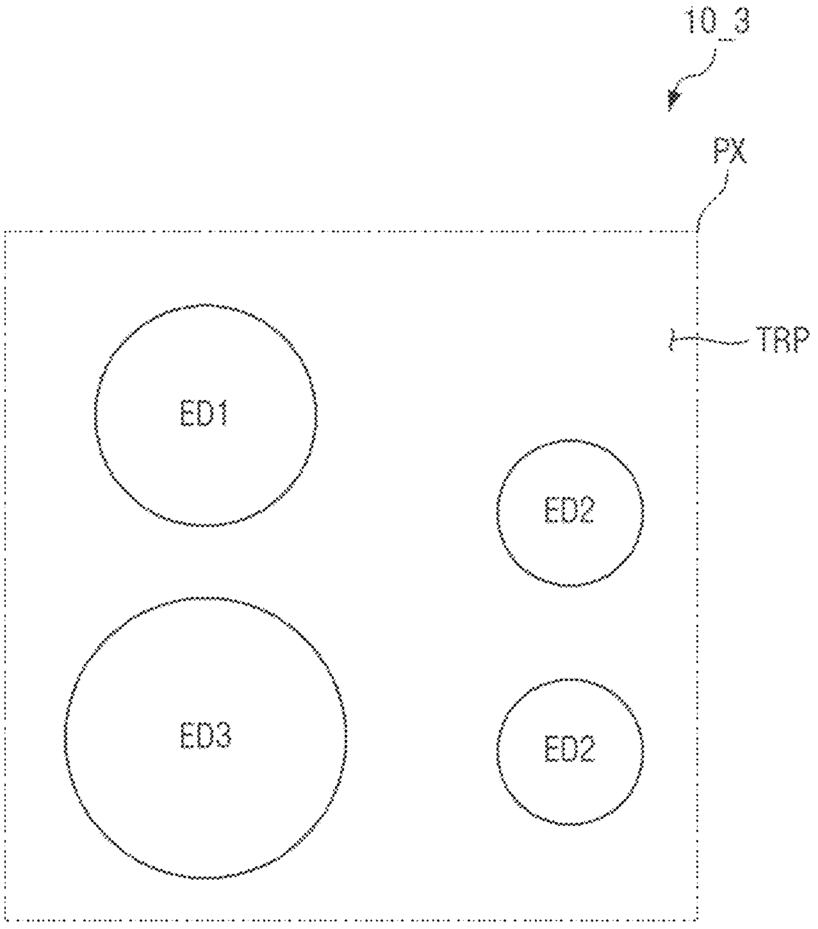
Figure 34:
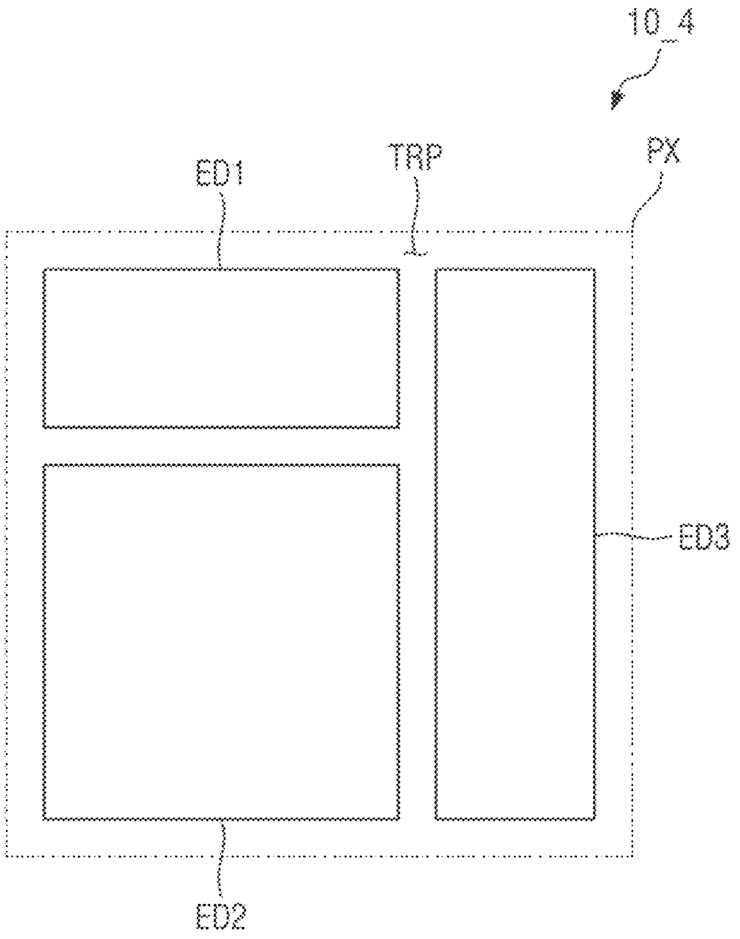

FIGS. 32 to 34 are schematic plan views illustrating an arrangement of light emitting elements disposed in a pixel of a display device according to another embodiment.

The aforementioned display device 10 of FIG. 5 may have a structure in which the light emitting elements ED1, ED2, and ED3 have a quadrilateral shape and are arranged in the first direction DR1 within each pixel PX. However, the disclosure is not limited thereto. In the display device 10, the arrangement of the light emitting elements ED1, ED2, and ED3 in each pixel PX and the planar shape of the light emitting elements ED1, ED2, and ED3 may be variously modified.

Referring to FIG. 32, in a display device 10_2 according to an embodiment, a first light emitting element ED1, two second light emitting elements ED2, and a third light emitting element ED3 may constitute the pixel PX and may express a white gray scale. In the display device 10_2, the light emitting elements ED1, ED2, and ED3 may be disposed in a PENTILE™ type, for example, a diamond PENTILE™ type. For example, the first light emitting element ED1 and the third light emitting element ED3 may be disposed to be spaced apart from each other in the first direction DR1, and may be alternately disposed in the first direction DR1 and the second direction DR2. The second light emitting element ED2 may be spaced apart from another adjacent second light emitting element ED2 in the second direction DR2, and may be separated from the adjacent first light emitting elements ED1 and third light emitting element ED3 in a diagonal direction between the first direction DR1 and the second direction DR2.

In an embodiment, each of the first to third light emitting elements ED1, ED2, and ED3 may have a circular shape in plan view, and may have different areas or sizes in plan view. For example, the area of the third light emitting element ED3 may be greater than the areas of the first light emitting element ED1 and the second light emitting element ED2, and the area of the first light emitting element ED1 may be greater than the area of the second light emitting element ED2. The areas of the light emitting elements ED1, ED2, and ED3 may vary according to the width or position of the trench portion TRP in the light emitting element layer EML. The intensity of light emitted from the corresponding light emitting elements ED1, ED2, and ED3 may vary according to the area of the light emitting elements ED1, ED2, and ED3, and the areas of the light emitting elements ED1, ED2, and ED3 may be adjusted to control the color of the screen displayed on the display device 10 or an electronic device. In the embodiment of FIG. 32, the third light emitting element ED3 has the largest area, but embodiments are not limited thereto. The areas of the light emitting elements ED1, ED2, and ED3 may be freely adjusted according to the color of the screen required by the display device 10 and an electronic device. The area of the light emitting elements ED1, ED2, and ED3 may be related to light efficiency and lifespan of the light emitting element ED, and may have a trade-off relationship with the reflection by external light. The areas of the light emitting elements ED1, ED2, and ED3 may be adjusted in consideration of the above factors.

Referring to FIG. 33, in a display device 10_3 according to an embodiment, the first light emitting element ED1 and the third light emitting element ED3 may be disposed to be spaced apart from each other in the second direction DR2, and two second light emitting elements ED2 may be disposed to be spaced apart from the first light emitting element ED1 and the third light emitting element ED3 in the first direction DR1, respectively and to be spaced apart from each other in the second direction DR2. The embodiment may be the same as the embodiment of FIG. 32 except that the arrangement of the light emitting elements ED1, ED2, and ED3 may be different.

Referring to FIG. 34, in a display device 10_4 according to an embodiment, a first light emitting element ED1, a second light emitting element ED2, and a third light emitting element ED3 may constitute the pixel PX and may express a white gray scale. In the display device 10_4, the first light emitting element ED1 may be spaced apart from the second light emitting element ED2 in the second direction DR2, and the third light emitting element ED3 may be spaced apart from the first light emitting element ED1 and the second light emitting element ED2 in the second direction DR2.

Each side of the second light emitting element ED2 measured in the first direction DR1 and the second direction DR2 may have the same size, and the second light emitting element ED2 may have a square shape in plan view. The first light emitting element ED1 may have a rectangular shape in which the length measured in the first direction DR1 is longer than the length measured in the second direction DR2, and the third light emitting element ED3 may have a rectangular shape in which the length measured in the second direction DR2 is longer than the length measured in the first direction DR1.

In an embodiment, the area of the second light emitting element ED2 may be greater than the areas of the first light emitting element ED1 and the third light emitting element ED3, and the area of the third light emitting element ED3 may be greater the area of the first light emitting element ED1. The areas of the light emitting elements ED1, ED2, and ED3 may vary according to the width or position of the trench portion TRP in the light emitting element layer EML.

Figure 35:
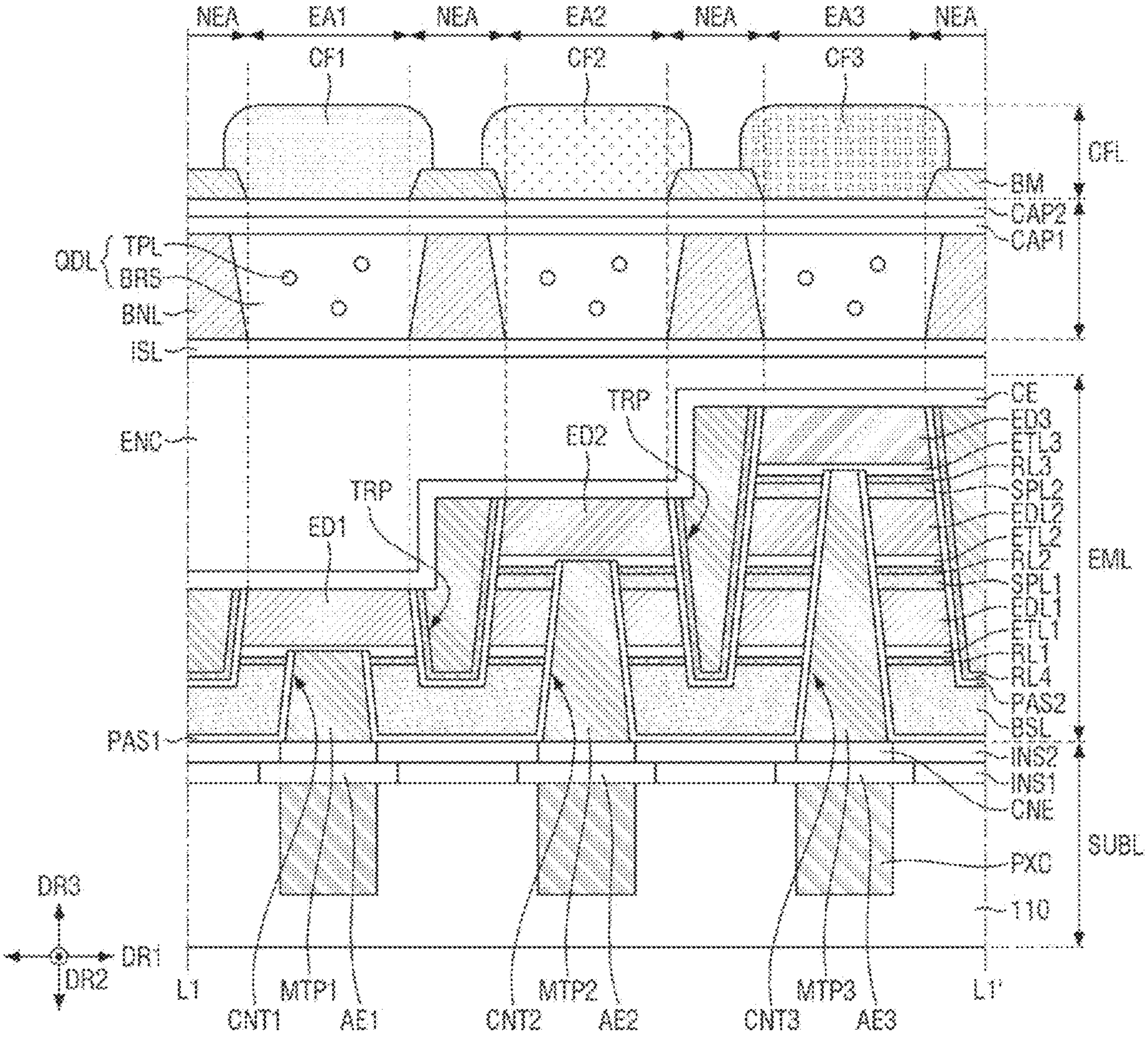
FIG. 35 is a schematic cross-sectional view illustrating a part of a display device according to still another embodiment.

FIG. 35 is a schematic cross-sectional view illustrating a part of a display device according to still another embodiment.

Referring to FIG. 35, a display device 10_5 according to an embodiment may further include a light transmitting layer QDL and the bank layer BNL disposed between the light emitting element layer EML and the color filter layer CFL.

The bank layer BNL may be disposed on the inorganic insulating layer ISL. The bank layer BNL may be disposed to extend in the first direction DR1 and the second direction DR2 in plan view, and may be formed in a lattice shape pattern throughout the display area DA. The bank layer BNL may not overlap the emission areas EA1, EA2, and EA3, and may overlap the fourth metal pattern MTP4 disposed in the non-emission area NEA and the trench portion TRP. The bank layer BNL may include multiple openings overlapping the light emitting elements ED1, ED2, and ED3 or the emission areas EA1, EA2, and EA3.

The bank layer BNL may serve to provide a space in which the light transmitting layer QDL is disposed. To this end, the bank layer BNL may have a predetermined or selected thickness. For example, the thickness of the bank layer BNL may be in the range of 1 μm to m. The bank layer BNL may contain an organic insulating material to have a predetermined or selected thickness. The organic insulating material may contain, for example, epoxy resin, acrylic resin, cardo resin and/or imide resin.

The light transmitting layer QDL may be disposed in each opening of the bank layer BNL and the light transmitting layers QDL may be disposed to be spaced apart from each other. The light transmitting layer QDL may be formed in a pattern of islands spaced apart from each other. The light transmitting layer QDL may be disposed to overlap each of the first emission area EA1, the second emission area EA2, and the third emission area EA3. In an embodiment, each of the light transmitting layers QDL may completely overlap the first emission area EA1, the second emission area EA2, and the third emission area EA3. However, the disclosure is not limited thereto, and the light transmitting layer QDL may be formed in a linear pattern extending in a direction.

The light transmitting layer QDL may include a scatterer TPL and a base resin BRS to scatter light emitted from the light emitting elements ED1, ED2, and ED3 in a random direction. The scatterer TPL may have a refractive index different from that of the base resin BRS and form an optical interface with the base resin BRS. For example, the scatterer TPL may be light scattering particles. The scatterer TPL is not particularly limited as long as it is a material capable of scattering at least a portion of the transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like. Examples of a material of the organic particles may include acrylic resin and urethane resin, and/or the like. The scatterer may scatter light in random directions regardless of the incidence direction of the incident light without substantially converting the wavelength of the light. The base resin BRS may contain a light-transmissive organic material. For example, the base resin BRS may contain epoxy resin, acrylic resin, cardo resin, and/or imide resin.

A first capping layer CAP1 and a second capping layer CAP2 may be sequentially disposed on the bank layer BNL and the light transmitting layer QDL. The first capping layer CAP1 and the second capping layer CAP2 may include an insulating material to protect the bank layer BNL and the light transmitting layer QDL. The first capping layer CAP1 and the second capping layer CAP2 may planarize the top surfaces of the bank layer BNL and the light transmitting layer QDL. In some embodiments, at least one of the first capping layer CAP1 and the second capping layer CAP2 may be a low refractive index layer.

The color filter layer CFL may be disposed on the second capping layer CAP2. A description thereof may be the same as described above.

Figure 36:
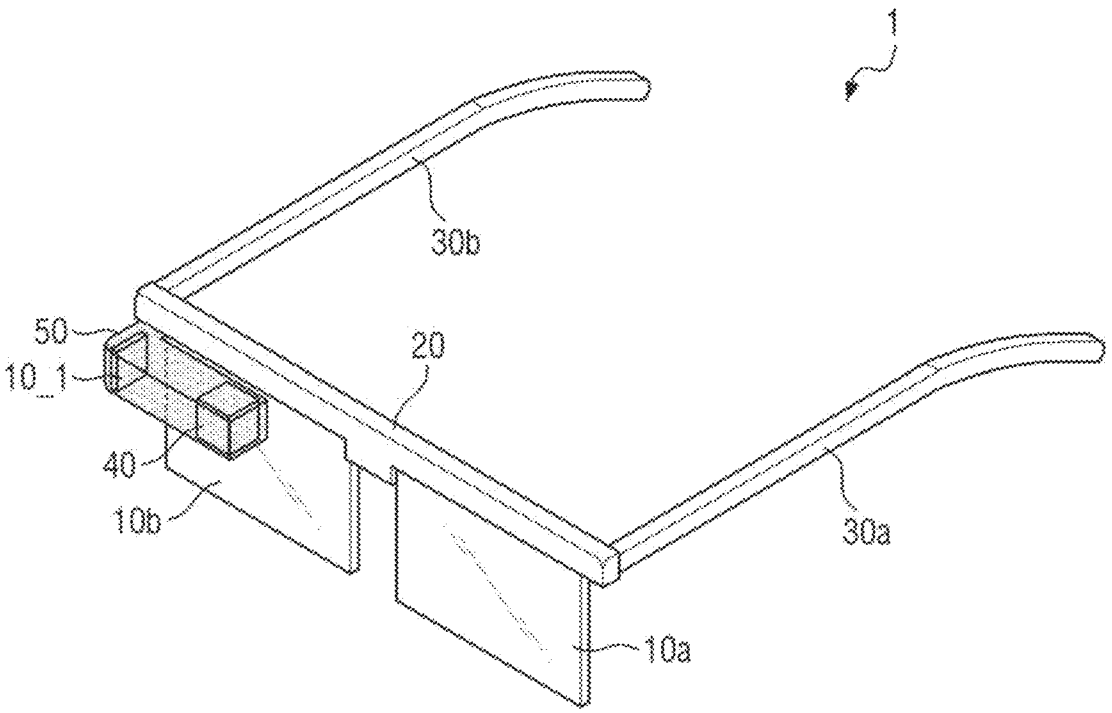
FIG. 36 is a schematic diagram illustrating a virtual reality device including a display device according to an embodiment.

FIG. 36 is a schematic diagram illustrating a virtual reality device including a display device according to an embodiment. FIG. 36 illustrates a virtual reality device 1 to which the display device 10 according to an embodiment may be applied.

Referring to FIG. 36, the virtual reality device 1 according to an embodiment may be a glass-type device. The virtual reality device 1 according to an embodiment may include the display device 10, a left lens 10*a*, a right lens 10*b*, a support frame 20, temples 30*a* and 30*b*, a reflection member 40, and a display device storage 50.

Although FIG. 36 illustrates the virtual reality device 1 including the temples 30*a* and 30*b*, the virtual reality device 1 according to an embodiment may be applied to a head mounted display including a head mounted band that may be worn on a head, instead of the temples 30*a* and 30*b*. For example, the virtual reality device 1 according to an embodiment is not limited to that shown in FIG. 36, and may be applied in various forms to various electronic devices.

The display device storage 50 may include the display device 10 and the reflection member 40. The image displayed on the display device 10 may be reflected by the reflection member 40 and provided to a user's right eye through the right lens 10*b*. Accordingly, the user can view the virtual reality image displayed on the display device 10 through the right eye.

FIG. 36 illustrates that the display device housing 50 is disposed at the right end of the support frame 20, but embodiments of the disclosure are not limited thereto. For example, the display device storage 50 may be disposed at the left end of the support frame 20, and the image displayed on the display device 10 may be reflected by the reflection member 40 and provided to a user's left eye through the left lens 10*a*. Accordingly, the user can view the virtual reality image displayed on the display device 10 through the left eye. In another embodiment, the display device storage 50 may be disposed at both the left end and the right end of the support frame 20. In that case, the user can view the virtual reality image displayed on the display device 10 through both the left eye and the right eye.

Figure 37:
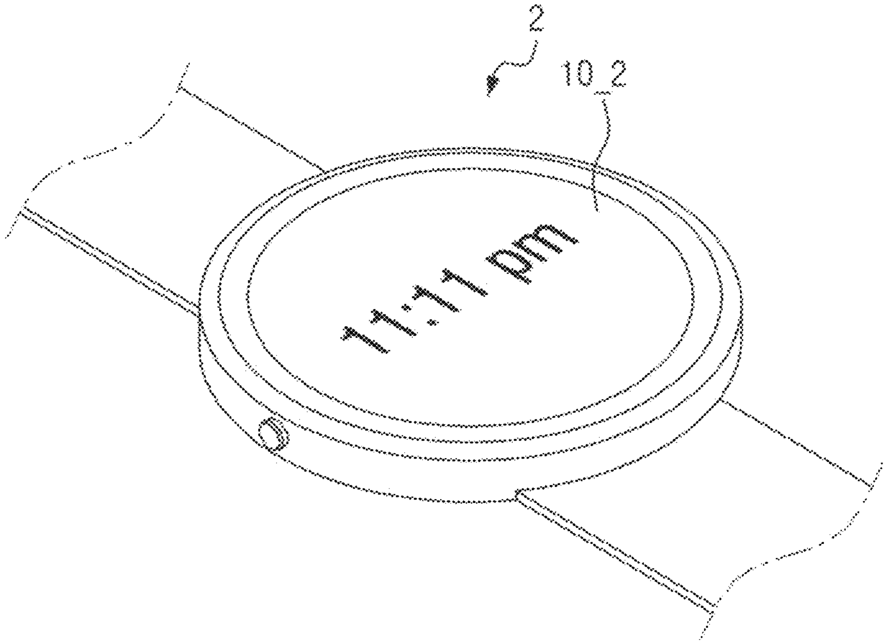
FIG. 37 is a schematic diagram illustrating a smart device including a display device according to an embodiment.

FIG. 37 is a schematic diagram illustrating a smart device including a display device according to an embodiment.

Referring to FIG. 37, the display device 10 according to an embodiment may be applied to the smart watch 2 that is one of the smart devices.

Figure 38:
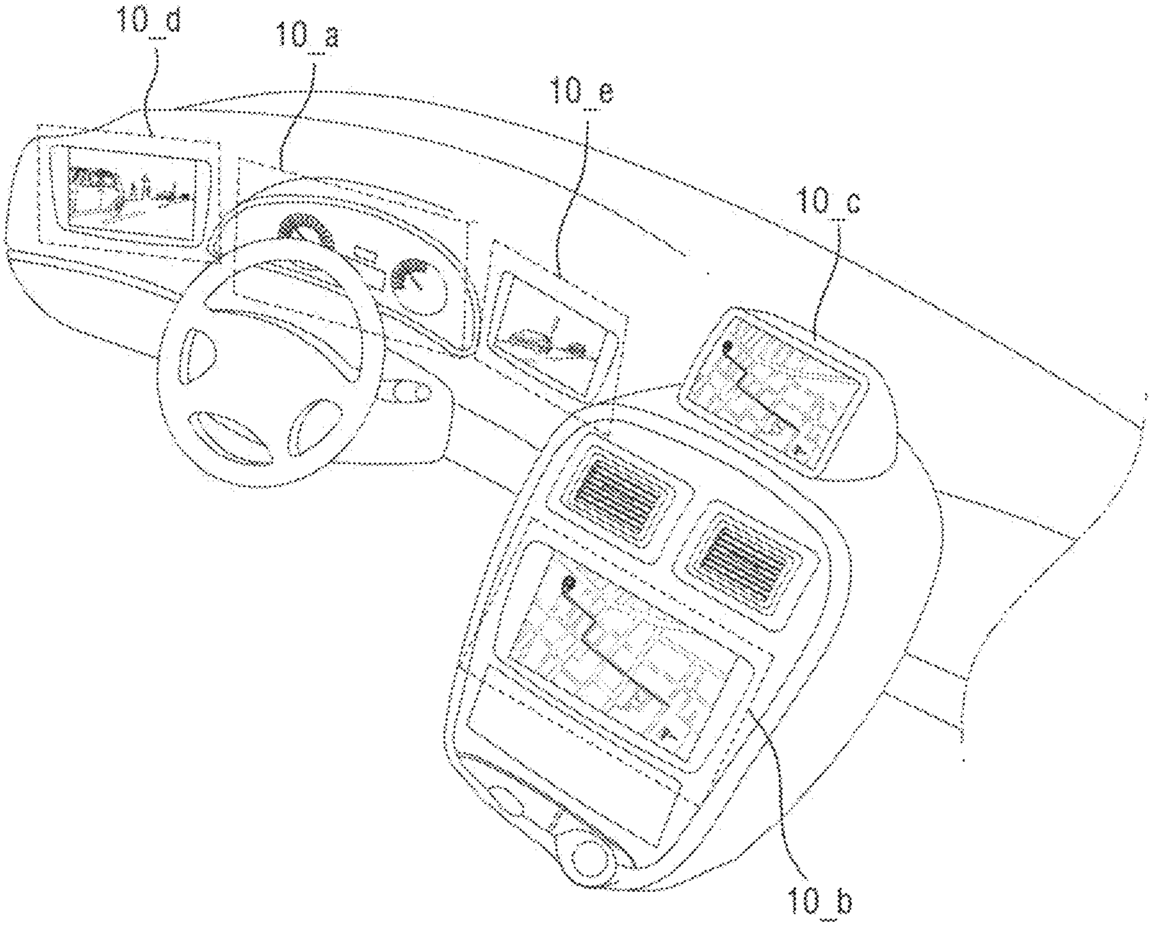
FIG. 38 is a schematic diagram illustrating an automobile including a display device according to an embodiment.

FIG. 38 is a schematic diagram illustrating an automobile including a display device according to an embodiment.

Referring to FIG. 38, the display devices 10_*a*, 10_*b*, and 10_*c* according to an embodiment may be applied to the dashboard of the automobile, the center fascia of the automobile, or the center information display (CID) of the dashboard of the automobile. Further, the display devices 10_*d*, and 10_*e* according to an embodiment may be applied to a room mirror display instead of side mirrors of the automobile.

Figure 39:
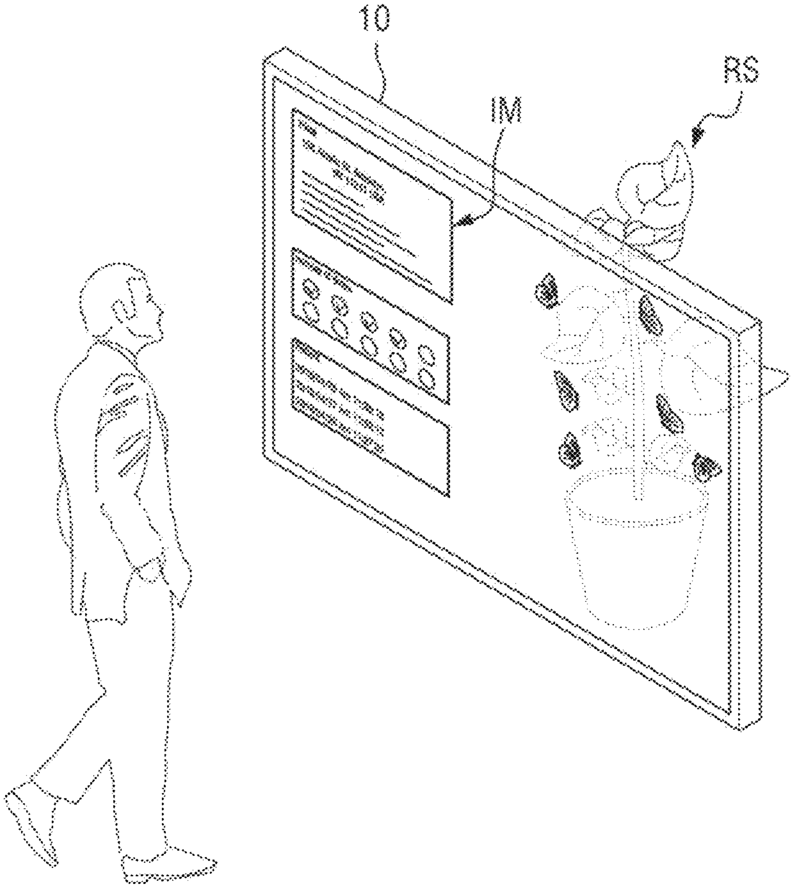
FIG. 39 is a schematic diagram illustrating a transparent display device including a display device according to an embodiment.

FIG. 39 is a schematic diagram illustrating a transparent display device including a display device according to an embodiment.

Referring to FIG. 39, the display device 10 according to an embodiment may be applied to the transparent display device. The transparent display device may display an image IM, and also may transmit light. Thus, a user located on the front side of the transparent display device can view an object RS or a background on the rear side of the transparent display device as well as the image IM displayed on the display device 10. In case that the display device 10 is applied to the transparent display device, the first substrate SUBL of the display device 10 shown in FIG. 6 may include a light transmitting portion capable of transmitting light or may be made of a material capable of transmitting light.

Figure 40:
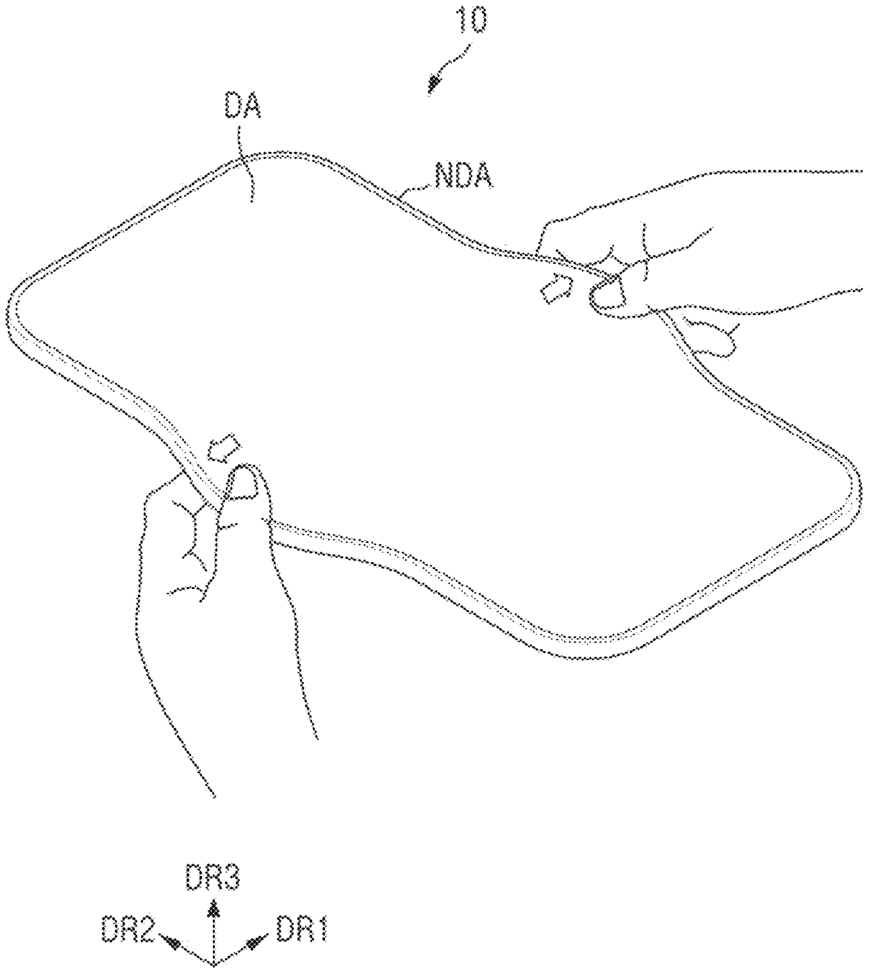
FIG. 40 is a schematic diagram illustrating a stretchable display device including a display device according to an embodiment.

FIG. 40 is a schematic diagram illustrating a stretchable display device including a display device according to an embodiment.

Referring to FIG. 40, the display device 10 according to an embodiment may be a display device that is stretchable in at least one direction. The stretchable display device 10 may be stretched in the first direction DR1 when the left side of the display device 10 is held with one hand and stretched in the leftward direction and the right side of the display device 10 is held with the other hand and stretched in the rightward direction. In case that the display device 10 is stretched in the first direction DR1, the maximum length of the display area DA in the first direction DR1 may increase. For example, in case that the display device 10 is stretched in the first direction DR1, the area of the display area DA may increase.

In another embodiment, the stretchable display device 10 may be stretched in the second direction DR2 when the upper side of the display device 10 is held with one hand and stretched in the upward direction and the lower side of the display device 10 is held with the other hand and stretched in the downward direction. In case that the stretchable display device 10 is stretched in the second direction DR2, the maximum length of the display area DA in the second direction DR2 may increase. For example, in case that the stretchable display device 10 is stretched in the second direction DR2, the area of the display area DA may increase.

The stretching of the display device 10 may be performed by an external force, and in case that the external force is removed, it may contract and return to its original state. FIG. 40 illustrates that the stretchable display device 10 is stretched in the first direction DR1, but embodiments are not limited thereto. The stretchable display device 10 may be stretched in a diagonal direction between the first direction DR1 and the second direction DR2.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device, comprising:

a first substrate comprising a plurality of pixel electrodes respectively electrically connected to a plurality of pixel circuits and spaced apart from each other; and a light emitting element layer comprising a plurality of light emitting elements disposed on the first substrate and respectively electrically connected to the plurality of pixel electrodes, wherein the light emitting element layer comprises:

a first light emitting element disposed on a first pixel electrode of the first substrate;

a first dummy element layer spaced apart from the first light emitting element, the first dummy element layer and the first light emitting element including a same material;

a second light emitting element disposed on the first dummy element layer and disposed on a second pixel electrode of the first substrate;

a first metal pattern disposed on the first pixel electrode and electrically connected to the first pixel electrode and the first light emitting element;

a second metal pattern disposed on the second pixel electrode and electrically connected to the second pixel electrode and the second light emitting element; and a common electrode disposed on the first light emitting element and the second light emitting element, and the second metal pattern is disposed in a through hole penetrating the first dummy element layer.

2. The display device of claim 1, wherein the first light emitting element comprises:

a first semiconductor layer;

a second semiconductor layer disposed on the first semiconductor layer; and a first light emitting layer disposed between the first semiconductor layer and the second semiconductor layer, the second light emitting element comprises:

a third semiconductor layer;

a fourth semiconductor layer disposed on the third semiconductor layer; and a second light emitting layer disposed between the third semiconductor layer and the fourth semiconductor layer, and the first dummy element layer comprises:

a first dummy semiconductor layer, the first dummy semiconductor layer and the first semiconductor layer including a same material, a second dummy semiconductor layer disposed on the first dummy semiconductor layer, the second dummy semiconductor layer and the first light emitting layer including a same material, and a third dummy semiconductor layer disposed on the second dummy semiconductor layer, the third dummy semiconductor layer and the second semiconductor layer including a same material.

3. The display device of claim 1, wherein a thickness of the first metal pattern is smaller than a thickness of the second metal pattern, and a height from a top surface of the first substrate to a top surface of the first light emitting element is smaller than a height from a top surface of the first substrate to a top surface of the second light emitting element.

4. The display device of claim 1, further comprising:

a first reflective layer disposed between the first light emitting element and the first dummy element layer and the first substrate; and a second reflective layer disposed between the first dummy element layer and the second light emitting element, wherein the first metal pattern is disposed in a first through hole penetrating the first reflective layer from a bottom surface of the light emitting element layer, and the second metal pattern is disposed in a second through hole penetrating the first reflective layer, the first dummy element layer, and the second reflective layer from the bottom surface of the light emitting element layer.

5. The display device of claim 4, further comprising:

a first insulating layer disposed on inner side edges of the first through hole and inner side edges of the second through hole, wherein the first dummy element layer is spaced apart from the second metal pattern with the first insulating layer disposed between the first dummy element layer and the second metal pattern.

6. The display device of claim 5, wherein the light emitting element layer further comprises a base layer disposed between the first reflective layer and the first substrate, each of the first through hole and the second through hole penetrates the base layer, and the first insulating layer is also disposed between the base layer and the first substrate.

7. The display device of claim 4, further comprising:

a first electrode layer disposed on the first reflective layer; and a second electrode layer disposed on the second reflective layer, wherein the first through hole exposes a part of a bottom surface of the first electrode layer, the second through hole exposes a part of a bottom surface of the second electrode layer, the first metal pattern electrically contacts the bottom surface of the first electrode layer, and the second metal pattern electrically contacts the bottom surface of the second electrode layer.

8. The display device of claim 7, wherein the first light emitting element electrically contacts a top surface of the first electrode layer, and the second light emitting element electrically contacts a top surface of the second electrode layer.

9. The display device of claim 7, wherein in the first electrode layer, a thickness of a portion disposed on the first through hole is smaller than a thickness of a portion that does not overlap the first through hole.

10. The display device of claim 4, further comprising:

a first auxiliary layer disposed on the first dummy element layer, wherein the second reflective layer is disposed on the first auxiliary layer, and the second through hole penetrates the first auxiliary layer.

11. The display device of claim 4, further comprising:

a second dummy element layer spaced apart from the second light emitting element, the second dummy element layer and the second light emitting element including a same material;

a third reflective layer disposed on the second dummy element layer;

a third light emitting element disposed on the third reflective layer and disposed on a third pixel electrode of the first substrate; and a third metal pattern disposed on the third pixel electrode and electrically connected to each of the third pixel electrode and the third light emitting element, wherein the third metal pattern is disposed in a third through hole penetrating the first reflective layer, the first dummy element layer, the second reflective layer, the second dummy element layer, and the third reflective layer from the bottom surface of the light emitting element layer.

12. The display device of claim 11, further comprising:

a third electrode layer disposed on the third reflective layer, wherein the third through hole exposes a part of a bottom surface of the third electrode layer, and the third metal pattern electrically contacts the bottom surface of the third electrode layer.

13. The display device of claim 4, further comprising:

a second insulating layer surrounding the first light emitting element, the first dummy element layer, the second light emitting element, the first reflective layer, and the second reflective layer; and a fourth reflective layer disposed on the second insulating layer.

14. The display device of claim 13, further comprising:

a fourth metal pattern disposed in a trench portion surrounding the first light emitting element and the second light emitting element, wherein the fourth metal pattern is disposed on the fourth reflective layer.

15. The display device of claim 14, wherein the trench portion penetrates the first reflective layer, the first dummy element layer, and the second reflective layer, and in the fourth metal pattern, a thickness of a portion surrounding the first light emitting element is smaller than a thickness of a portion surrounding the second light emitting element.

16. A display device, comprising:

a first substrate comprising a plurality of pixel electrodes respectively electrically connected to a plurality of pixel circuits and spaced apart from each other; and a light emitting element layer comprising a plurality of light emitting elements disposed on the first substrate and respectively electrically connected to the plurality of pixel electrodes, wherein the light emitting element layer further comprises:

a first element layer comprising:

a base layer;

a first reflective layer disposed on the base layer; and a first light emitting element and a first dummy element layer that are disposed on the first reflective layer;

a second element layer partially disposed on the first element layer and comprising:

a second reflective layer; and a second light emitting element and a second dummy element layer that are disposed on the second reflective layer;

a first metal pattern disposed in a first through hole overlapping the first light emitting element and penetrating the base layer and the first reflective layer from a bottom surface of the light emitting element layer;

a second metal pattern disposed in a second through hole overlapping the second light emitting element and penetrating the base layer, the first element layer, and the second reflective layer from the bottom surface of the light emitting element layer;

a third metal pattern disposed in a trench portion penetrating the base layer from top surfaces of the first light emitting element of the first element layer and the second light emitting element of the second element layer; and a common electrode disposed on the first light emitting element and the second light emitting element.

17. The display device of claim 16, wherein the second element layer is not disposed on the first light emitting element, and the common electrode electrically contacts each of the top surface of the first light emitting element and the top surface of the second light emitting element.

18. The display device of claim 16, wherein the first light emitting element and the first dummy element layer include substantially a same material, and the display device further includes a first auxiliary layer disposed between the first dummy element layer and the second reflective layer.

19. The display device of claim 16, further comprising:

a first insulating layer disposed on inner side edges of the first through hole and inner side edges of the second through hole;

a second insulating layer disposed on an inner side edge of the trench portion; and a third reflective layer disposed on the second insulating layer.

20. The display device of claim 16, wherein in the light emitting element layer, a height from a bottom surface of the base layer to a top surface of the first light emitting element is smaller than a height from the bottom surface of the base layer to a top surface of the second light emitting element.

* * * * *